US012751266B2

(12) United States Patent
Chiang et al.

(10) Patent No.: US 12,751,266 B2
(45) Date of Patent: Sep. 29, 2026

(54) TRANSISTOR GATE CONTACTS AND METHODS OF FORMING THE SAME

(71) Applicant: Taiwan Semiconductor Manufacturing Co., Ltd., Hsinchu (TW)

(72) Inventors: Kuo-Cheng Chiang, Zhubei City (TW); Chih-Hao Wang, Baoshan Township (TW); Guan-Lin Chen, Baoshan Township (TW); Yu-Xuan Huang, Hsinchu (TW); Jin Cai, Hsinchu City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 558 days.

(21) Appl. No.: 18/308,355

(22) Filed: Apr. 27, 2023

(65) Prior Publication Data

US 2024/0250032 A1 Jul. 25, 2024

Related U.S. Application Data

(60) Provisional application No. 63/481,006, filed on Jan. 23, 2023.

(51) Int. Cl.
*H10W 20/20* (2026.01)
*H10D 30/01* (2025.01)
(Continued)

(52) U.S. Cl.
CPC .......... *H10W 20/20* (2026.01); *H10D 30/014* (2025.01); *H10D 30/43* (2025.01); *H10D 30/6729* (2025.01); *H10D 30/6735* (2025.01); *H10D 62/121* (2025.01); *H10D 84/0167* (2025.01); *H10D 84/017* (2025.01); *H10D 84/0186* (2025.01); *H10D 84/0195* (2025.01);
(Continued)

(58) Field of Classification Search
CPC . H01L 23/535; H01L 23/5286; H10D 30/014; H10D 30/43; H10D 30/6729; H10D 30/6735; H10D 62/121; H10D 84/0167; H10D 84/017; H10D 84/0186; H10D 84/0195; H10D 84/038; H10D 84/85
See application file for complete search history.

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

KR 100660891 B1 * 12/2006 ............. H10D 30/63

*Primary Examiner* — Jay C Kim
*Assistant Examiner* — Woo K Lee
(74) *Attorney, Agent, or Firm* — Slater Matsil, LLP

(57) ABSTRACT

In an embodiment, a device includes: a lower source/drain region; an upper source/drain region; a nanostructure between the upper source/drain region and the lower source/drain region; a gate structure extending into a sidewall of the nanostructure, the gate structure including a gate dielectric and a gate electrode, an outer sidewall of the gate electrode being aligned with an outer sidewall of the gate dielectric; and a gate contact adjacent the gate structure, the gate contact extending along the outer sidewall of the gate electrode and the outer sidewall of the gate dielectric.

20 Claims, 37 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 84/01*** | (2026.01) |
| ***H10D 84/03*** | (2025.01) |
| ***H10D 84/85*** | (2025.01) |
| ***H10W 20/41*** | (2026.01) |

(52) U.S. Cl.
CPC ........... *H10D 84/038* (2025.01); *H10D 84/85* (2025.01); *H10W 20/427* (2026.01)

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2011/0068418 | A1 | 3/2011 | Lung | |
| 2011/0079836 | A1* | 4/2011 | Lin ...................... | H10B 12/053 257/306 |
| 2014/0252458 | A1* | 9/2014 | Sung ...................... | H10B 12/00 257/329 |
| 2017/0084753 | A1 | 3/2017 | Lien et al. | |
| 2019/0157345 | A1 | 5/2019 | Zhu et al. | |
| 2020/0411692 | A1* | 12/2020 | Dewey ................... | H10D 84/08 |
| 2022/0344217 | A1 | 10/2022 | Ko et al. | |
| 2022/0359264 | A1 | 11/2022 | Yu et al. | |

* cited by examiner

TRANSISTOR GATE CONTACTS AND METHODS OF FORMING THE SAME

PRIORITY CLAIM AND CROSS-REFERENCE

This application claims the benefit of U.S. Provisional Application No. 63/481,006, filed on Jan. 23, 2023, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
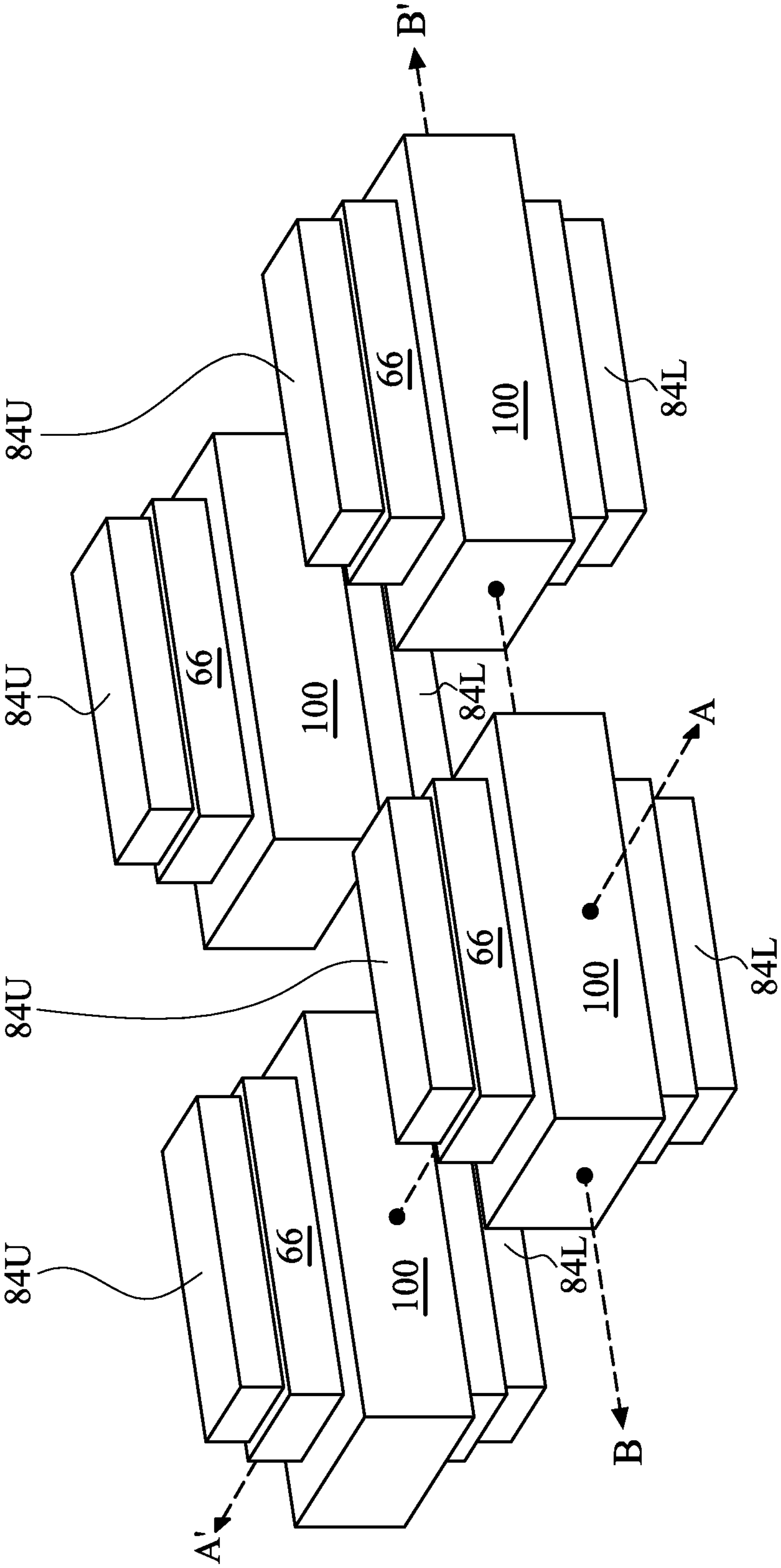
FIG. 1 illustrates an example of a nanostructure field-effect transistor (nanostructure-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiment, nanostructure-FETs are formed with vertical nanostructures. The nanostructure-FETs include gate structures wrapped around the sidewalls of the vertical nanostructures. Contacts are formed to the gate structures such that the contacts are disposed between and shared by the gate structures of adjacent nanostructure-FETs. Multiple gate structures may thus be coupled together with a same gate contact instead of with higher-level interconnects. The density of the resulting integrated circuits may thus be improved.

FIG. 1 illustrates an example of nanostructure-FETs, in accordance with some embodiments. FIG. 1 is a three-dimensional view, where some features of the nanostructure-FETs are omitted for illustration clarity.

The nanostructure-FETs each include a semiconductor nanostructure 66 (e.g., nanosheet, nanobar, or the like), with the semiconductor nanostructures 66 being semiconductor features that act as channel regions for the nanostructure-FETs. The semiconductor nanostructures 66 are vertical nanostructures that extend in a direction perpendicular to a major surface of a substrate (not separately illustrated). A gate structure 100 is wrapped around each of the sidewalls of a semiconductor nanostructure 66. The gate structures 100 each include a gate dielectric and a gate electrode (subsequently described). Source/drain regions 84 (including upper source/drain regions 84U and lower source/drain regions 84L) are disposed above and below the semiconductor nanostructures 66, respectively. Source/drain region(s) 84 may refer to a source or a drain, individually or collectively dependent upon the context. Each nanostructure-FET includes a semiconductor nanostructure 66, an upper source/drain region 84U, and a lower source/drain region 84L, with the semiconductor nanostructure 66 being disposed between the upper source/drain region 84U and the lower source/drain region 84L. Lightly doped source/drain (LDD) regions (subsequently described) may be formed between the source/drain regions 84 and the semiconductor nanostructures 66. Contacts (subsequently described) to the source/drain regions 84 and the gate structures 100 will be formed. The source/drain regions 84 and/or the gate structures 100 may be shared between various semiconductor nanostructures 66. For example, adjacent source/drain regions 84 and/or adjacent gate structures 100 may be electrically connected, such as through coupling multiple source/drain regions 84 with a same contact or coupling multiple gate structures 100 with a same contact.

FIG. 1 further illustrates reference cross-sections that are used in later figures. Cross-section A-A' is along a latitudinal axis of a semiconductor nanostructure 66. Cross-section B-B' is perpendicular to cross-section A-A' and is along a longitudinal axis of a semiconductor nanostructure 66. Subsequent figures refer to these reference cross-sections for clarity.

FIGS. 2A-31B are views of intermediate stages in the manufacturing of nanostructure-FETs, in accordance with some embodiments. FIGS. 2A, 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, 30A, and 31A illustrate cross-sectional views along a similar cross-section as reference cross-section A-A' in FIG. 1. FIGS. 2B, 3B, 4B, 5B, 6B, 7B, 8B, 9B, 10B, 11B, 12B, 13B, 14B, 15B, 16B, 17B, 18B, 19B, 20B, 21B, 22B, 23B, 24B, 25B, 26B, 27B, 28B, 29B, 30B, and 31B illustrate cross-sectional views along a similar cross-section as reference cross-section B-B' in FIG. 1.

Figure 2A:
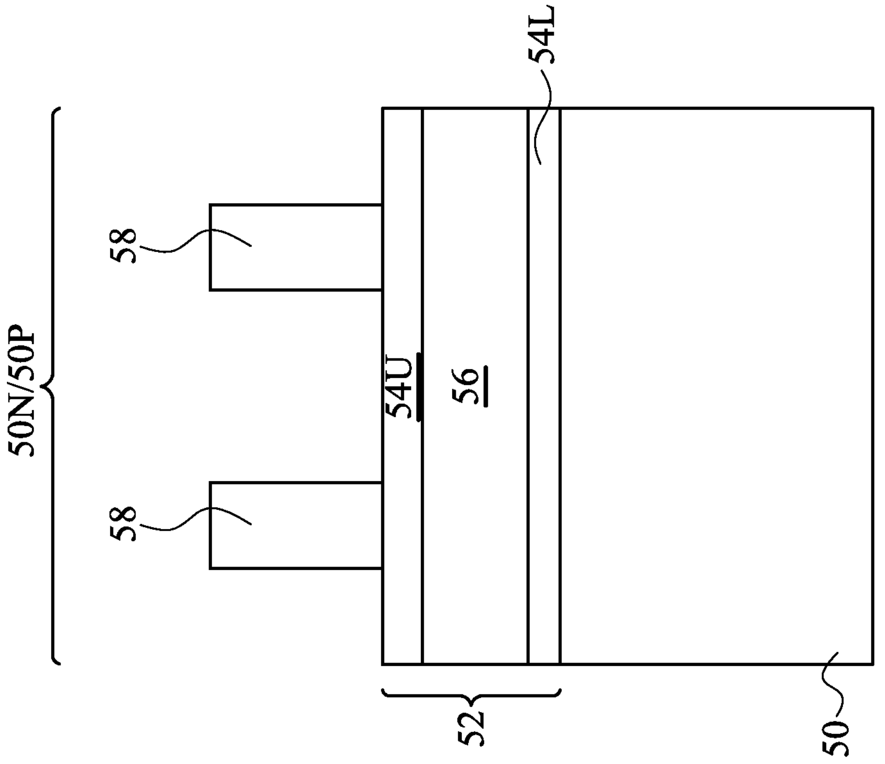
FIGS. 2A-31B are views of intermediate stages in the manufacturing of nanostructure-FETs, in accordance with some embodiments.
Figure 2B:
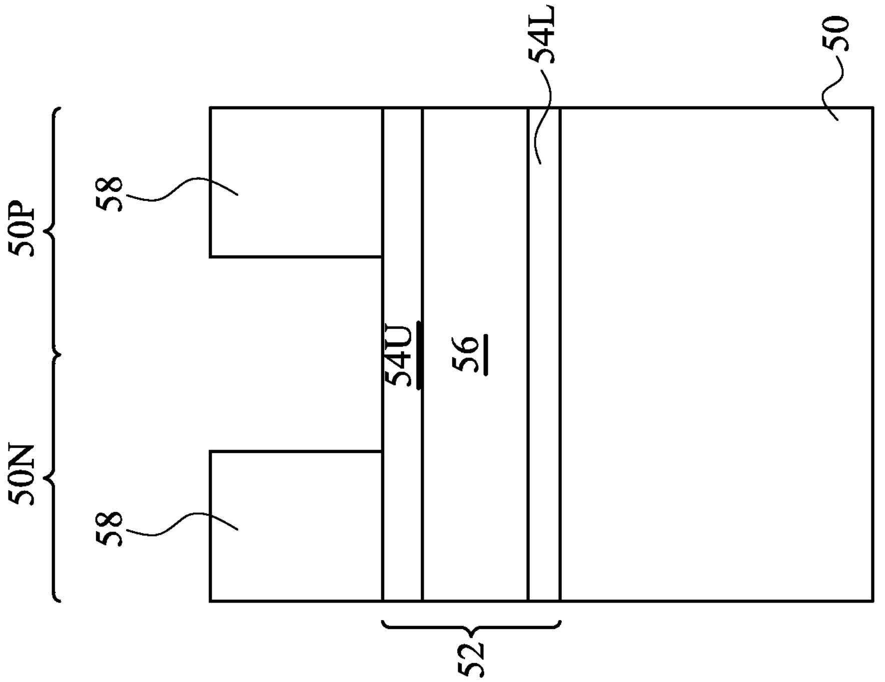

In FIGS. 2A-2B, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including carbon-doped silicon, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nanostructure-FETs, and the p-type region 50P can be for forming p-type devices, such as PMOS transistors, e.g., p-type nanostructure-FETs. The n-type region 50N may (or may not) be physically separated (not separately illustrated) from the p-type region 50P, and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

A multi-layer stack 52 is formed over the substrate 50. The multi-layer stack 52 includes dummy layers 54 (including a lower dummy layer 54L and an upper dummy layer 54U) and a semiconductor layer 56. The semiconductor layer 56 is between the lower dummy layer 54L and the upper dummy layer 54U. The dummy layers 54 are formed of a first semiconductor material, and the semiconductor layer 56 is formed of a second semiconductor material. The semiconductor materials may each be selected from the candidate semiconductor materials of the substrate 50. Each of the layers of the multi-layer stack 52 may be grown by a process such as vapor phase epitaxy (VPE) or molecular beam epitaxy (MBE), deposited by a process such as chemical vapor deposition (CVD) or atomic layer deposition (ALD), or the like.

As subsequently described in greater detail, the dummy layers 54 will be removed and the semiconductor layer 56 will be patterned to form channel regions for the nanostructure-FETs. The dummy layers 54 will be removed in subsequent processing to expose the top surfaces and the bottom surfaces of the semiconductor layer 56. The first semiconductor material of the dummy layers 54 is a material that has a high etching selectivity to the semiconductor material of the semiconductor layer 56, such as silicon-germanium (e.g., $Si_xGe_{1-x}$, where x can be in the range of 0 to 1). The second semiconductor material of the semiconductor layer 56 is a material suitable for both n-type and p-type devices, such as silicon.

A mask 58 is formed on the multi-layer stack 52. The mask 58 will be used as an etching mask during an etching processes for patterning trenches in the multi-layer stack 52 and the substrate 50. The mask 58 may include a hardmask. In some embodiments, the mask 58 is formed of a photoresist, such as a single layer photoresist, a bi-layer photoresist, a tri-layer photoresist, or the like. For example, the mask 58 may be a tri-layer photoresist including a bottom layer (e.g., a bottom anti-reflective coating (BARC) layer), a middle layer (e.g., a hardmask), and a top layer (e.g., a photoresist). The photoresist may be formed by spin coating, a deposition process such as CVD, combinations thereof, or the like, and can be patterned using any acceptable photolithography techniques to have a desired pattern of the trenches.

In some embodiments, the mask 58 is formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as the mask 58.

Figure 3B:
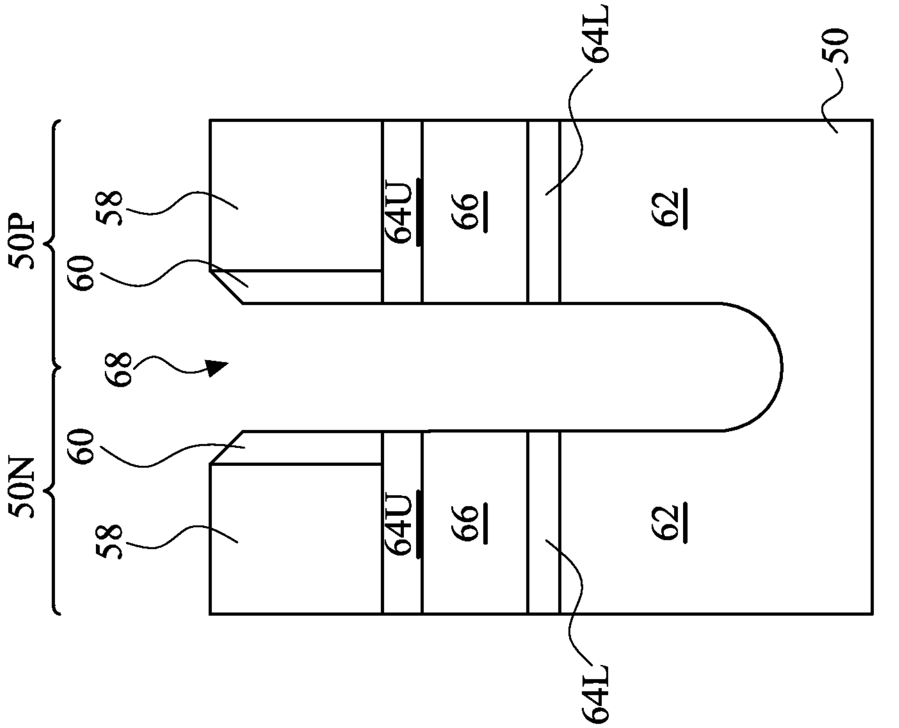
Figure 3A:
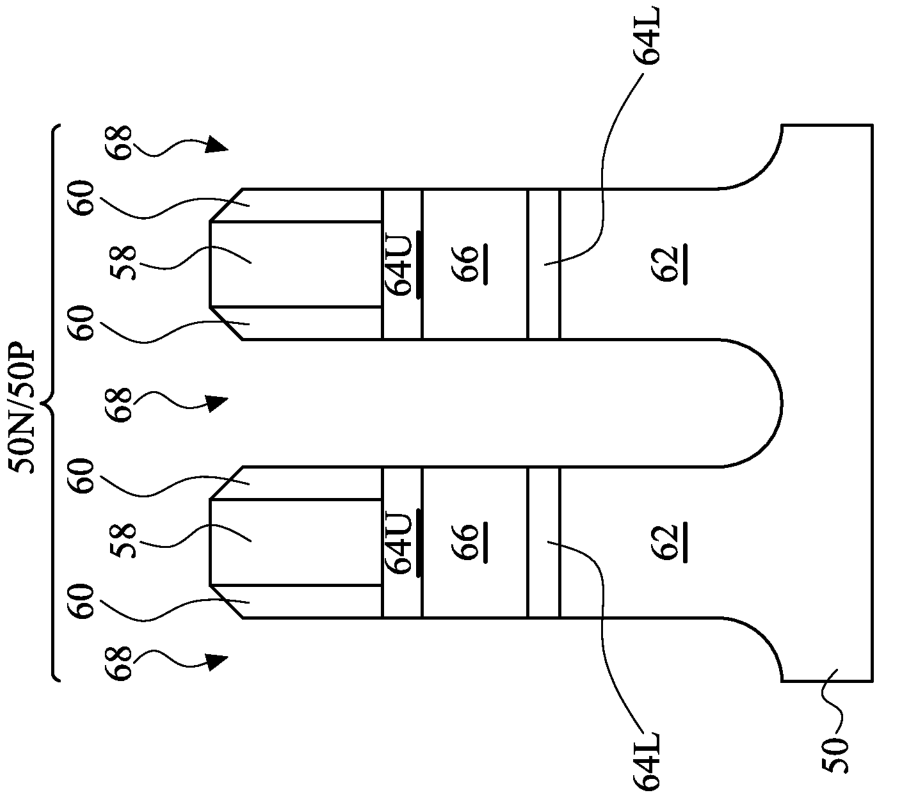

In FIGS. 3A-3B, first spacers 60 are formed over the multi-layer stack 52 (see FIGS. 2A-2B), on exposed sidewalls of the mask 58. The first spacers 60 may be formed by conformally forming one or more dielectric material(s) and subsequently etching the dielectric material(s). Acceptable dielectric materials may include silicon oxide, silicon nitride, silicon oxynitride, silicon oxycarbonitride, or the like, which may be formed by a deposition process such as chemical vapor deposition (CVD), atomic layer deposition (ALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the mask 58 (thus forming the first spacers 60).

Subsequently, fins 62 are formed in the substrate 50 and nanostructures 64, 66 (including lower dummy nanostructures 64L, upper dummy nanostructures 64U, and semiconductor nanostructures 66) are formed in the multi-layer stack 52. In some embodiments, the nanostructures 64, 66 and the fins 62 may be formed in the multi-layer stack 52 and the substrate 50, respectively, by etching trenches 68 in the multi-layer stack 52 and the substrate 50 using the combination of the first spacers 60 and the mask 58 as an etching mask. The etching may be any acceptable etch process, such as a reactive ion etch (RIE), neutral beam etch (NBE), the like, or a combination thereof. The etching may be anisotropic. Forming the nanostructures 64, 66 by etching the multi-layer stack 52 may define the lower dummy nanostructures 64L from the lower dummy layer 54L, the upper dummy nanostructures 64U from the upper dummy layer 54U, and the semiconductor nanostructures 66 from the semiconductor layer 56. Each semiconductor nanostructure 66 is between a lower dummy nanostructure 64L and an upper dummy nanostructure 64U. As subsequently described in greater detail, the upper dummy nanostructures 64U will be replaced with upper source/drain regions, and the lower dummy nanostructures 64L will be replaced with lower source/drain regions. The lower dummy nanostructures 64L and the upper dummy nanostructures 64U may further be collectively referred to as the dummy nanostructures 64.

In some embodiments, the nanostructures 64, 66 are vertical nanostructures such as nanobars, although other vertical channel structure shapes and configurations are possible, such as nanowires, multiple nanowires, multiple nanobars, or the like. A nanobar has a longitudinal axis and a latitudinal axis, which are perpendicular to each other. The longitudinal axis and the latitudinal axis of the nanostructures 64, 66 are perpendicular to a major surface of the substrate 50.

Figure 4B:
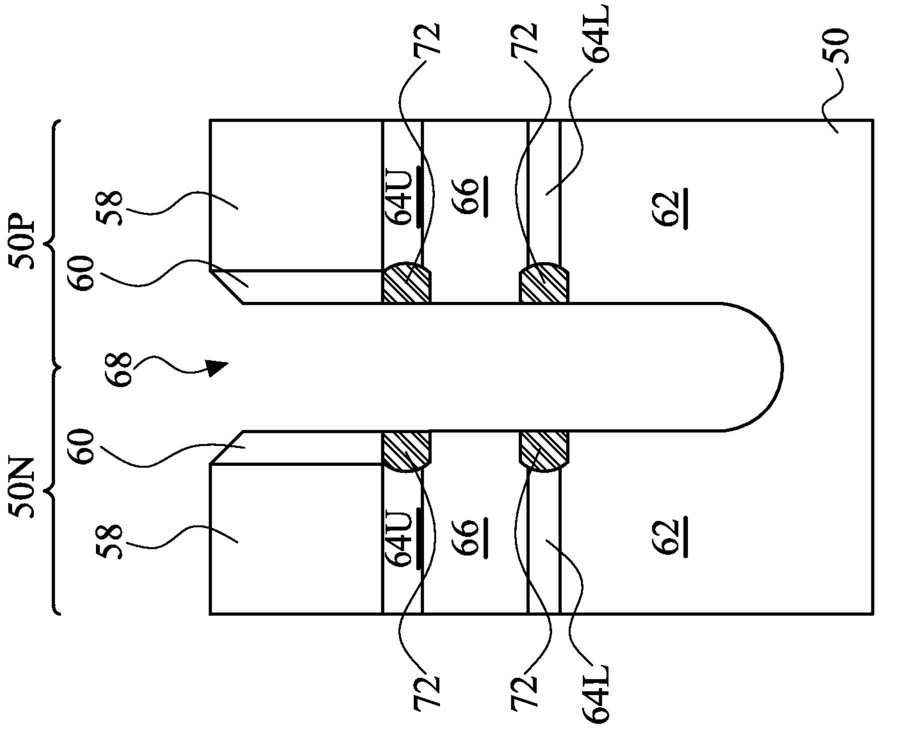
Figure 4A:
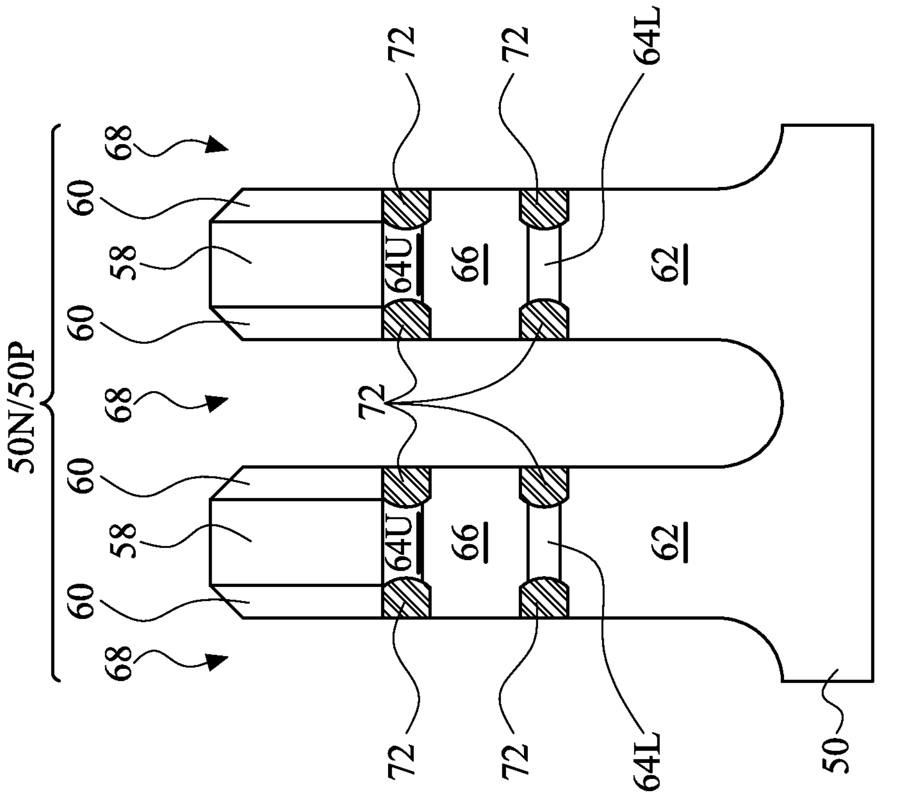

In FIGS. 4A-4B, gate spacers 72 are formed on the sidewalls of the dummy nanostructures 64, e.g., those sidewalls exposed by the trenches 68. The semiconductor nanostructures 66 are thus disposed between the gate spacers 72. As will be subsequently described in greater detail, gate structures will be subsequently formed around the semiconductor nanostructures 66, and the dummy nanostructures 64 will be subsequently replaced with corresponding source/drain regions. The gate spacers 72 act as isolation features between the subsequently formed source/drain regions and the subsequently formed gate structures. Further, the gate spacers 72 may be used to prevent damage to the subsequently formed source/drain regions by subsequent etch processes, such as etch processes used to subsequently trim the semiconductor nanostructures 66.

As an example to form the gate spacers 72, the trenches 68 can be laterally expanded. Specifically, portions of the sidewalls of the dummy nanostructures 64 exposed by the trenches 68 may be recessed to form sidewall recesses. Although sidewalls of the dummy nanostructures 64 are illustrated as being concave, the sidewalls may be straight or convex. The sidewalls may be recessed by any acceptable etch process, such as one that is selective to the dummy nanostructures 64 (e.g., selectively etches the material of the dummy nanostructures 64 at a faster rate than the material of the semiconductor nanostructures 66). The etching may be isotropic. For example, when the dummy nanostructures 64 are formed of silicon-germanium and the semiconductor nanostructures 66 are formed of silicon, the etch process may be a wet etch using tetramethylammonium hydroxide (TMAH), ammonium hydroxide ($NH_4OH$), or the like. In another embodiment, the etch process may be a dry etch using a fluorine-based gas such as hydrogen fluoride (HF) gas. In some embodiments, the same etch process may be continually performed to both form the trenches 68 and recess the sidewalls of the dummy nanostructures 64. The gate spacers 72 can then be formed by conformally forming an insulating material in the sidewall recesses and the trenches 68, and subsequently etching the insulating material. The insulating material may be silicon nitride, silicon carbonitride, silicon oxycarbide, or silicon oxycarbonitride, although any suitable material, such as low-dielectric constant (low-k) materials having a k-value less than about 3.5, may be utilized. The insulating material may be formed by a deposition process, such as ALD, CVD, or the like. The etching of the insulating material may be anisotropic. For example, the etch process may be a dry etch such as a RIE, a NBE, or the like. The insulating material, when etched, has portions left in the sidewall recesses (thus forming the gate spacers 72).

Although outer sidewalls of gate spacers 72 are illustrated as being flush with sidewalls of the semiconductor nanostructures 66, the outer sidewalls of the gate spacers 72 may extend beyond or be recessed from sidewalls of the semiconductor nanostructures 66. Thus, the gate spacers 72 may partially fill, completely fill, or overfill the sidewall recesses. Moreover, although the sidewalls of the gate spacers 72 are illustrated as being straight, the sidewalls of the gate spacers 72 may be concave or convex.

Figure 5B:
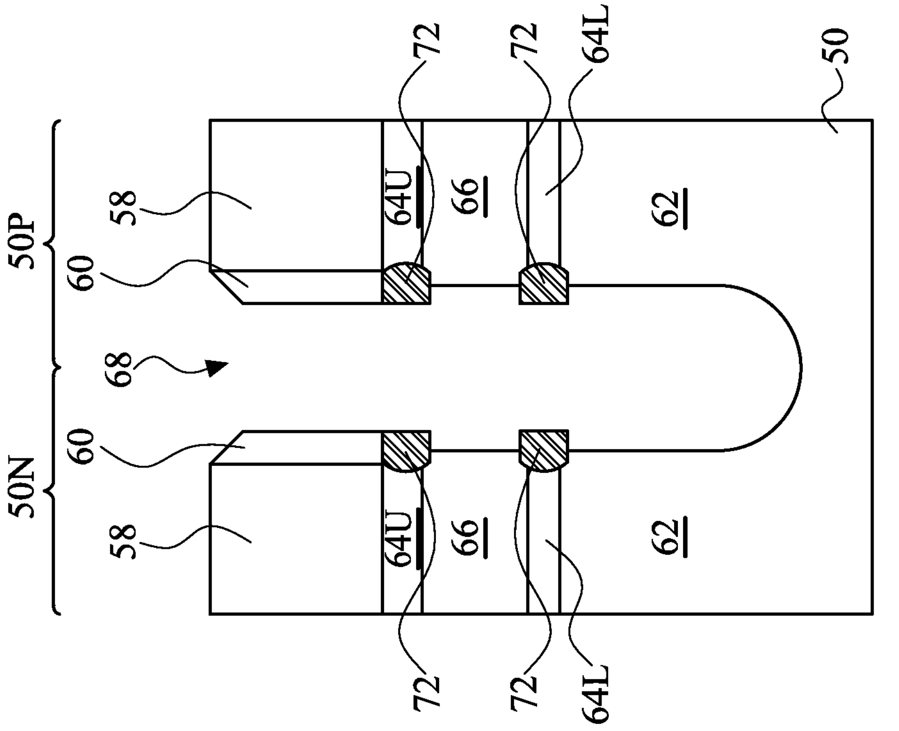
Figure 5A:
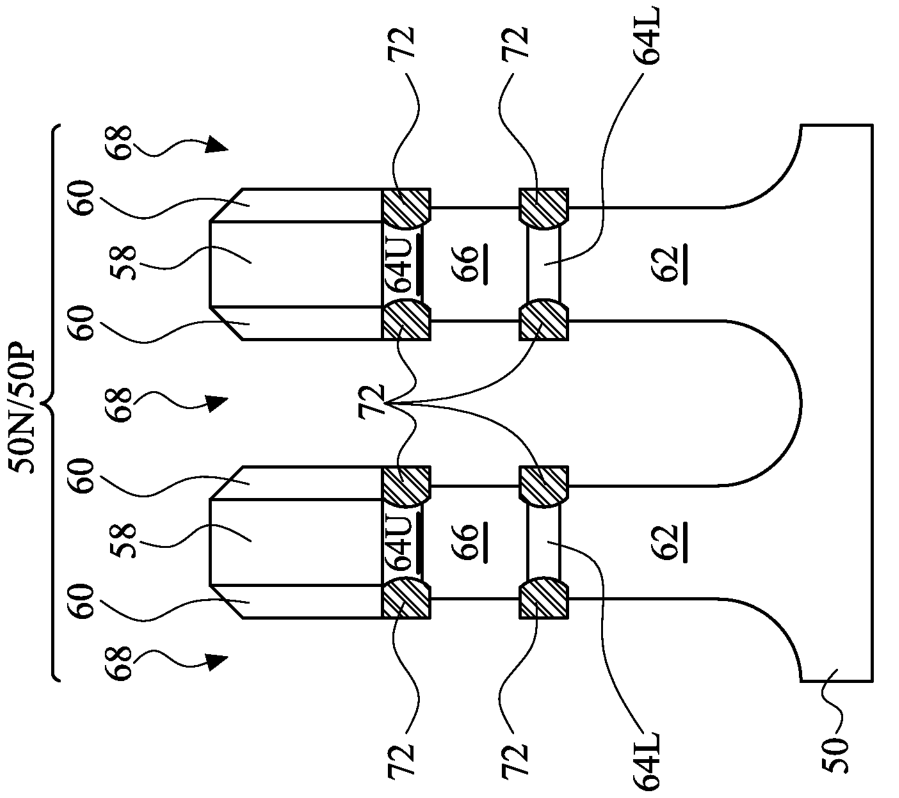

In FIGS. 5A-5B, the portions of the semiconductor nanostructures 66 exposed by the trenches 68 are optionally trimmed. The trimming reduces the dimensions (e.g., widths) of the semiconductor nanostructures 66. Trimming the semiconductor nanostructures 66 may decrease the risk of shorting between the subsequently formed source/drain regions and the subsequently formed gate structures. The semiconductor nanostructures 66 may be trimmed by any acceptable etching process, such as one that is selective to the semiconductor nanostructures 66 (e.g., selectively etches the material of the semiconductor nanostructures 66 at a faster rate than the material of the dummy nanostructures 64). The etching may be isotropic.

In some embodiments, the trimming process includes performing multiple oxidation and etch cycles. For example, during each oxidation cycle, portions of the semiconductor nanostructures 66 may be oxidized, and during each etch cycle, the oxidized portions of the semiconductor nanostructures 66 are removed. The oxidation and etch cycles are repeated until a desired amount of material has been trimmed from the semiconductor nanostructures 66. For example, the oxidation and etch cycles may be cyclically repeated a predetermined quantity of times. The oxidation may be accomplished by any acceptable oxidation process, such as a native oxidation process, a thermal oxidation process, a rapid thermal oxidation (RTO) process, a chemical oxidation process, an in-situ stream generation (ISSG) process, or the like. Other oxidation processes or a combination thereof may be performed. The etching may be accomplished by any acceptable etching process, such as a wet etch, a dry etch, or combinations thereof. For example, a chemical oxide removal with any acceptable etch process using, for example, dilute hydrofluoric (dHF) acid may be used.

Figure 6B:
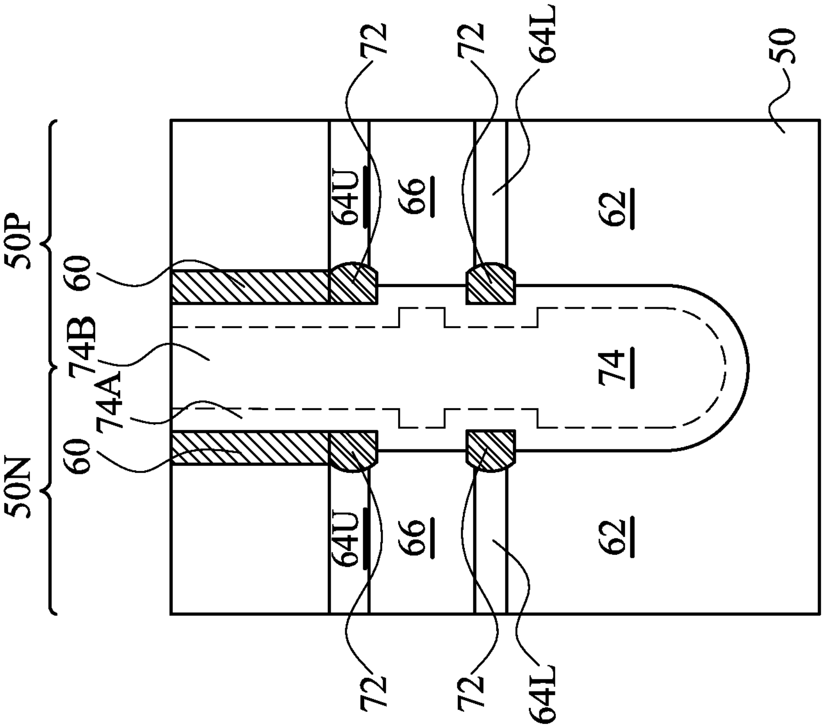
Figure 6A:
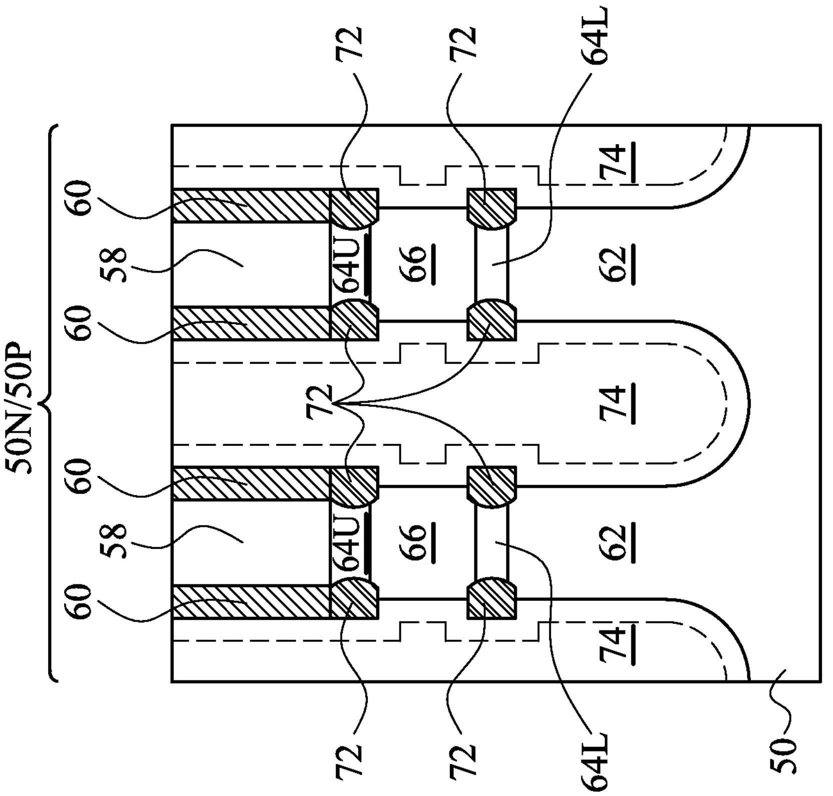

In FIGS. 6A-6B, an insulation material 74 is formed over the substrate 50 and between adjacent fins 62, adjacent nanostructures 64, 66, and adjacent first spacers 60. The insulation material 74 may be an oxide, such as silicon oxide, a nitride, the like, or a combination thereof, and may be formed by high-density plasma chemical vapor deposition (HDP-CVD), flowable chemical vapor deposition (FCVD), the like, or a combination thereof. Other insulation materials formed by any acceptable process may be used. In some embodiments, the insulation material 74 includes silicon oxide formed by an FCVD process. An annealing process may be performed once the insulation material 74 is formed. The insulation material 74 may (or may not) include multiple layers. For example, in some embodiments, a liner 74A may first be formed along surfaces of the substrate 50, the fins 62, and the nanostructures 64, 66. Thereafter, a fill material 74B, such as one of the previously described insulation materials, may be formed over the liner 74A.

The insulation material 74 may be deposited over the first spacers 60 and the mask 58 such that excess insulation material 74 covers the first spacers 60 and the mask 58. A removal process is then applied to the insulation material 74 to remove excess insulation material 74 over the first spacers 60 and the mask 58. In some embodiments, a planarization process such as a chemical mechanical polish (CMP), an etch-back process, combinations thereof, or the like may be utilized. The planarization process exposes the first spacers 60 and the mask 58 such that top surfaces of the mask 58, the first spacers 60, and the insulation material 74 are substantially coplanar (within process variations) after the planarization process is complete.

Figure 7B:
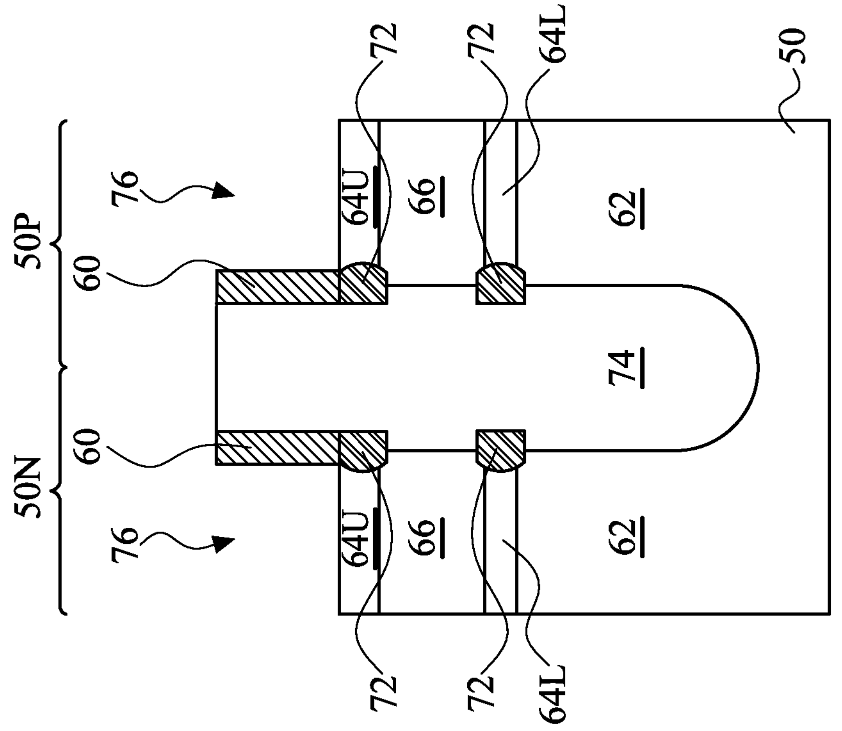
Figure 7A:
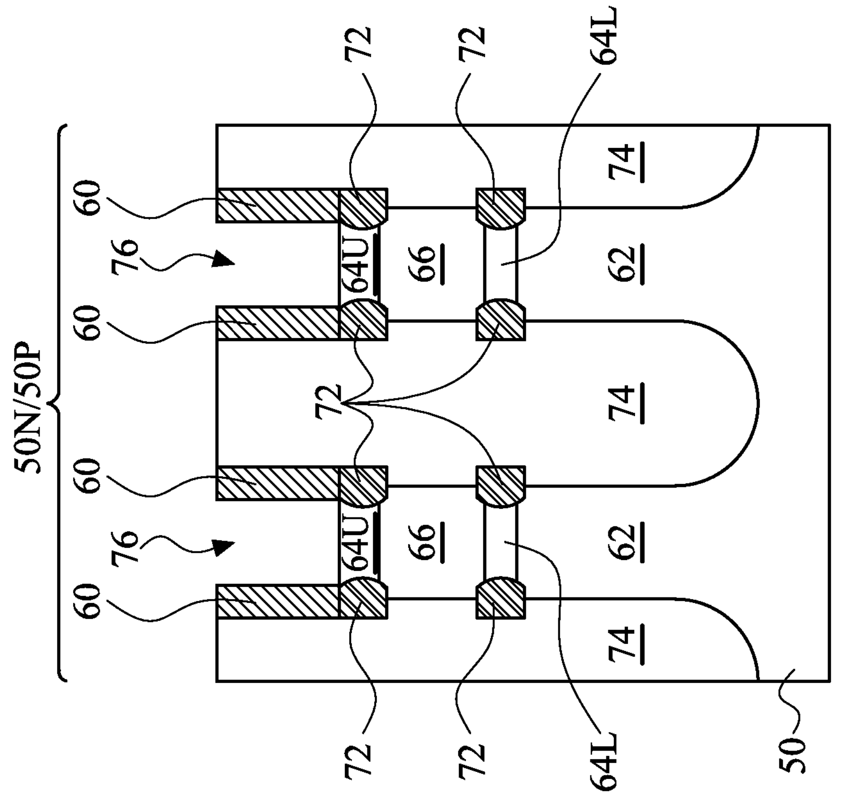

In FIGS. 7A-7B, the mask 58 is removed to form upper source/drain recesses 76. The upper source/drain recesses 76 expose the upper dummy nanostructures 64U. In embodiments where the mask 58 includes a photoresist, it may be removed by any acceptable ashing process. In embodiments where the mask 58 includes a hardmask, it may be removed with an etching process that is selective to the mask 58 (e.g., selectively etches the material of the mask 58 at a faster rate than the material of the dummy nanostructures 64). During the removal, the upper dummy nanostructures 64U may be used as etch stop layers when the mask 58 is etched.

Figure 8B:
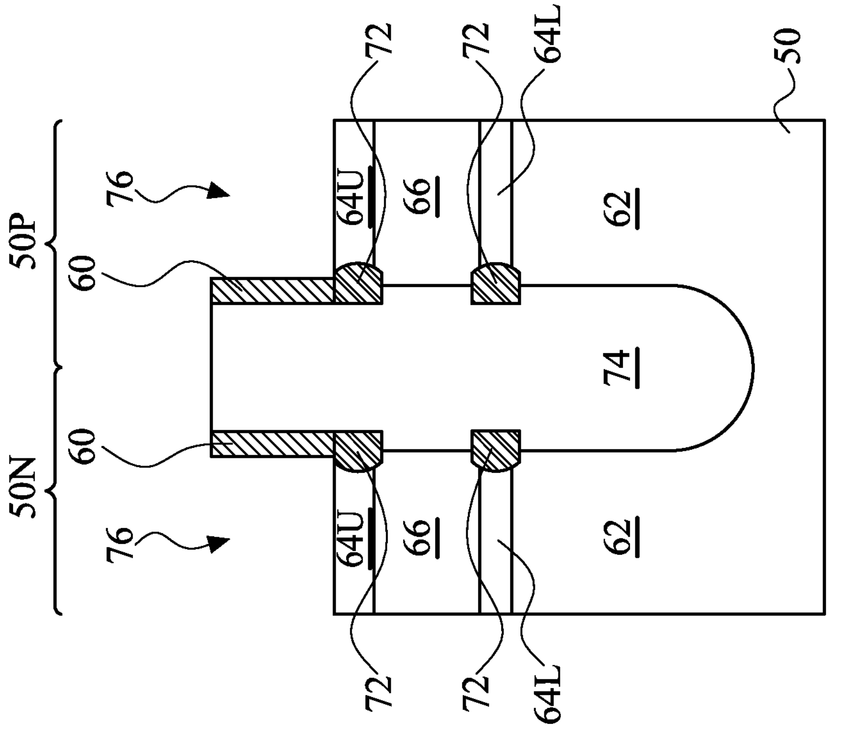
Figure 8A:
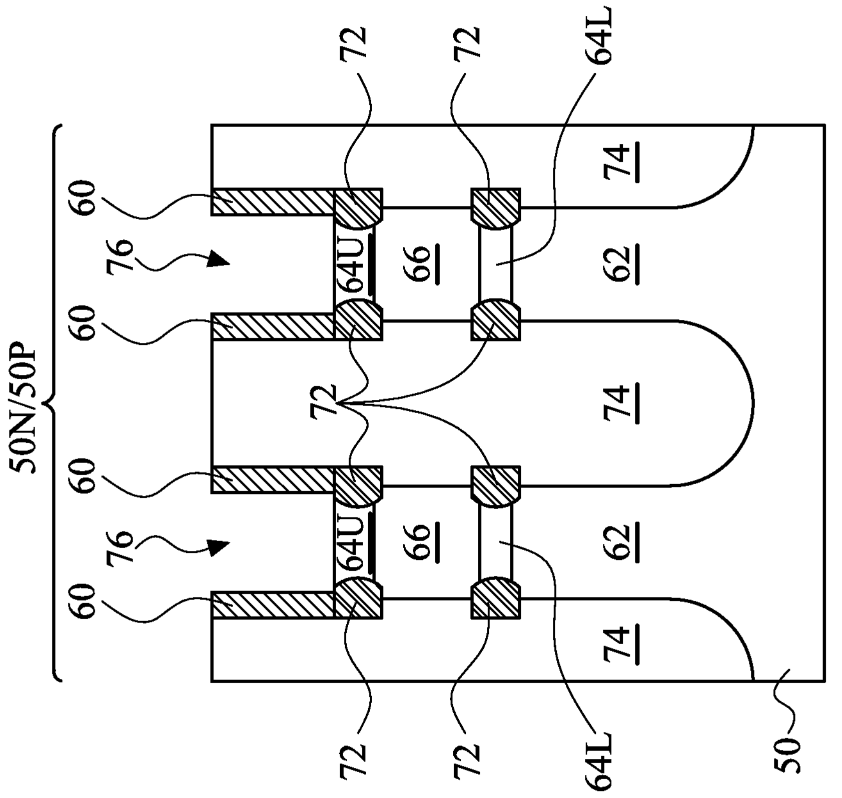

In FIGS. 8A-8B, the first spacers 60 are trimmed. The trimming reduces the dimensions (e.g., widths) of the first spacers 60. The first spacers 60 are trimmed until the top surfaces of the upper dummy nanostructures 64U are completely exposed. Specifically, the portions of the first spacers 60 covering the upper dummy nanostructures 64U are removed. Accordingly, the remaining portions of the first spacers 60 are on the gate spacers 72 and are not on the upper dummy nanostructures 64U. The first spacers 60 may be trimmed by any acceptable etching process, such as one that is selective to the first spacers 60 (e.g., selectively etches the material of the first spacers 60 at a faster rate than the material of the dummy nanostructures 64). The etching may be isotropic.

Figure 9B:
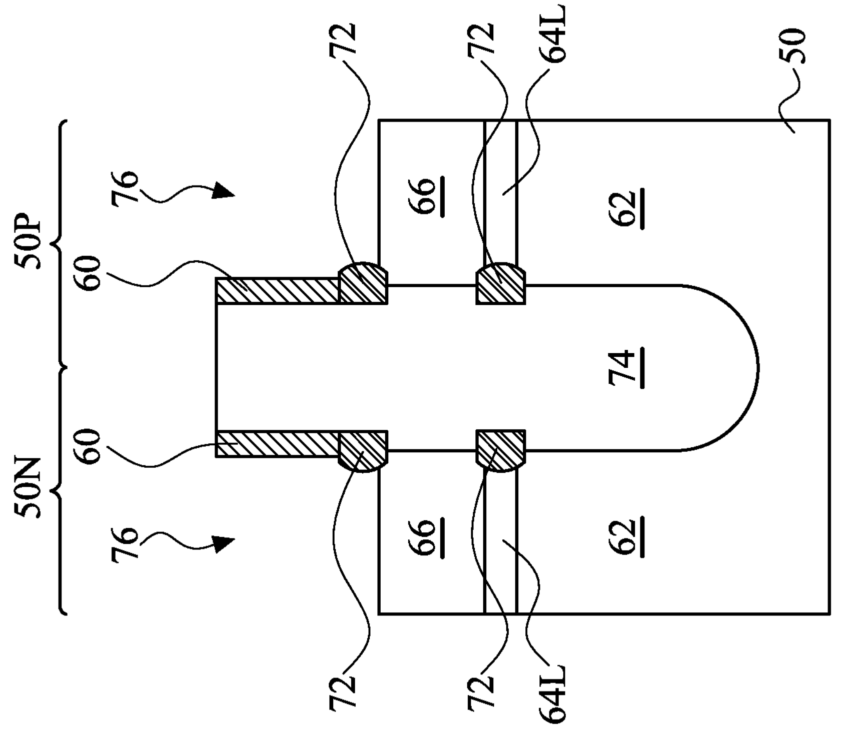
Figure 9A:
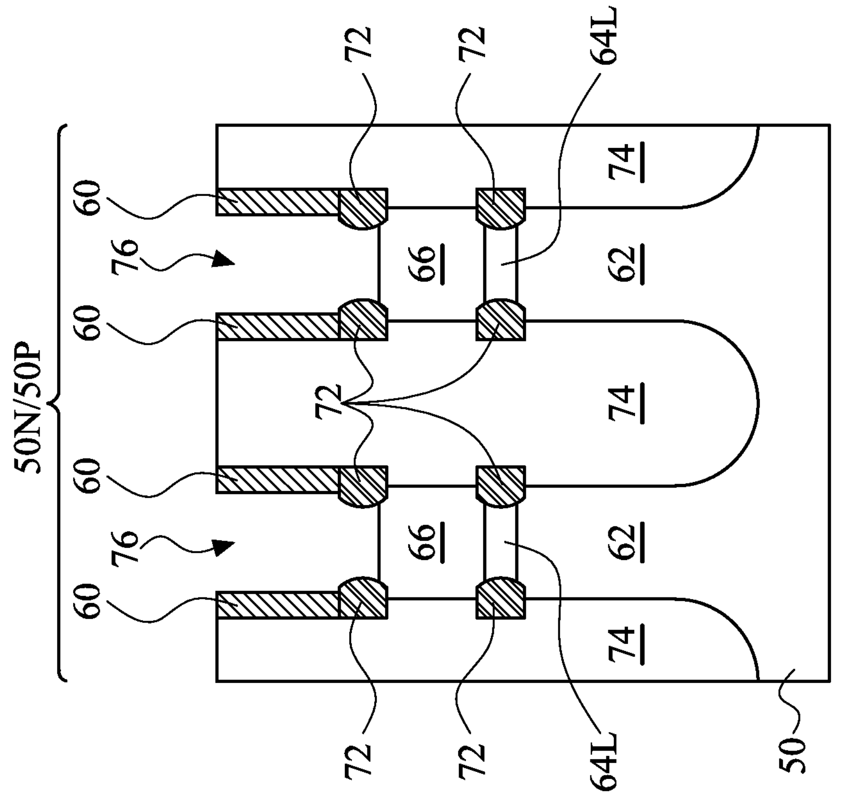

In FIGS. 9A-9B, the remaining portions of the upper dummy nanostructures 64U are removed to extend the upper source/drain recesses 76. Accordingly, the upper source/drain recesses 76 expose the semiconductor nanostructures 66. The remaining portions of the upper dummy nanostructures 64U can be removed by any acceptable etch process, such as one that is selective to the upper dummy nanostructures 64U (e.g., selectively etches the material of the dummy nanostructures 64 at a faster rate than the material of the semiconductor nanostructures 66). The etching may be isotropic.

Figure 10B:
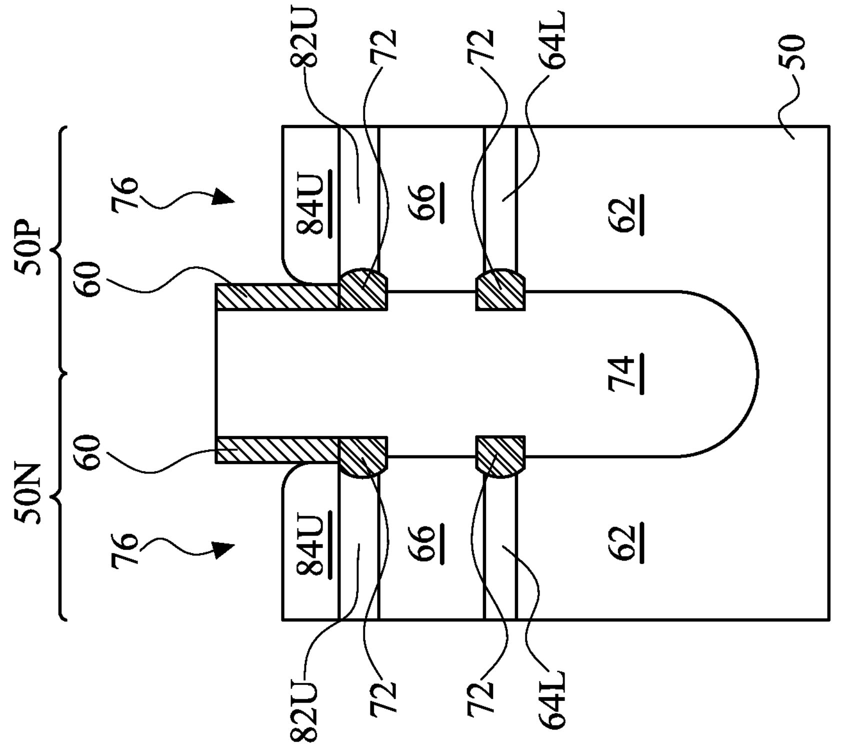
Figure 10A:
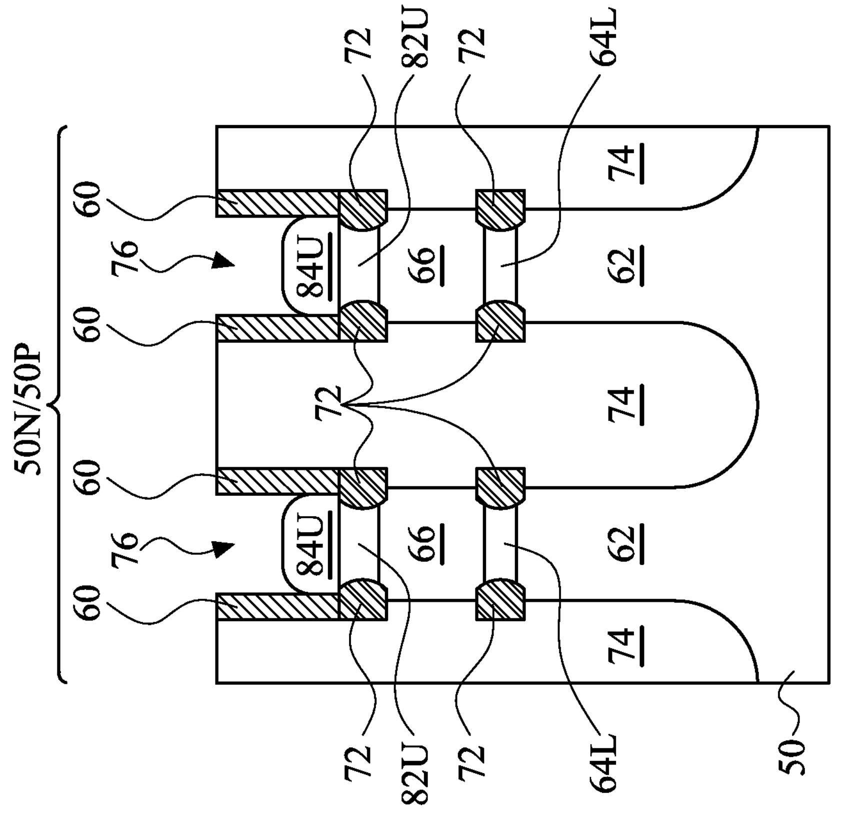

In FIGS. 10A-10B, upper source/drain regions 84U are formed in the upper source/drain recesses 76. In some embodiments, the gate spacers 72 are used to separate the upper source/drain regions 84U from the semiconductor nanostructures 66 by an appropriate lateral distance so that the upper source/drain regions 84U do not short out with subsequently formed gates of the resulting nanostructure-FETs.

The upper source/drain regions 84U in the n-type region 50N may be formed by masking the p-type region 50P. Then, the upper source/drain regions 84U are epitaxially grown in the upper source/drain recesses 76 in the n-type region 50N. The upper source/drain regions 84U in the n-type region 50N may include any acceptable material appropriate for n-type nanostructure-FETs. For example, if the semiconductor nanostructures 66 are formed of silicon, the upper source/drain regions 84U may include materials exerting a tensile strain on the semiconductor nanostructures 66, such as silicon, carbon-doped silicon, phosphorous-doped silicon, silicon phosphide, or the like. The upper source/drain regions 84U in the n-type region 50N may be referred to as "n-type source/drain regions." The upper source/drain regions 84U may have surfaces raised from respective upper surfaces of the semiconductor nanostructures 66 and may have facets.

The upper source/drain regions 84U in the p-type region 50P may be formed by masking the n-type region 50N. Then, the upper source/drain regions 84U are epitaxially grown in the upper source/drain recesses 76 in the p-type region 50P. The upper source/drain regions 84U in the p-type region 50P may include any acceptable material appropriate for p-type nanostructure-FETs. For example, if the semiconductor nanostructures 66 are formed of silicon, the upper source/drain regions 84U may comprise materials exerting a compressive strain on the semiconductor nanostructures 66, such as silicon-germanium, boron-doped silicon-germanium, germanium, germanium tin, or the like. The upper source/drain regions 84U in the p-type region 50P may be referred to as "p-type source/drain regions." The upper source/drain regions 84U may also have surfaces raised from respective surfaces of the semiconductor nanostructures 66 and may have facets.

The upper source/drain regions 84U may be implanted with appropriate type (e.g., n-type or p-type) dopants to form source/drain regions, followed by an anneal. The n-type dopants may be phosphorus, arsenic, antimony, or the like. The p-type dopants may be boron, boron fluoride, indium, or the like. The source/drain regions may have a dopant concentration of between $10^{19}$ atoms/$cm^3$ and $10^{21}$ atoms/$cm^3$. In some embodiments, the upper source/drain regions 84U may be in situ doped during growth.

The upper source/drain regions 84U may comprise one or more semiconductor material layers. For example, the upper source/drain regions 84U may comprise a liner layer, a main layer, and a finishing layer (or more generally, a first semiconductor material layer, a second semiconductor material layer, and a third semiconductor material layer). Any number of semiconductor material layers may be used for the upper source/drain regions 84U. Each of the liner layer, the main layer, and the finishing layer may be formed of different semiconductor materials and may be doped to different dopant concentrations. In some embodiments, the liner layer may have a dopant concentration less than the main layer and greater than the finishing layer. In embodiments in which the upper source/drain regions 84U include three semiconductor material layers, the liner layers may be grown in the upper source/drain recesses 76, the main layers may be grown on the liner layers, and the finishing layers may be grown on the main layers.

Optionally, upper LDD regions 82U are formed in the upper source/drain recesses 76. The upper LDD regions 82U are formed on the semiconductor nanostructures 66 and the upper source/drain regions 84U are formed on the upper LDD regions 82U, such that the upper LDD regions 82U are between the upper source/drain regions 84U and the semiconductor nanostructures 66. The upper LDD regions 82U may be epitaxially grown in a similar manner to the upper source/drain regions 84U, e.g., using appropriate masking steps to form the upper LDD regions 82U in the p-type region 50P of acceptable material appropriate for p-type nanostructure-FETs (previously described) and to form the upper LDD regions 82U in the n-type region 50N of acceptable material appropriate for n-type nanostructure-FETs (previously described). The upper LDD regions 82U may be implanted with appropriate type (e.g., n-type or p-type) dopants to form LDD regions, followed by an anneal. The n-type and/or p-type dopants for LDD regions may be any of the previously described dopants. The LDD regions may have a dopant concentration in a range from $10^{15}$ atoms/cm$^3$ to $10^{19}$ atoms/cm$^3$. In some embodiments, the upper LDD regions 82U may be in situ doped during growth.

Figure 11B:
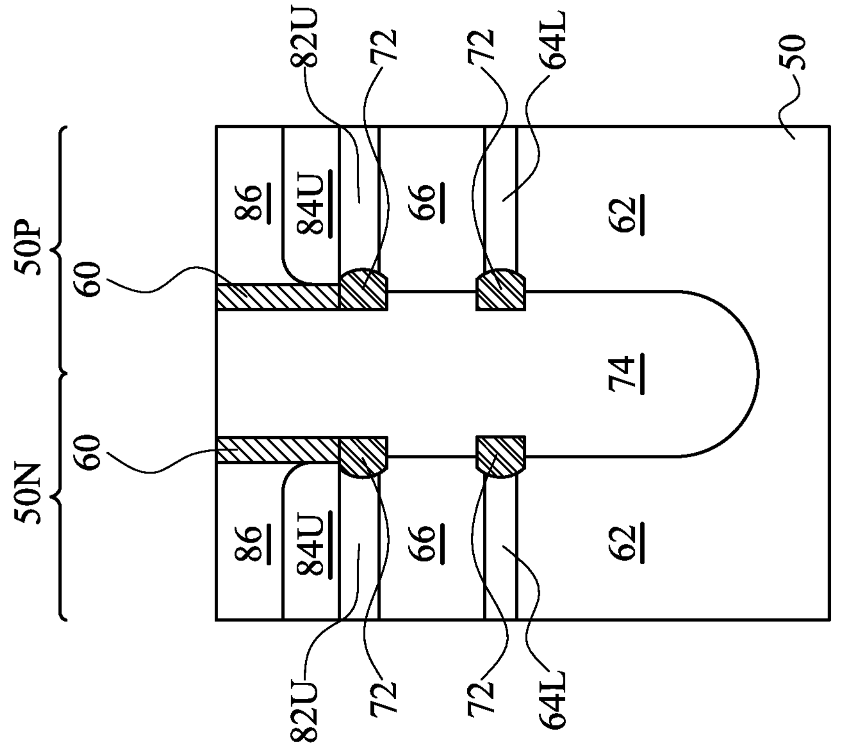
Figure 11A:
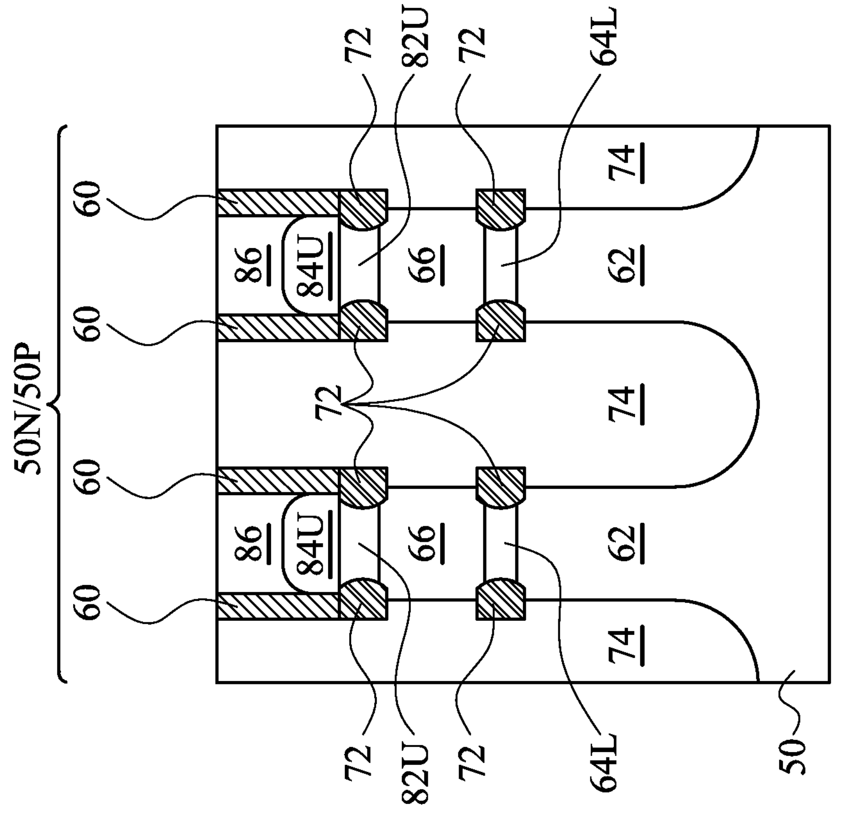

In FIGS. 11A-11B, source/drain masks 86 are formed on the upper source/drain regions 84U. The source/drain masks 86 are sacrificial masks formed to protect the upper source/drain regions 84U during subsequent processing. The source/drain masks 86 will be subsequently replaced with conductive pads.

As an example to form the source/drain masks 86, one or more dielectric material(s) may be conformally deposited in the upper source/drain recesses 76. The dielectric material(s) may also be deposited on the top surfaces of the insulation material 74 and the first spacers 60. Acceptable dielectric materials may include silicon nitride, silicon carbonitride, silicon oxynitride, silicon oxycarbonitride, or the like, which may be formed by a conformal deposition process such as chemical vapor deposition (CVD), atomic layer deposition (ALD), or the like. Other dielectric materials formed by any acceptable process may be used. A removal process is performed to remove the excess portions of the dielectric material(s), which excess portions are over the top surfaces of the insulation material 74 and the first spacers 60. In some embodiments, a planarization process such as a chemical mechanical polish (CMP), an etch-back process, combinations thereof, or the like is utilized. The dielectric material(s), after the removal process, have portions left in the upper source/drain recesses 76 (thus forming the source/drain masks 86). After the planarization process, the top surfaces of the source/drain masks 86, the insulation material 74, and the first spacers 60 are substantially coplanar (within process variations).

Figure 12A:
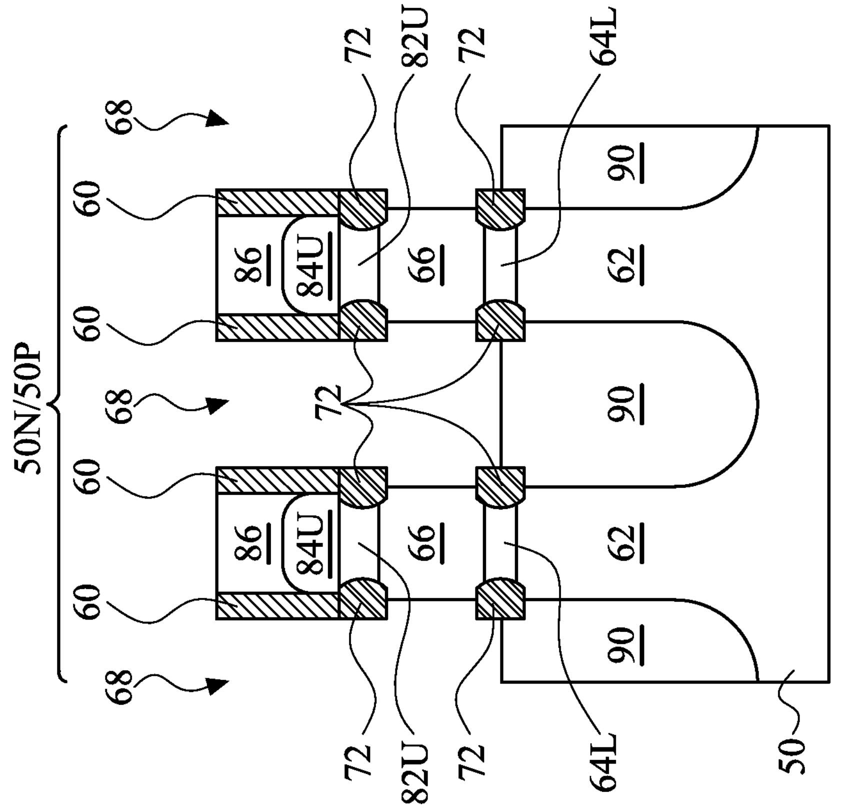
Figure 12B:
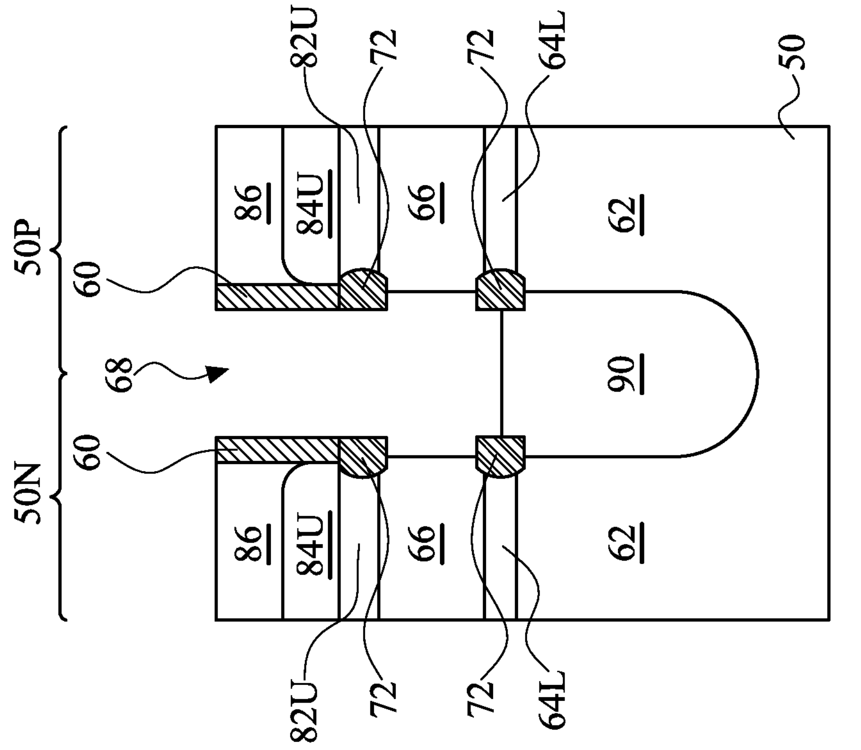

In FIGS. 12A-12B, the insulation material 74 is recessed to form isolation regions 90, e.g., shallow trench isolation (STI) regions. The isolation regions 90 are adjacent the fins 62. Recessing the insulation material 74 removes some of the insulation material 74 from the trenches 68. The insulation material 74 is recessed such that the sidewalls of the semiconductor nanostructures 66 are exposed. Thus, the semiconductor nanostructures 66 are above the isolation regions 90. Further, the top surfaces of the isolation regions 90 may have a flat surface as illustrated, a convex surface, a concave surface (such as dishing), or a combination thereof. The top surfaces of the isolation regions 90 may be formed flat, convex, and/or concave by an appropriate etch. The isolation regions 90 may be recessed using any acceptable etching process, such as one that is selective to the insulation material 74 (e.g., selectively etches the insulation material 74 at a faster rate than the materials of the fins 62 and the nanostructures 64, 66). For example, an oxide removal using, for example, dilute hydrofluoric (dHF) acid may be used.

Figure 13B:
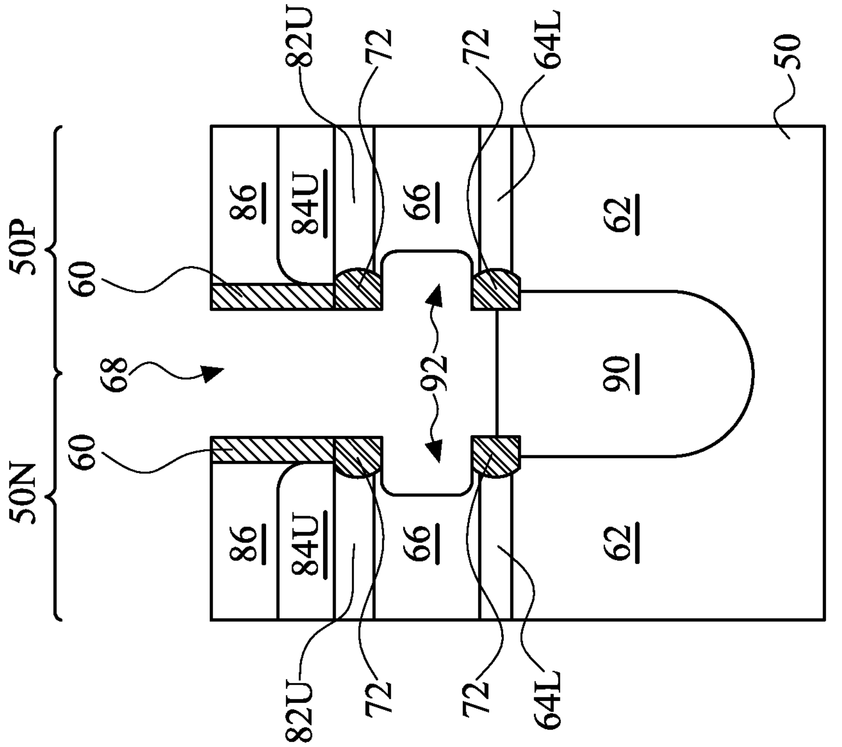
Figure 13A:
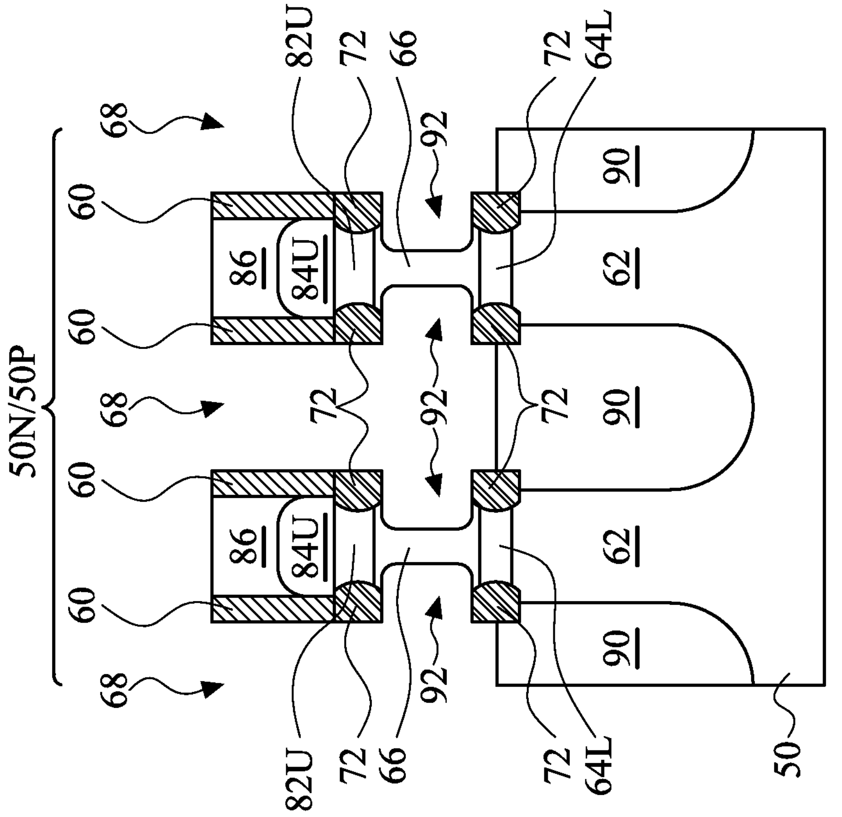

In FIGS. 13A-13B, the portions of the semiconductor nanostructures 66 exposed by the trenches 68 are trimmed to form sidewall recesses 92. The trimming reduces the dimensions (e.g., widths) of the semiconductor nanostructures 66. Gate structures will be subsequently formed in the sidewall recesses 92. The semiconductor nanostructures 66 may be trimmed by any acceptable etching process, such as one that is selective to the semiconductor nanostructures 66 (e.g., selectively etches the material of the semiconductor nanostructures 66 at a faster rate than the material of the dummy nanostructures 64). The etching may be isotropic. In some embodiments, the trimming process includes performing multiple oxidation and etch cycles, in a similar manner as the previously described process for trimming the semiconductor nanostructures 66.

Figure 14A:
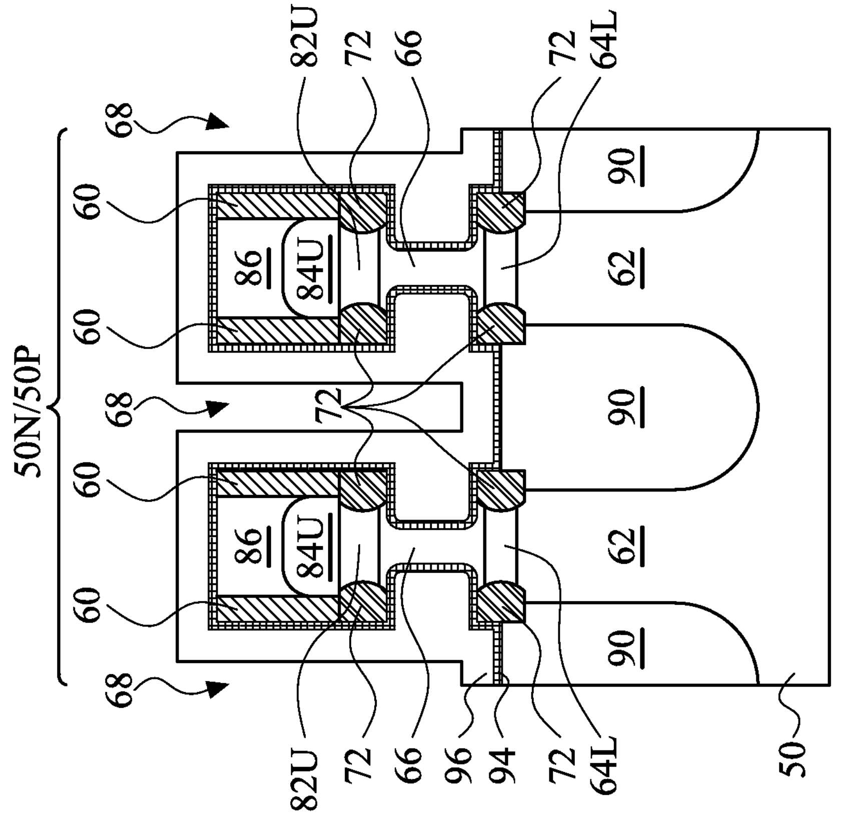
Figure 14B:
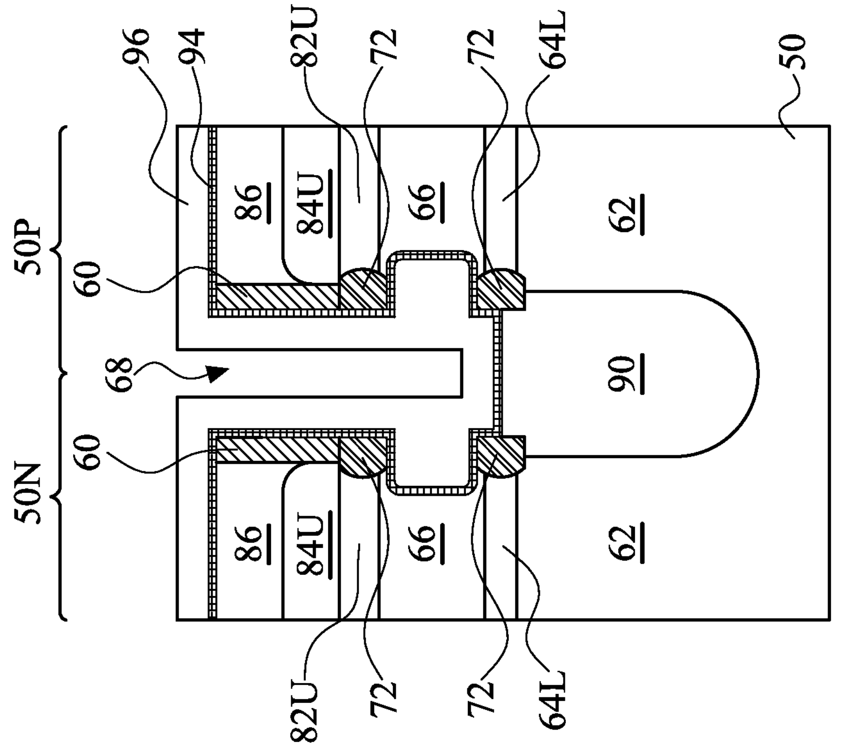

In FIGS. 14A-14B, a gate dielectric layer 94 is conformally formed in the sidewall recesses 92 and the trenches 68. Specifically, the gate dielectric layer 94 is formed on the sidewalls of the semiconductor nanostructures 66 and on the bottom surfaces and the top surfaces of the gate spacers 72. The gate dielectric layer 94 wraps around all (e.g., four) sidewalls of the semiconductor nanostructures 66. The gate dielectric layer 94 may also be formed on the top surfaces of the isolation regions 90, the sidewalls of the gate spacers 72, the sidewalls of the first spacers 60, the top surfaces of the first spacers 60, and the top surfaces of the source/drain masks 86. The gate dielectric layer 94 may include an oxide such as silicon oxide or a metal oxide, a silicate such as a metal silicate, combinations thereof, multi-layers thereof, or the like. The gate dielectric layer 94 may include a high-dielectric constant (high-k) material having a k-value greater than about 7.0, such as a metal oxide or a silicate of hafnium, aluminum, zirconium, lanthanum, manganese, barium, titanium, lead, and combinations thereof. The formation methods of the gate dielectric layer 94 may include molecular-beam deposition (MBD), ALD, plasma-enhanced chemical vapor deposition (PECVD), and the like. Although a single-layered gate dielectric layer 94 is illustrated, the gate dielectric layer 94 may include multiple layers, such as an interfacial layer and an overlying high-k dielectric layer. In some embodiments, the interfacial layer is formed of silicon oxide and the high-k dielectric layer is formed of hafnium oxide.

A gate electrode layer 96 is formed on the gate dielectric layer 94. The gate electrode layer 96 may include one or more metal-containing material(s) such as titanium nitride, titanium oxide, tantalum nitride, tantalum carbide, cobalt, ruthenium, aluminum, tungsten, combinations thereof, multi-layers thereof, or the like. The formation methods of the gate electrode layer 96 may include physical vapor deposition (PVD), CVD, ALD, and the like. Although a single-layered gate electrode layer 96 is illustrated, the gate electrode layer 96 may include multiple layers, such as any number of work function tuning layers, any number of glue layers, and a fill layer.

The formation of the gate dielectric layers 94 in the n-type region 50N and the p-type region 50P may occur simultaneously such that the gate dielectric layers 94 in each region are formed from the same materials, and the formation of the gate electrode layers 96 may occur simultaneously such that the gate electrode layers 96 in each region are formed from the same materials. In some embodiments, the gate dielectric layers 94 in each region may be formed by distinct processes, such that the gate dielectric layers 94 may be different materials and/or have a different number of layers, and/or the gate electrode layers 96 in each region may be formed by distinct processes, such that the gate electrode layers 96 may be different materials and/or have a different number of layers. Various masking steps may be used to mask and expose appropriate regions when using distinct processes.

Figure 15B:
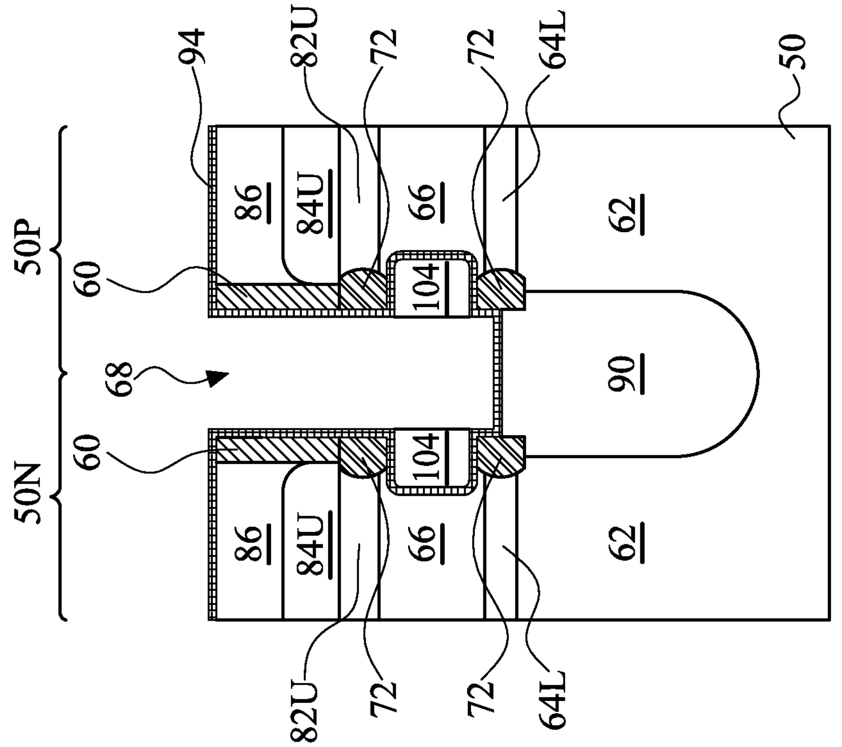
Figure 15A:
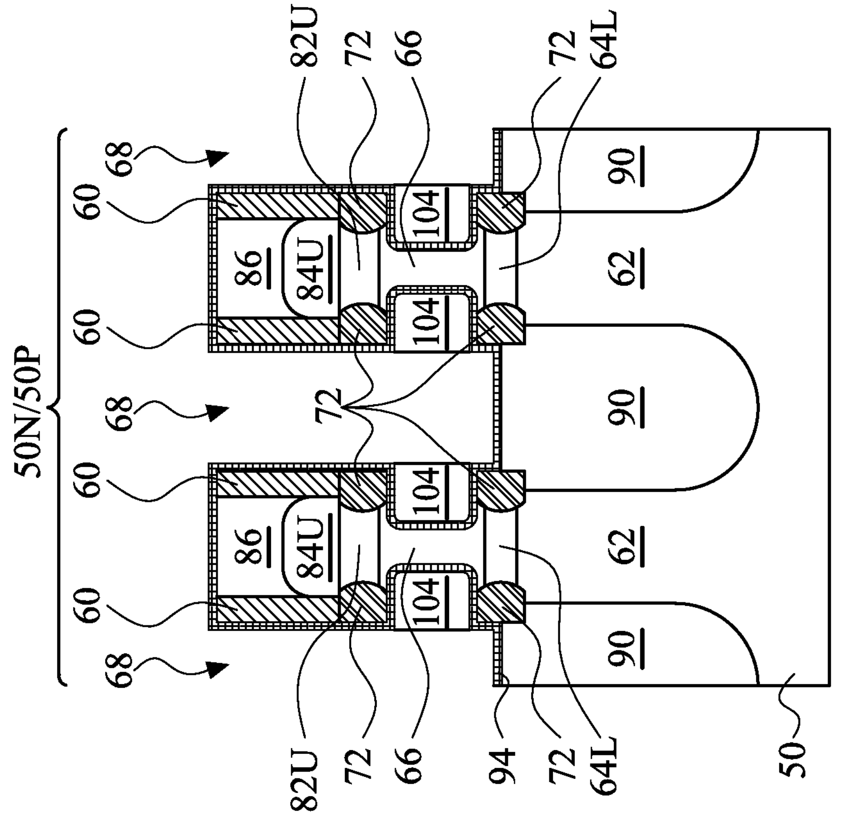

In FIGS. 15A-15B, the portions of the gate electrode layer 96 in the trenches 68 (e.g., outside of the sidewall recesses 92, see FIGS. 13A-13B) are removed to form gate electrodes 104. Removing the portions of the gate electrode layer 96 in the trenches 68 exposes the gate dielectric layers 94. The portions of the gate electrode layer 96 may be removed by any acceptable etch-back process. The etching of the gate electrode layer 96 may be anisotropic. For example, the etch process may be a dry etch such as a RIE, a NBE, or the like. The etch-back process is selective to the gate electrode layer 96 (e.g., selectively etches the material(s) of the gate electrode layer 96 at a faster rate than the material(s) of the gate dielectric layer 94). In some embodiments, a dry etch is performed using chlorine as an etchant. The gate electrode layer 96, after the removal process, has portions left in the sidewall recesses 92 (thus forming the gate electrodes 104). As a result of forming the gate electrodes 104 with an etch-back process, the outer sidewalls of the gate electrodes 104 are aligned with the outer sidewalls of the gate dielectric layer 94 (and thus will be aligned with the outer sidewalls of subsequently formed gate dielectrics). The gate electrodes 104 are disposed in the sidewall recesses 92 such that they extend into the sidewalls of the semiconductor nanostructures 66 in a direction parallel to a major surface of a substrate.

Figure 16B:
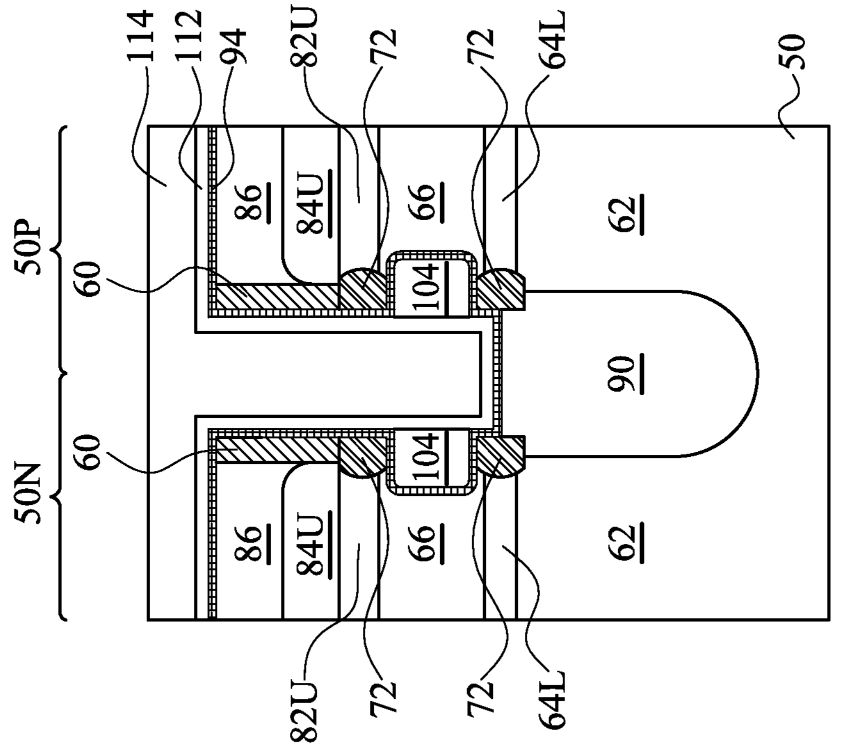
Figure 16A:
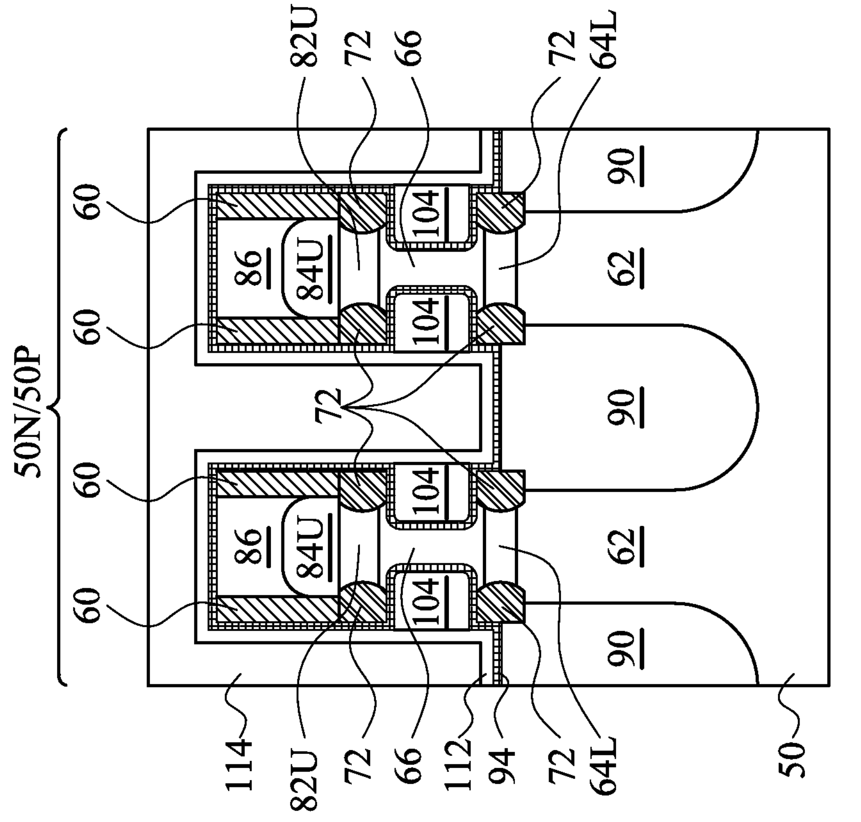

In FIGS. 16A-16B, a first inter-layer dielectric (ILD) 114 is deposited in the trenches 68, on the gate dielectric layer 94, and along the sidewalls of the gate electrodes 104. Accordingly, the first ILD 114 is over the isolation regions 90. The first ILD 114 fills (and may overfill) the trenches 68 such that it is over the source/drain masks 86 and the first spacers 60. The first ILD 114 is around the upper source/drain regions 84U, the semiconductor nanostructures 66, and the gate electrodes 104. The first ILD 114 may be formed of a dielectric material, which may be deposited by any suitable method, such as CVD, plasma-enhanced chemical vapor deposition (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a tri-layer structure such as an oxide-nitride-oxide structure may be formed. For example, the trenches 68 may be filled with a first oxide, a nitride may be formed over the first oxide, and a second oxide may be formed over the nitride. Utilizing a tri-layer structure may reduce the height difference in different regions. A removal process is then applied to the tri-layer structure to remove the second oxide and the nitride. In some embodiments, a planarization process such as a chemical mechanical polish (CMP), an etch-back process, combinations thereof, or the like may be utilized. The first oxide remaining in the trenches 68 forms the first ILD 114.

In some embodiments, a contact etch stop layer (CESL) 112 is formed between the first ILD 114 and the gate dielectric layer 94 and the gate electrodes 104. The CESL 112 may be formed of a dielectric material having a high etching selectivity to the dielectric material of the first ILD 114, such as, silicon nitride, silicon oxide, silicon oxynitride, or the like, which may be formed by any suitable deposition process, such as CVD, ALD, or the like.

As subsequently described in greater detail, gate contacts will be formed through the first ILD 114 and the CESL 112, to the gate electrodes 104. The gate contacts are formed between adjacent gate electrodes 104 and adjacent semiconductor nanostructures 66, such that the gate contacts extend along the outer sidewalls of the gate electrodes 104. Multiple gate electrodes 104 may thus be coupled by a same gate contact, which may be advantageous when fabricating some types of circuits, such as CMOS inverters. In some embodiments, a gate contact is disposed between (and coupled to) a gate electrode 104 in the p-type region 50P and a gate electrode 104 in the n-type region 50N. Optionally, gate contact masks are formed over the gate contacts.

Figure 17B:
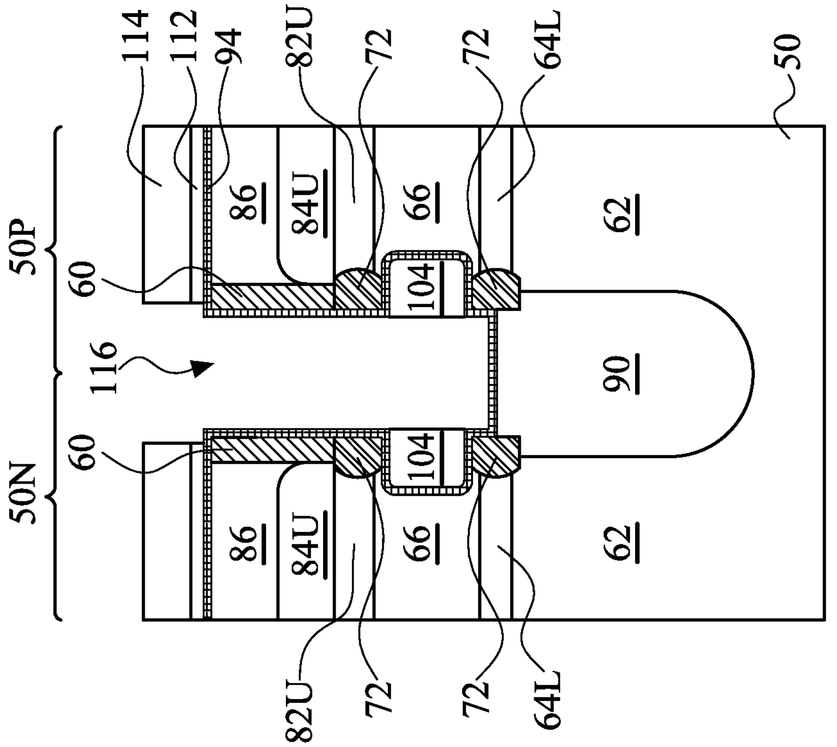
Figure 17A:
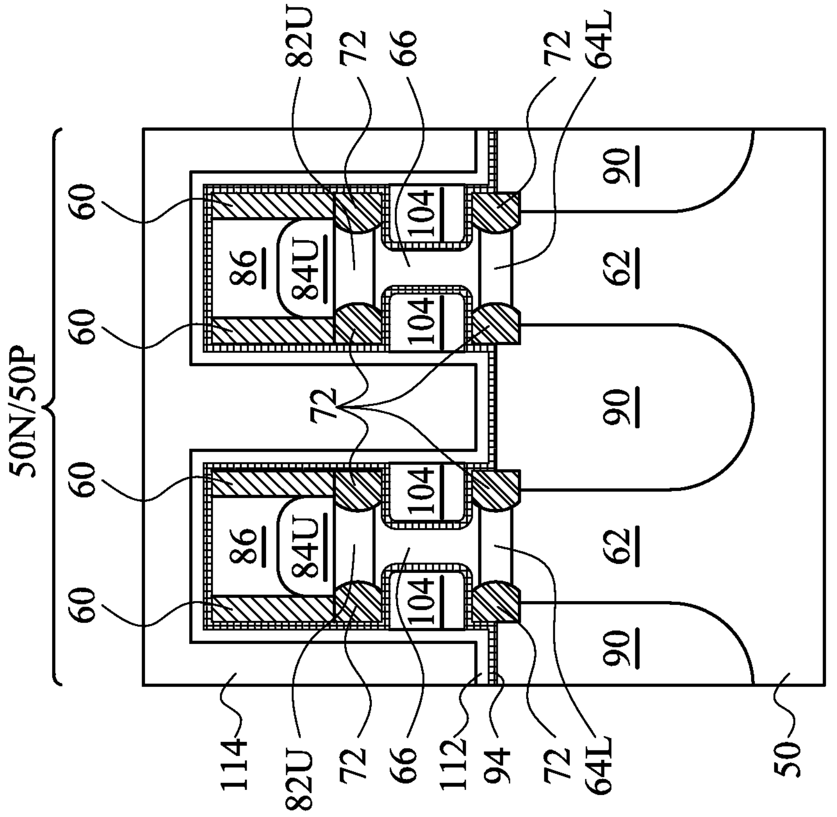

In FIGS. 17A-17B, contact openings 116 for gate contacts are formed through the first ILD 114 and the CESL 112. The contact openings 116 are formed between some of the semiconductor nanostructures 66. In some embodiments, the contact openings 116 are formed between the semiconductor nanostructures 66 along the longitudinal axes of the semiconductor nanostructures 66. In some embodiments, a contact opening 116 is formed between a semiconductor nanostructure 66 in the p-type region and a semiconductor nanostructure 66 in the n-type region 50N. The contact openings 116 are trenches that expose the gate dielectric layer 94 and the outer sidewalls of the gate electrodes 104.

Figure 18B:
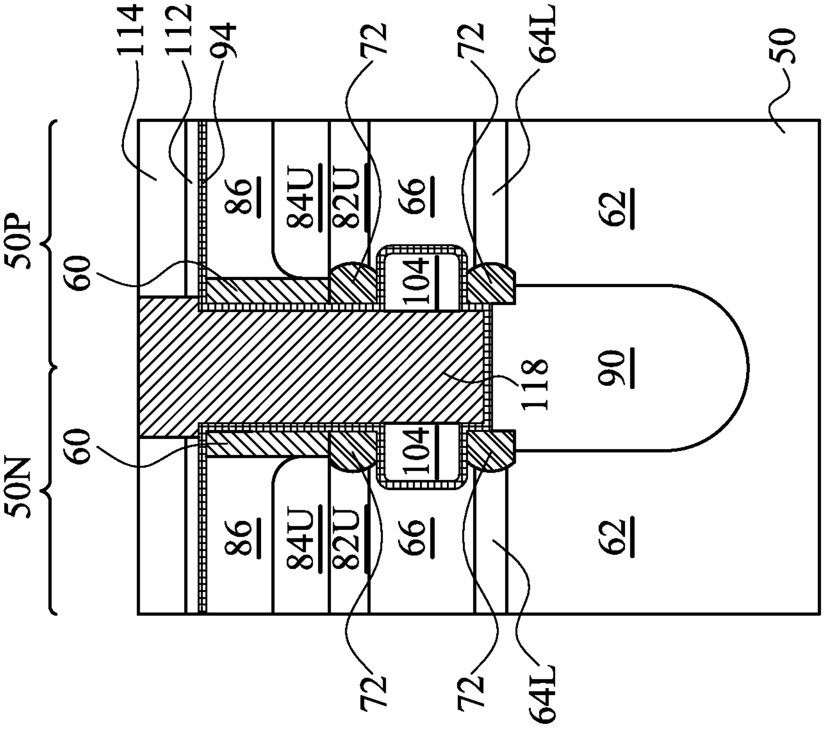
Figure 18A:
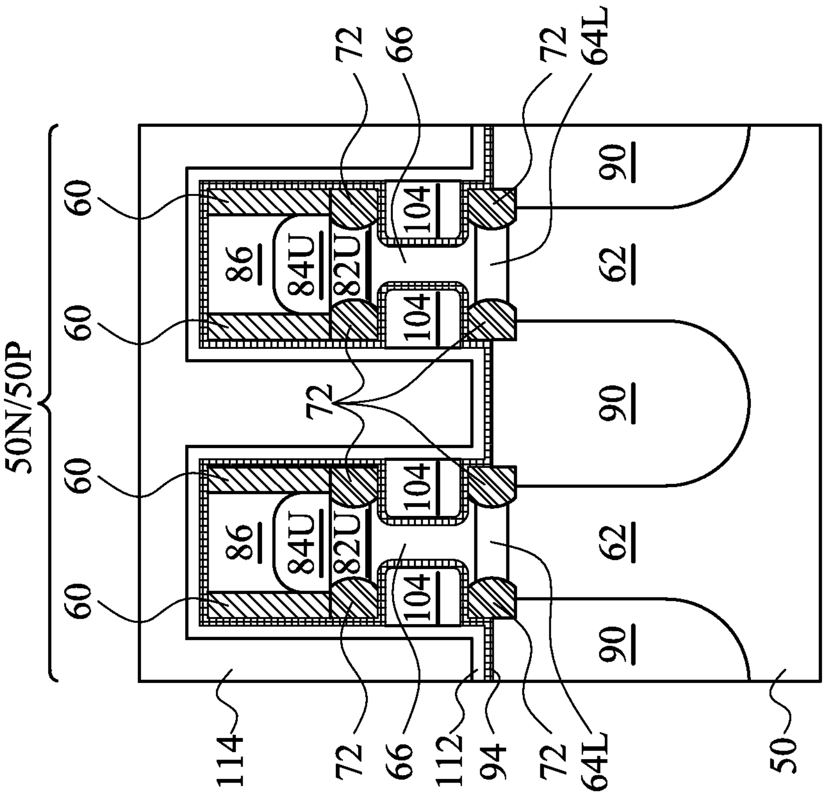

In FIGS. 18A-18B, gate contacts 118 are formed in the contact openings 116 to contact the outer sidewalls of the gate electrodes 104. Accordingly, the gate contacts 118 extend through the first ILD 114. The gate contacts 118 may be physically and electrically coupled to the gate electrodes 104. In some embodiments, a gate contact 118 is disposed between (and coupled to) a gate electrode 104 in the p-type region 50P and a gate electrode 104 in the n-type region 50N.

As an example to form the gate contacts 118, a liner (not separately illustrated), such as a diffusion barrier layer, an adhesion layer, or the like, and a conductive material may be formed in the contact openings 116. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from the top surfaces of the first ILD 114. The remaining liner and conductive material form the gate contacts 118 in the contact openings 116. After the planarization process, top surfaces of the gate contacts 118 and the first ILD 114 are substantially coplanar (within process variations).

Figure 19A:
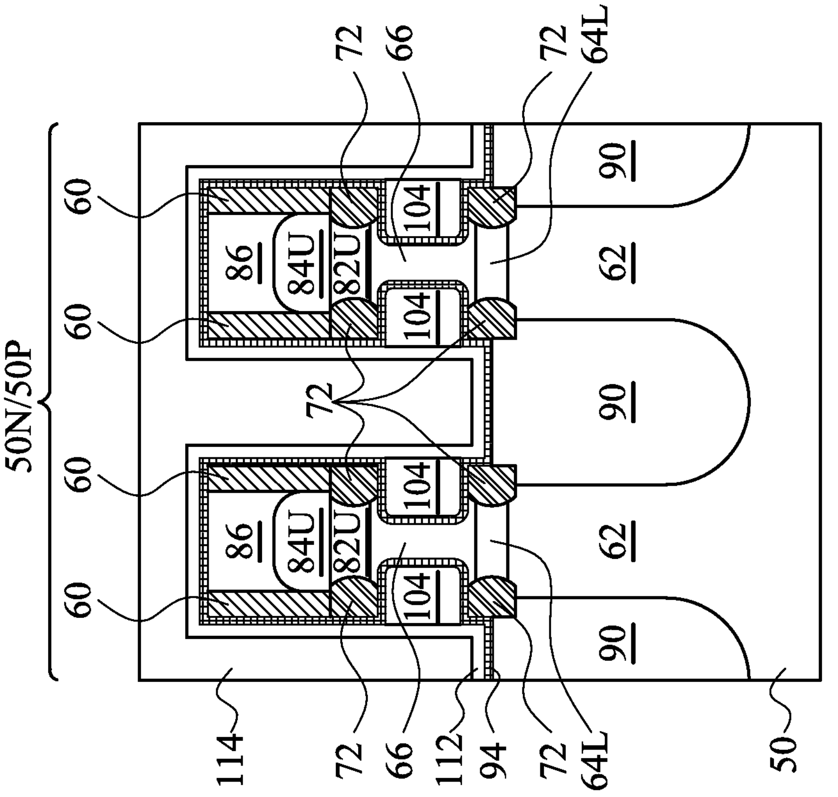
Figure 19B:
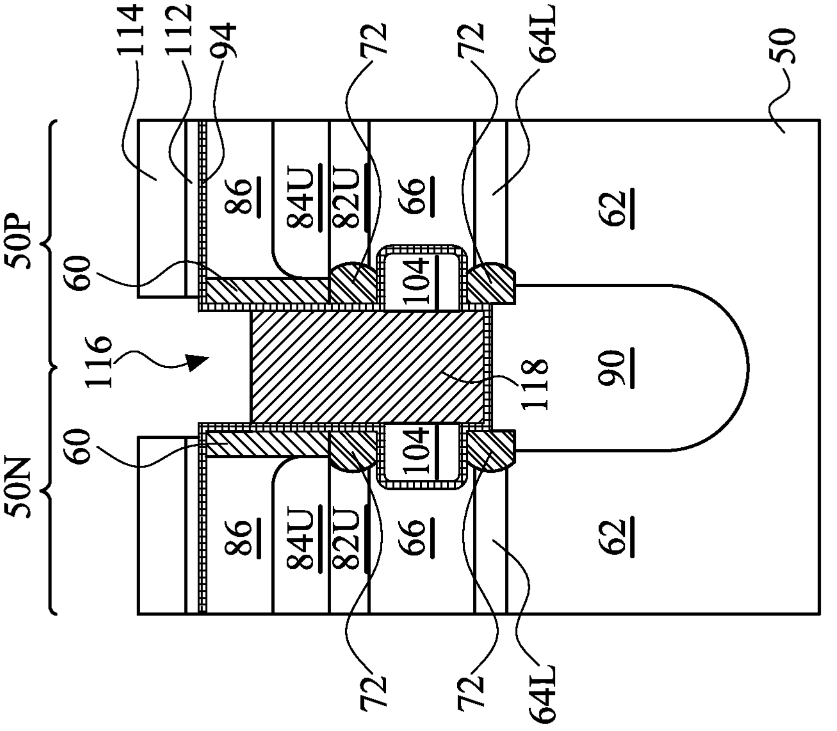

In FIGS. 19A-19B, the top surfaces of the gate contacts 118 are recessed from the top surface of the first ILD 114. Recessing the gate contacts 118 removes upper portions of the gate contacts 118 from the contact openings 116. The gate contacts 118 are recessed such that the outer sidewalls of the gate dielectric layer 94 are exposed. The gate contacts 118 may be recessed using any acceptable etching process, such as one that is selective to the gate contacts 118 (e.g., selectively etches the material of the gate contacts 118 at a faster rate than the material of the first ILD 114). Timed etching processes may be used to stop the etching of the gate contacts 118 after the gate contacts 118 have been recessed a desired distance. The top surfaces of the gate contacts 118 are disposed above the top surfaces of the gate electrodes 104 after the gate contacts 118 are recessed. In this embodiment, the gate dielectric layer 94 is not recessed, and as a result, the contact openings 116 expose the outer sidewalls of the gate dielectric layer 94 after the gate contacts 118 are recessed. In another embodiment (subsequently described for FIGS. 33A-35B), the gate dielectric layer 94 is recessed after the gate contacts 118 are recessed.

Figure 20B:
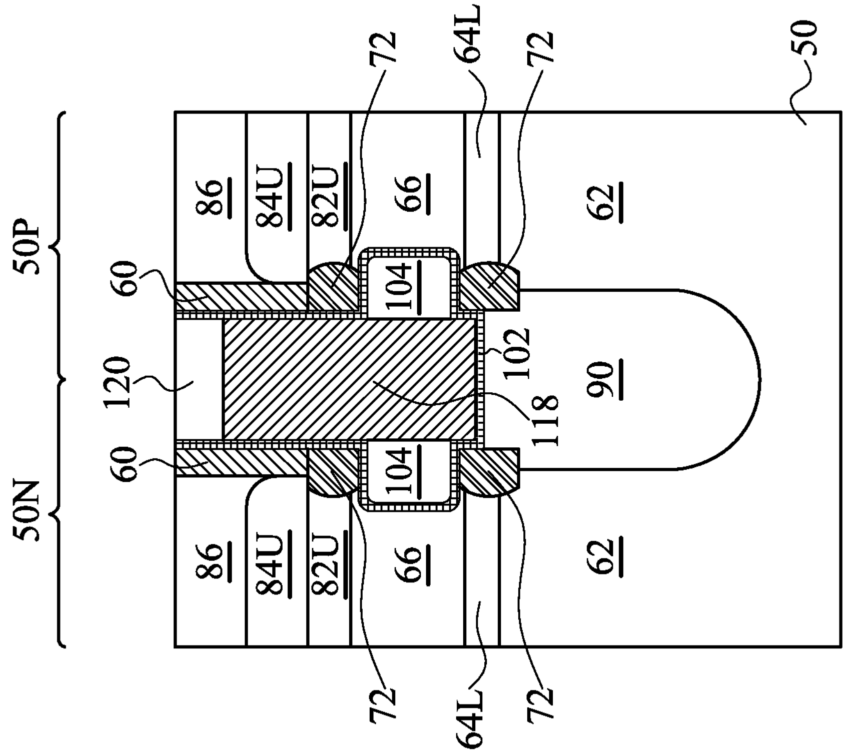
Figure 20A:
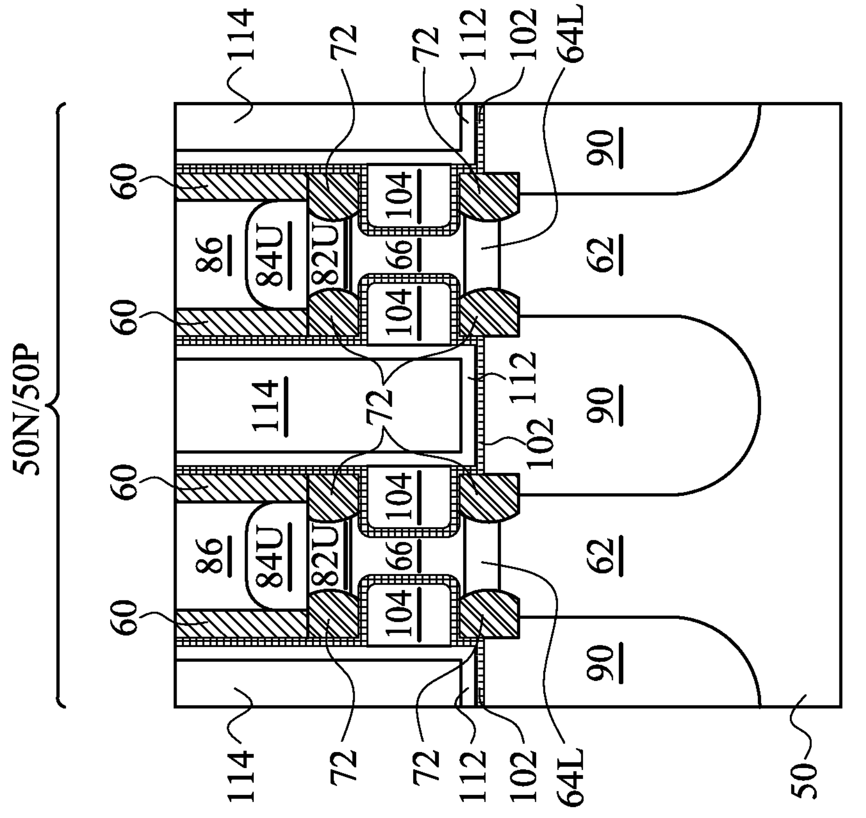

In FIGS. 20A-20B, gate contact masks 120 are formed over the gate contacts 118. Specifically, the gate contact masks 120 are formed in the portions of the contact openings 116 from which the upper portions of the gate contacts 118 were removed. In this embodiment where the gate dielectric layer 94 is not recessed after the gate contacts 118 are recessed, the gate contact masks 120 extend along the outer sidewalls of the gate dielectric layer 94.

As an example to form the gate contact masks 120, one or more dielectric material(s) may be conformally deposited in the contact openings 116. The dielectric material(s) may also be deposited on the top surfaces of the first ILD 114. Acceptable dielectric materials may include silicon nitride, silicon carbonitride, silicon oxynitride, silicon oxycarbonitride, or the like, which may be formed by a conformal deposition process such as chemical vapor deposition (CVD), atomic layer deposition (ALD), or the like. Other dielectric materials formed by any acceptable process may be used. A removal process is performed to remove the excess portions of the dielectric material(s), which excess portions are over the top surfaces of the first ILD 114. In some embodiments, a planarization process such as a chemical mechanical polish (CMP), an etch-back process, combinations thereof, or the like is utilized. The dielectric material(s), after the removal process, have portions left in the contact openings 116 (thus forming the gate contact masks 120).

Additionally, a removal process is performed to form gate dielectrics 102 and to level the top surfaces of the gate contact masks 120 with the top surfaces of the first ILD 114, the gate dielectrics 102, the source/drain masks 86, and the first spacers 60. In some embodiments, a planarization process such as a chemical mechanical polish (CMP), an etch-back process, combinations thereof, or the like may be utilized. After the planarization process, the top surfaces of the gate contact masks 120, the first ILD 114, the gate dielectrics 102, the source/drain masks 86, and the first spacers 60 are substantially coplanar (within process variations). Accordingly, the top surfaces of the source/drain masks 86 (if present) are exposed through the first ILD 114. In some embodiments, the same removal process is used to form gate dielectrics 102 and to form the gate contact masks 120.

The gate contacts 118 are adjacent the resulting gate structures (including the gate dielectrics 102 and the gate electrodes 104). The gate electrodes 104 are disposed between the gate dielectrics 102 and portions of the gate contacts 118. Additionally, the gate dielectrics 102 are disposed between portions of the gate contacts 118 and the first spacers 60 and the gate spacers 72. As a result of forming the gate electrodes 104 with the previously-described etch-back process, the outer sidewalls of the gate electrodes 104 are aligned with the outer sidewalls of the gate dielectrics 102. The gate contacts 118 extend along and physically contact the outer sidewalls of the gate electrodes 104 and the outer sidewalls of the gate dielectrics 102. The gate contacts 118 also extend along the outer sidewalls of the gate spacers 72 and the outer sidewalls of the first spacers 60.

Figure 21B:
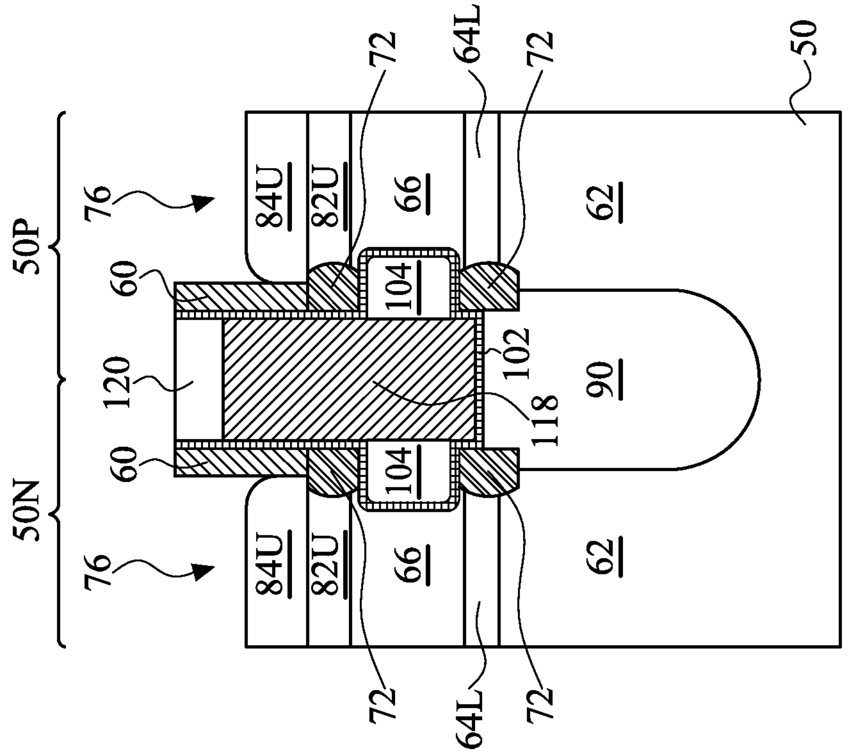
Figure 21A:
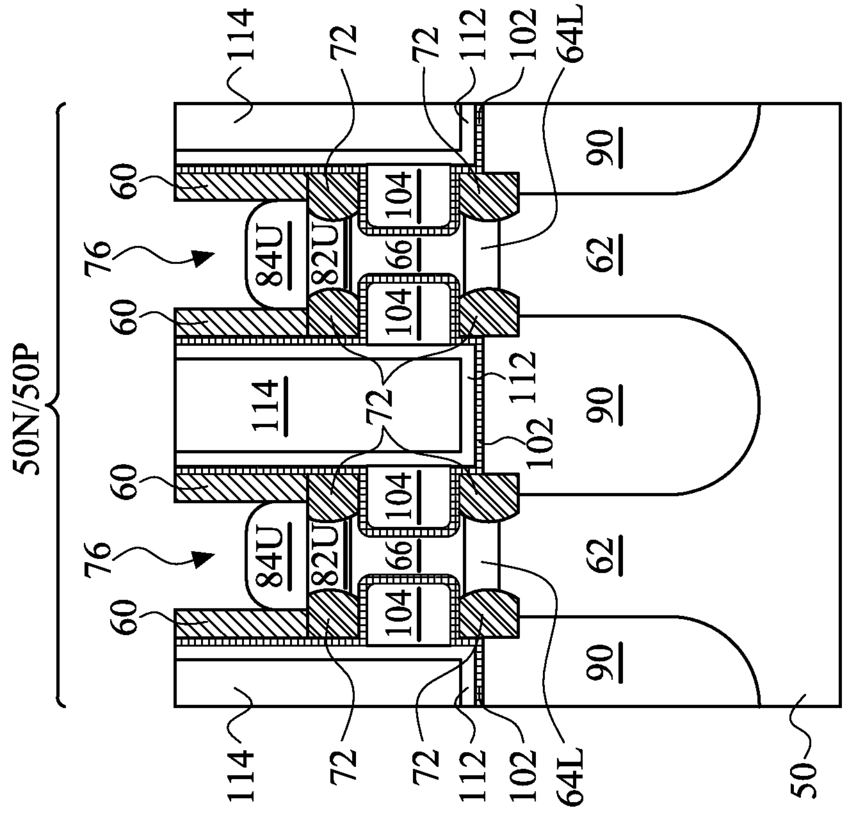

In FIGS. 21A-21B, the source/drain masks 86 are removed from the upper source/drain recesses 76 to expose the upper source/drain regions 84U. The source/drain masks 86 may be removed using any acceptable etching process, such as one that is selective to the source/drain masks 86 (e.g., selectively etches the material of the source/drain masks 86 at a faster rate than the materials of the gate contact masks 120, the first ILD 114, the gate dielectrics 102, and the first spacers 60).

Figure 22B:
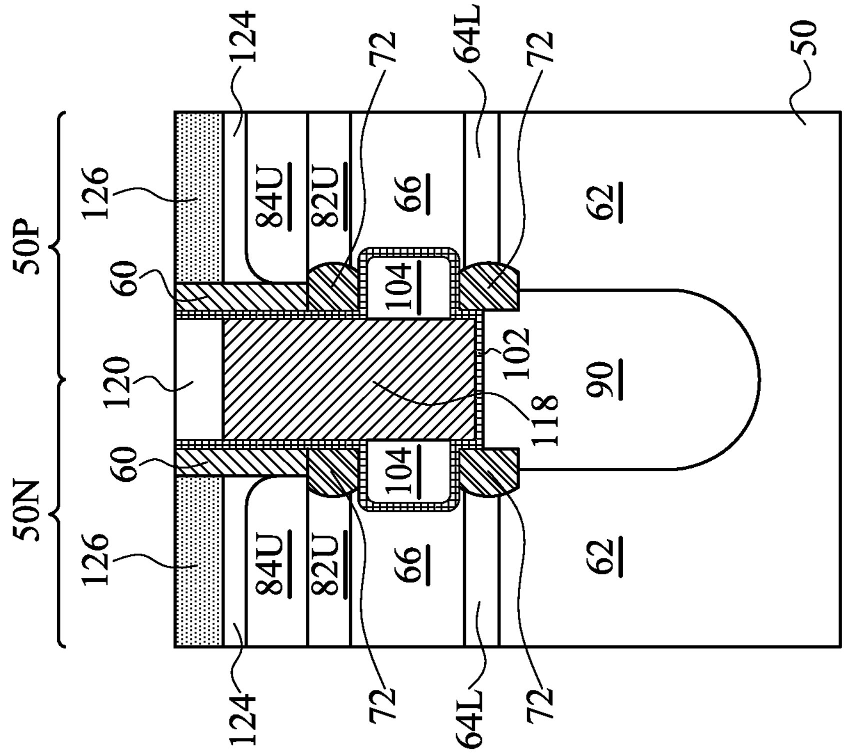
Figure 22A:
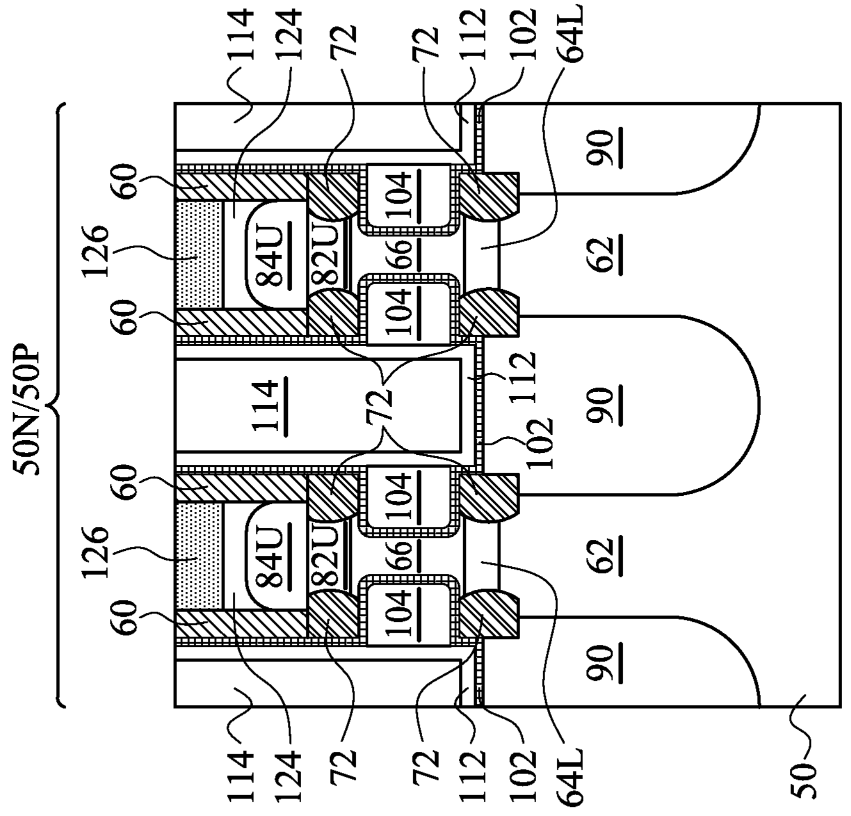

In FIGS. 22A-22B, conductive pads 126 are formed in the upper source/drain recesses 76. The conductive pads 126 may be physically and electrically coupled to the upper source/drain regions 84U. As an example to form the conductive pads 126, a liner (not separately illustrated), such as a diffusion barrier layer, an adhesion layer, or the like, and a conductive material may be formed in the upper source/drain recesses 76. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from the top surfaces of the gate contact masks 120 and the first ILD 114. The remaining liner and conductive material form the conductive pads 126 in the upper source/drain recesses 76. After the planarization process, the top surfaces of the conductive pads 126, the gate contact masks 120, the first ILD 114, the gate dielectrics 102, and the first spacers 60 are substantially coplanar (within process variations).

Optionally, metal-semiconductor alloy regions 124 are formed on the upper source/drain regions 84U. The metal-semiconductor alloy regions 124 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon-germanide regions formed of both a metal silicide and a metal germanide, or the like. The metal-semiconductor alloy regions 124 may be formed before the conductive pads 126, by depositing a metal in the upper source/drain recesses 76 and then performing a thermal annealing process. The metal can be any metal capable of reacting with the semiconductor materials (e.g., silicon, carbon-doped silicon, silicon-germanium, germanium, etc.) of the upper source/drain regions 84U to form a low-resistance metal-semiconductor alloy, such as nickel, cobalt, titanium, tantalum, platinum, tungsten, other noble metals, other refractory metals, rare earth metals, or their alloys. The metal may be formed by a deposition process such as ALD, CVD, PVD, or the like. After the thermal annealing process, a cleaning process, such as a wet clean, may be performed to remove any residual metal from the upper source/drain recesses 76, such as from surfaces of the metal-semiconductor alloy regions 124. The conductive pads 126 may be formed on the metal-semiconductor alloy regions 124.

Figure 23B:
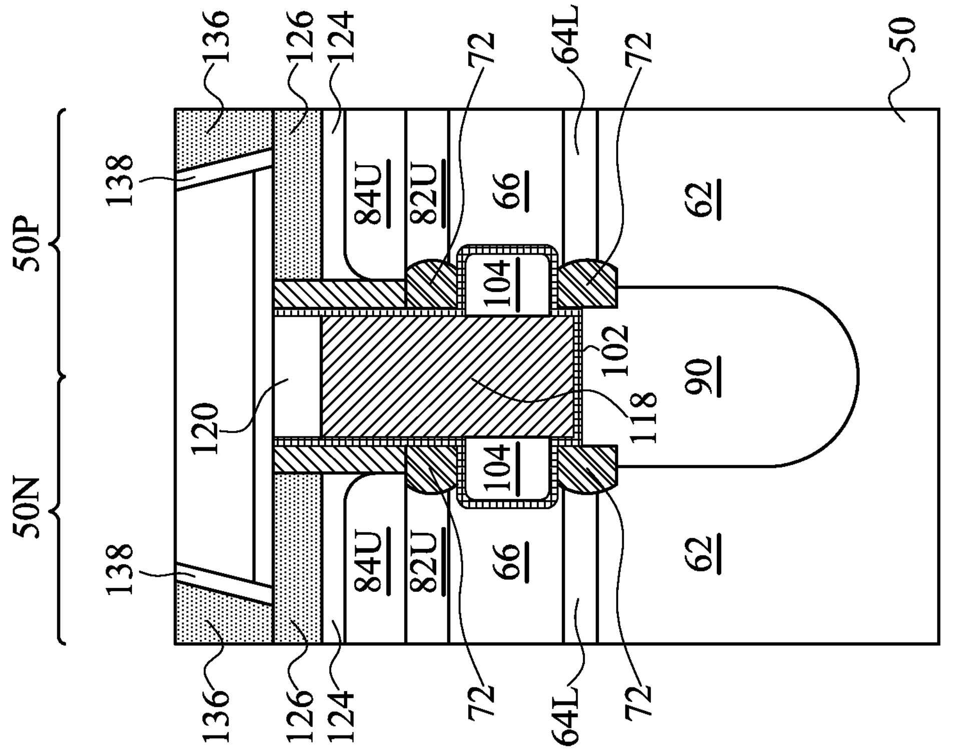
Figure 23A:
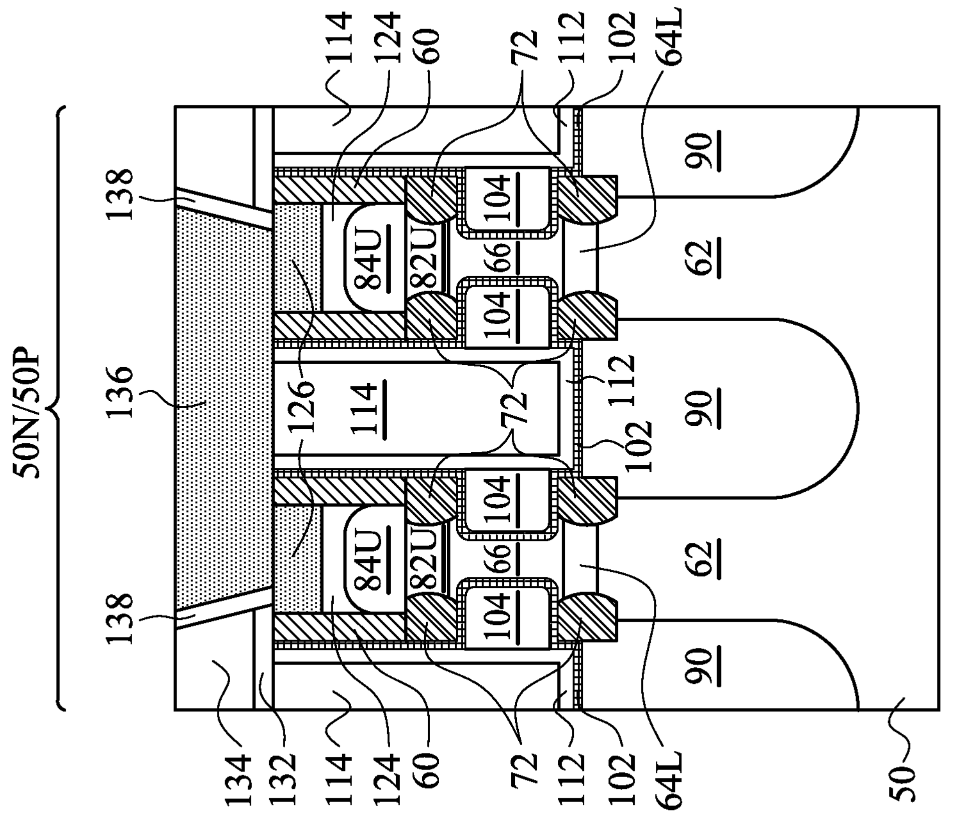

In FIGS. 23A-23B, a second ILD 134 is deposited over the conductive pads 126, the gate contact masks 120, the first ILD 114, the gate dielectrics 102, and the first spacers 60. In some embodiments, the second ILD 134 is a flowable film formed by a flowable CVD method. In some embodiments, the second ILD 134 is formed of a dielectric material such as PSG, BSG, BPSG, USG, or the like, which may be formed by any suitable deposition process, such as CVD, PECVD, or the like.

In some embodiments, an etch stop layer (ESL) 132 is formed between the second ILD 134 and the conductive pads 126, the gate contact masks 120, the first ILD 114, the gate dielectrics 102, and the first spacers 60. The ESL 132 may be formed of a dielectric material having a high etching selectivity to the dielectric material of the second ILD 134, such as silicon nitride, silicon oxide, silicon oxynitride, or the like, which may be formed by any suitable deposition process, such as CVD, ALD, or the like. In this embodiment, the ESL 132 contacts the top surfaces of the gate dielectrics 102.

Source/drain contacts 136 are formed through the second ILD 134 and the ESL 132, to the conductive pads 126. The source/drain contacts 136 may be physically and electrically coupled to the conductive pads 126. As an example to form the source/drain contacts 136, openings for the source/drain contacts 136 are formed through the second ILD 134 and the ESL 132. The openings may be formed using any acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from the top surface of the second ILD 134. The remaining liner and conductive material form the source/drain contacts 136 in the openings.

Optionally, contact spacers 138 may be formed between the source/drain contacts 136 and the second ILD 134. The contact spacers 138 extend around the source/drain contacts 136 in a top-down view (not separately illustrated) and may be circular in the top-down view. The contact spacers 138 may be formed by conformally forming one or more dielectric material(s) in the openings for the source/drain contacts 136 and subsequently etching the dielectric material(s). Acceptable dielectric materials may include silicon oxide, silicon nitride, silicon oxynitride, silicon oxycarbonitride, or the like, which may be formed by a deposition process such as chemical vapor deposition (CVD), atomic layer deposition (ALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the second ILD 134 (thus forming the contact spacers 138).

Figure 24B:
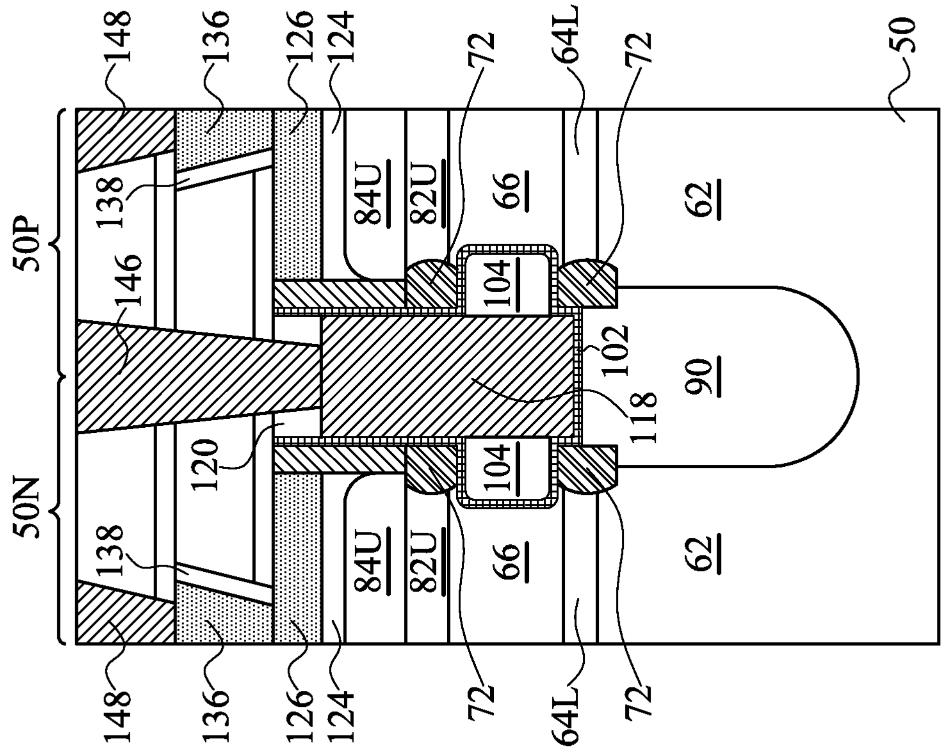
Figure 24A:
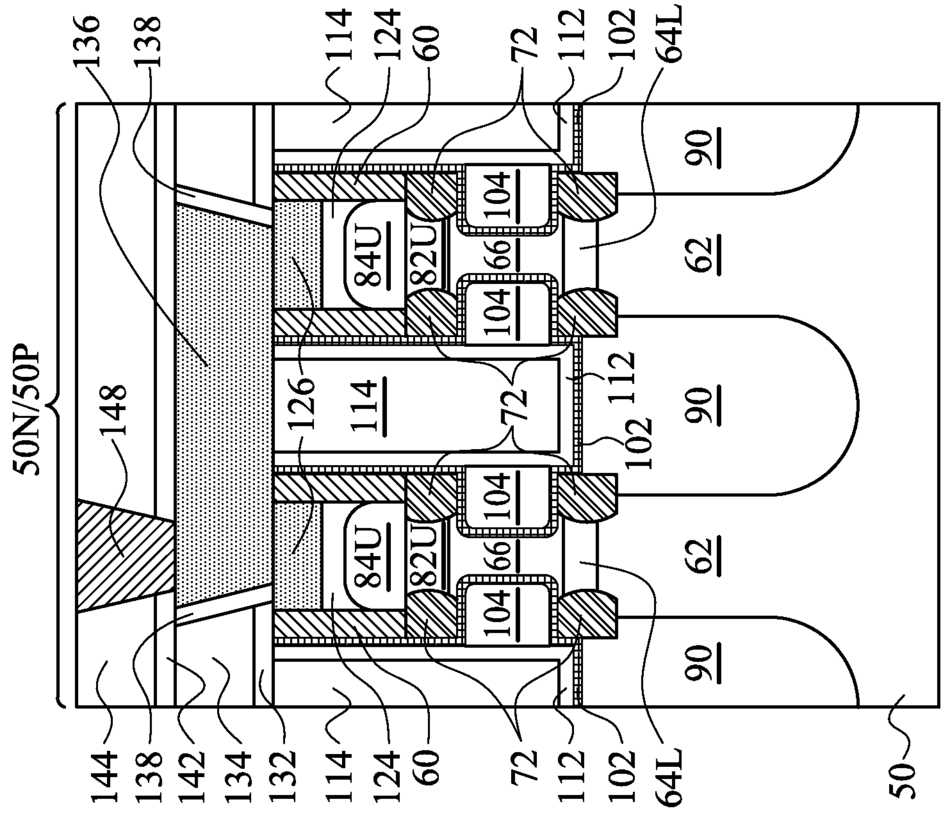

In FIGS. 24A-24B, a third ILD 144 is deposited over the contact spacers 138 (if present), the source/drain contacts 136, and the second ILD 134. In some embodiments, the third ILD 144 is a flowable film formed by a flowable CVD method.

In some embodiments, the third ILD 144 is formed of a dielectric material such as PSG, BSG, BPSG, USG, or the like, which may be formed by any suitable deposition process, such as CVD, PECVD, or the like.

In some embodiments, an ESL 142 is formed between the third ILD 144 and the contact spacers 138 (if present), the source/drain contacts 136, and the second ILD 134. The ESL 142 may be formed of a dielectric material having a high etching selectivity to the dielectric material of the third ILD 144, such as silicon nitride, silicon oxide, silicon oxynitride, or the like, which may be formed by any suitable deposition process, such as CVD, ALD, or the like.

Gate vias 146 and upper source/drain vias 148 are formed, respectively, to the gate contacts 118 and the source/drain contacts 136. The gate vias 146 may be physically and electrically coupled to the gate contacts 118. The upper source/drain vias 148 may be physically and electrically coupled to the source/drain contacts 136.

As an example to form the gate vias 146 and the upper source/drain vias 148, openings for the upper source/drain vias 148 are formed through the third ILD 144 and the ESL 142, and openings for the gate vias 146 are formed through the third ILD 144, the ESL 142, the second ILD 134, the ESL 132, and the gate contact masks 120. The openings may be formed using any acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be cobalt, tungsten, copper, a copper alloy, silver, gold, aluminum, nickel, or the like. A planarization process, such as a CMP, may be performed to remove excess material from the top surface of the third ILD 144. The remaining liner and conductive material form the gate vias 146 and the upper source/drain vias 148 in the openings. The gate vias 146 and the upper source/drain vias 148 may be formed in distinct processes, or may be formed in the same process. Although shown as being formed in the same cross-section, it should be appreciated that each of the gate vias 146 and the upper source/drain vias 148 may be formed in different cross-sections, which may avoid shorting of the contacts.

As subsequently described in greater detail, a first interconnect structure (e.g., a front-side interconnect structure) will be formed over the substrate 50. Some or all of the substrate 50 will then be removed and replaced with a second interconnect structure (e.g., a back-side interconnect structure). Thus, a device layer 140 of active devices is formed between a front-side interconnect structure and a back-side interconnect structure. The front-side and back-side interconnect structures each include conductive features that are connected to the devices of the device layer 140. The conductive features (e.g., interconnects) of the front-side interconnect structure will be connected to front-sides of the upper source/drain regions 84U and the gate electrodes 104 to form functional circuits, such as logic circuits, memory circuits, image sensor circuits, or the like. The lower dummy nanostructures 64L will be replaced with lower source/drain regions, and the conductive features (e.g., power rails) of the back-side interconnect structure will be connected to back-sides of the lower source/drain regions to provide a reference voltage, supply voltage, or the like to the functional circuits.

Figure 25B:
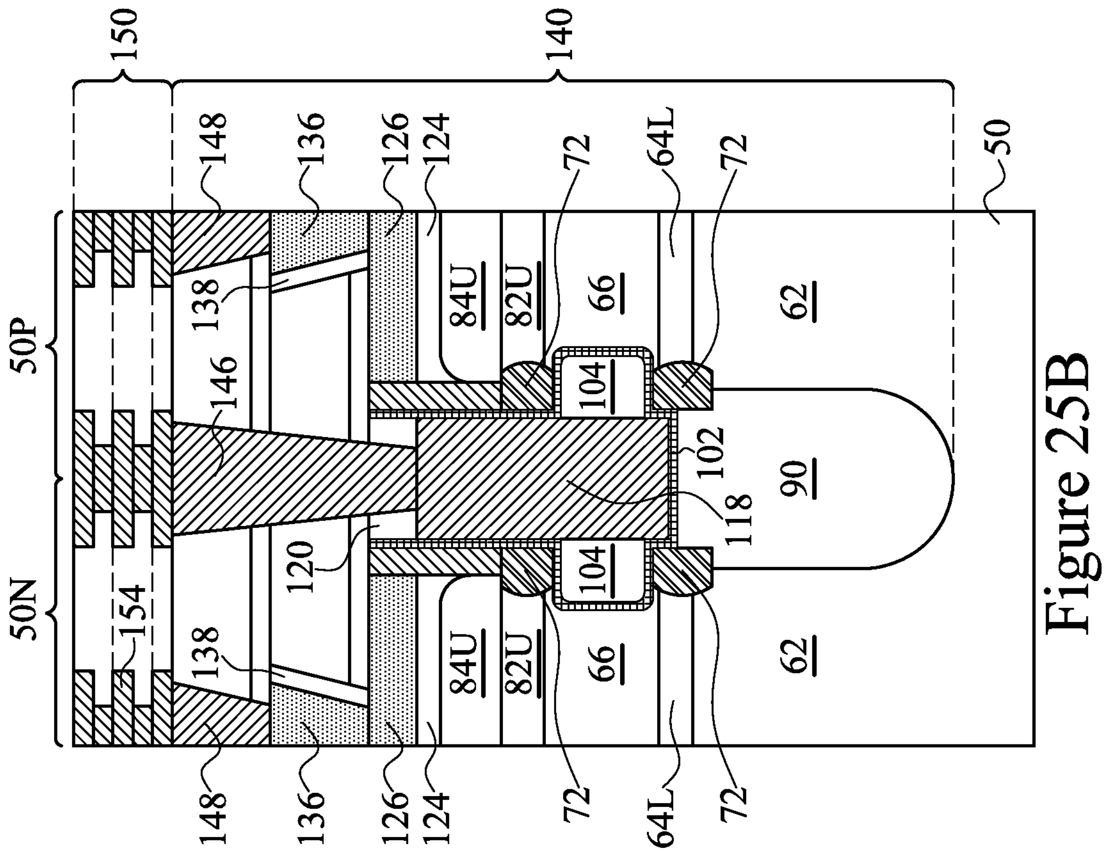
Figure 25A:
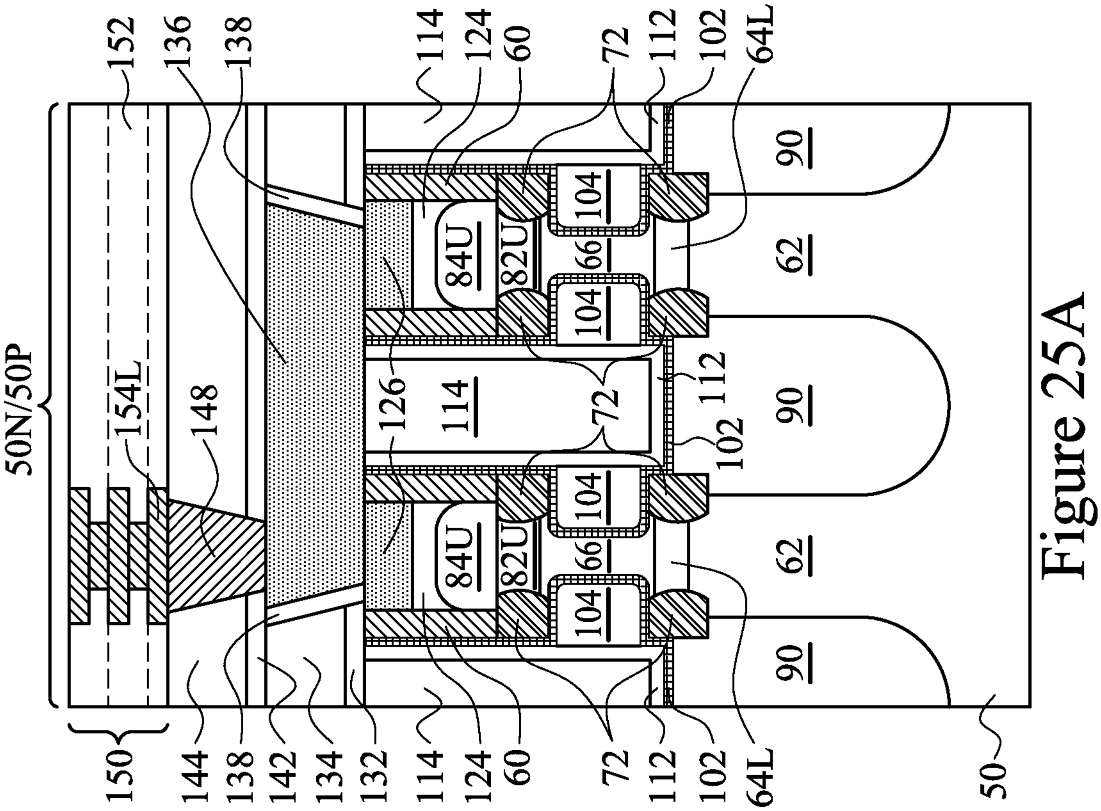

In FIGS. 25A-25B, a front-side interconnect structure 150 is formed on the device layer 140, e.g., over the third ILD 144. The front-side interconnect structure 150 is referred to as a front-side interconnect structure because it is formed at a front-side of the device layer 140 (e.g., a side of the substrate 50 on which the devices are formed). The front-side interconnect structure 150 includes dielectric layers 152 and layers of conductive features 154 in the dielectric layers 152.

The dielectric layers 152 may be formed of a dielectric material. Acceptable dielectric materials include silicon oxide, phosphosilicate glass (PSG), borosilicate glass (BSG), boron-doped phosphosilicate glass (BPSG), or the like, which may be formed by CVD, ALD, or the like. The dielectric layers 152 may be formed of a low-k dielectric material having a k-value lower than about 3.0. The dielectric layers 152 may be formed of an extra-low-k (ELK) dielectric material having a k-value of less than about 2.5.

The conductive features 154 may include conductive lines and vias. The conductive vias may extend through respective ones of the dielectric layers 152 to provide vertical connections between layers of conductive lines. The conductive features 154 may be formed by a damascene process, such as a single damascene process, a dual damascene process, or the like. In a damascene process, a dielectric layer 152 is patterned utilizing photolithography and etching techniques to form trenches and via openings corresponding to the desired pattern of the conductive features 154. The trenches and via openings may then be filled with a conductive material. Suitable conductive materials include copper, aluminum, tungsten, cobalt, gold, combinations thereof, or the like, which may be formed by electroplating or the like.

The front-side interconnect structure 150 includes any desired number of layers of the conductive features 154. The conductive features 154 are connected to features of the underlying devices (e.g., the upper source/drain regions 84U and the gate electrodes 104) through the gate contacts 118, the source/drain contacts 136, the gate vias 146, and the upper source/drain vias 148 to form functional circuits. Thus, the conductive features 154 interconnect the devices of the device layer 140.

After the front-side interconnect structure 150 is formed, a support substrate (not separately illustrated) may be bonded to a top surface of the front-side interconnect structure 150. The support substrate may be a glass support substrate, a ceramic support substrate, a semiconductor substrate (e.g., a silicon substrate), a wafer (e.g., a silicon wafer), or the like, bonded to the front-side interconnect structure 150 by dielectric-to-dielectric bonds or the like. The support substrate may provide structural support during subsequent processing steps and in the completed device. After the support substrate is bonded to the front-side interconnect structure 150, the intermediate structure is flipped so that the back-side of the device layer 140 may be processed. The back-side of the device layer 140 refers to the side opposite to the front-side of the device layer 140 on which the front-side interconnect structure 150 is formed.

Figure 26B:
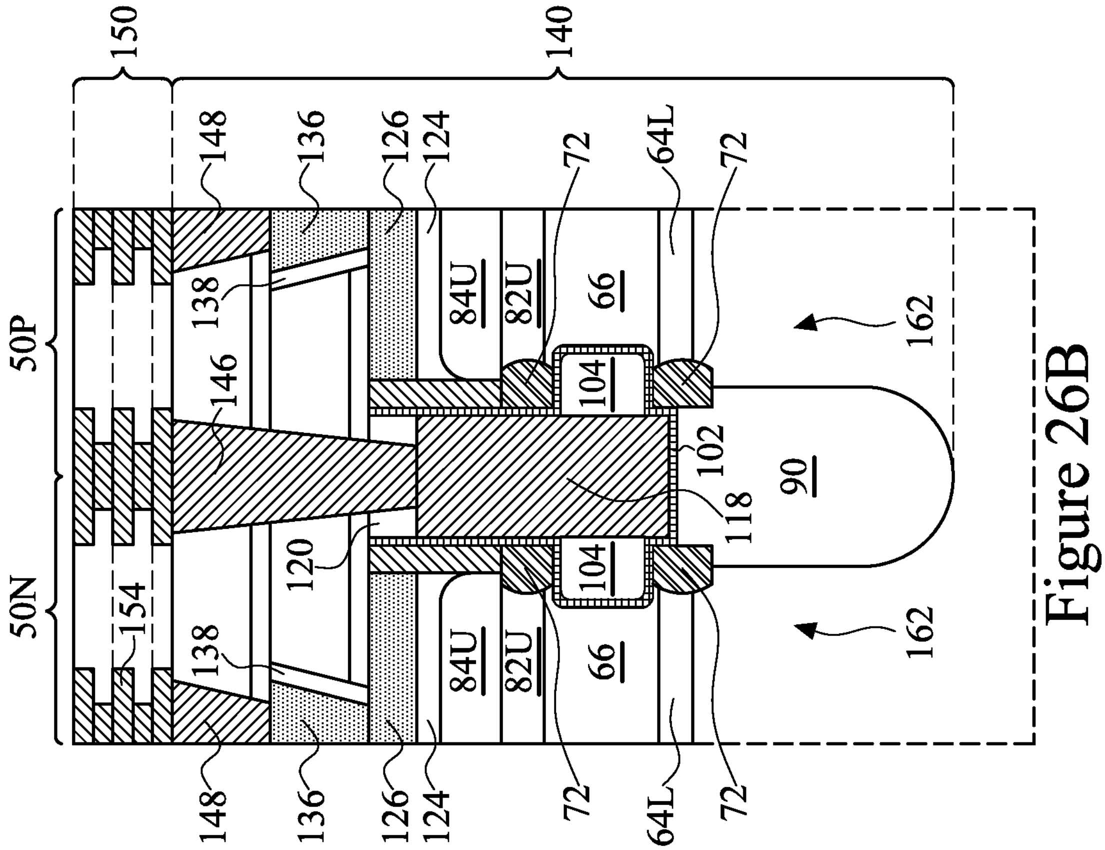
Figure 26A:
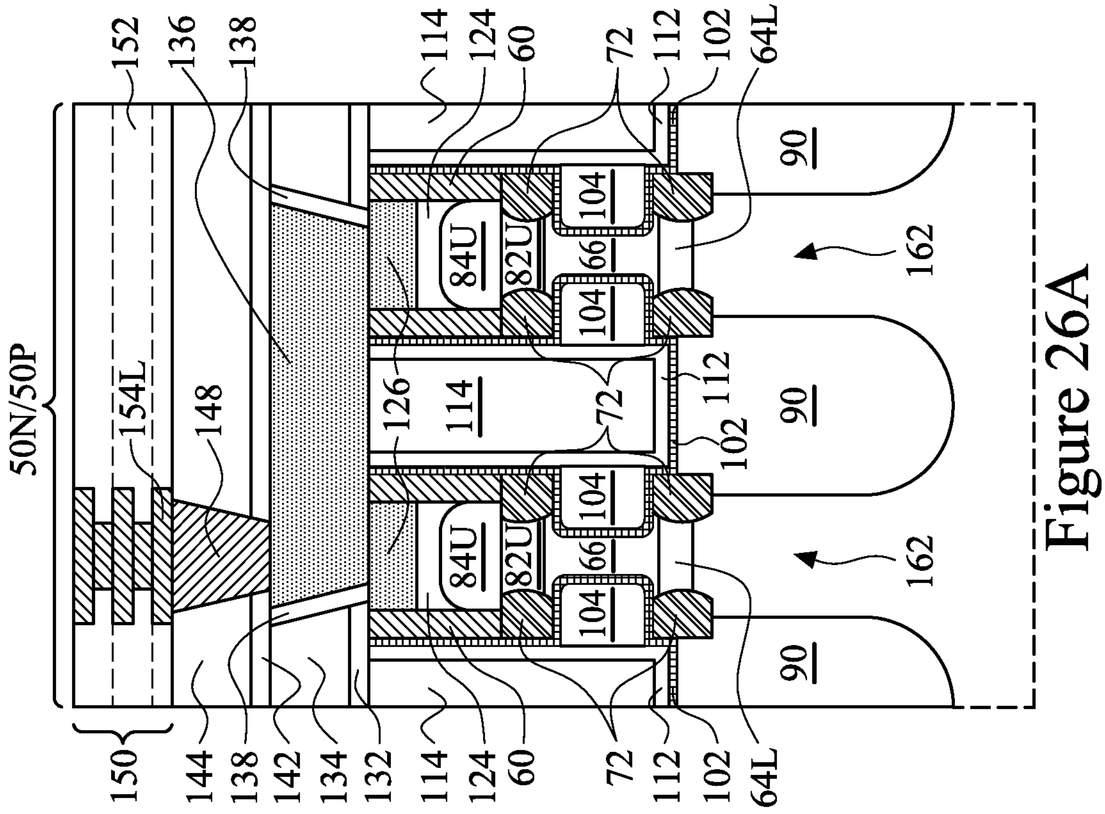

In FIGS. 26A-26B, the substrate 50 and the fins 62 are removed to form lower source/drain recesses 162 exposing the lower dummy nanostructures 64L. The lower source/drain recesses 162 extend through the isolation regions 90. In some embodiments, a planarization process such as a chemical mechanical polish (CMP), an etching process, combinations thereof, or the like is utilized. For example, the substrate 50 may be removed by a planarization process to expose the isolation regions 90. Subsequently, the fins 62 may be removed with an etching process that is selective to the fins 62 (e.g., selectively etches the material of the fins 62 at a faster rate than the materials of the dummy nanostructures 64 and the isolation regions 90). During the removal, the lower dummy nanostructures 64L may be used as etch stop layers when the fins 62 are etched.

Figure 27B:
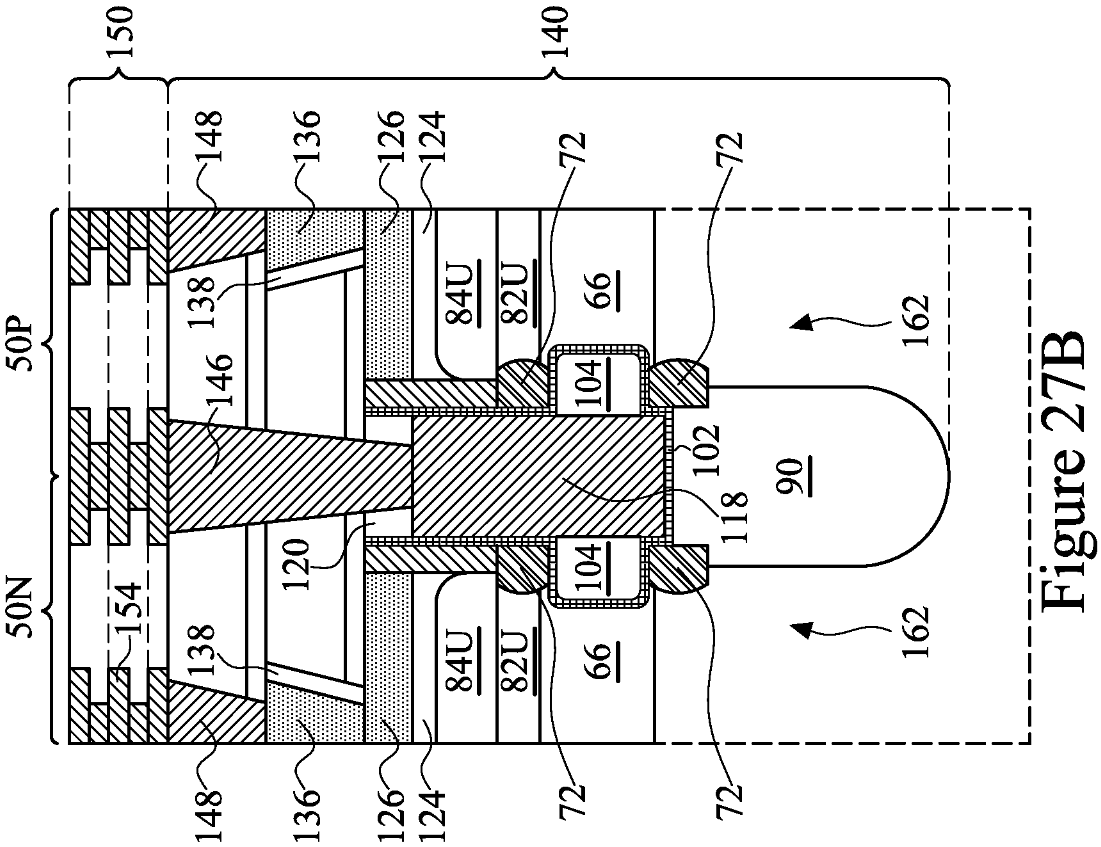
Figure 27A:
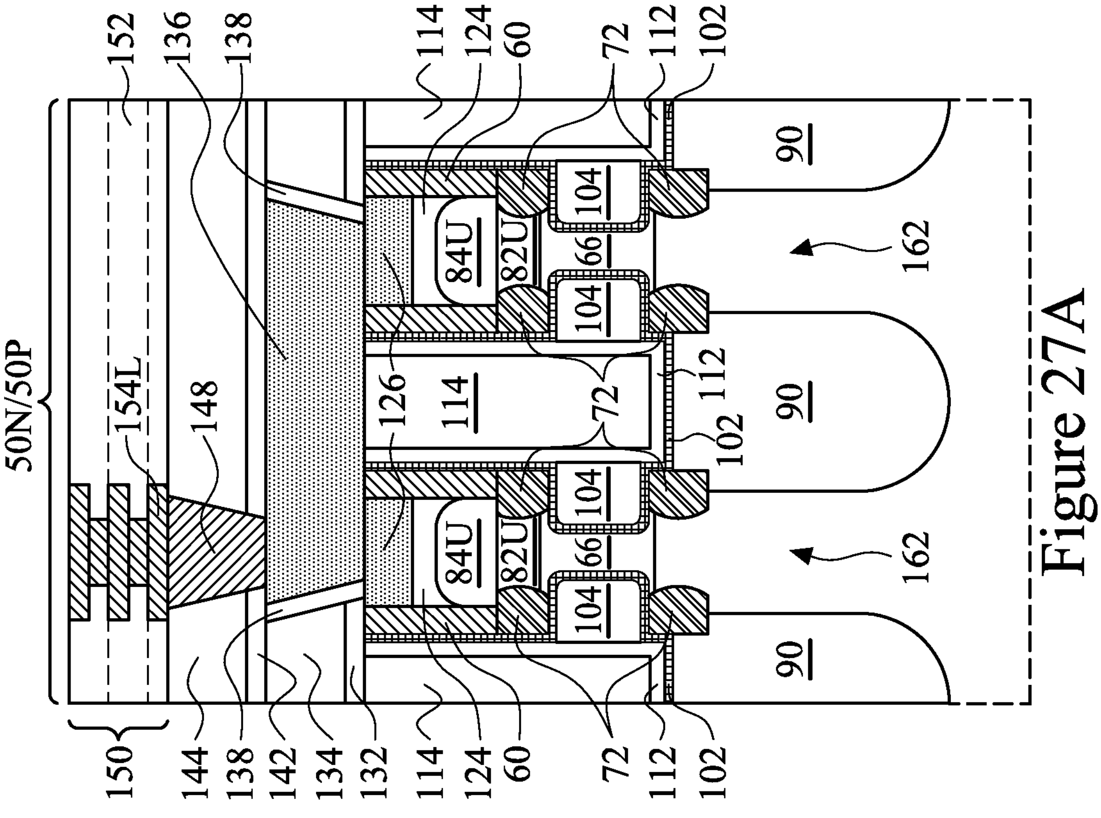

In FIGS. 27A-27B, the remaining portions of the lower dummy nanostructures 64L are removed to extend the lower source/drain recesses 162. Accordingly, the lower source/drain recesses 162 expose the semiconductor nanostructures 66. The remaining portions of the lower dummy nanostructures 64L can be removed by any acceptable etch process, such as one that is selective to the lower dummy nanostructures 64L (e.g., selectively etches the material of the dummy nanostructures 64 at a faster rate than the material of the semiconductor nanostructures 66). The etching may be isotropic.

Figure 28B:
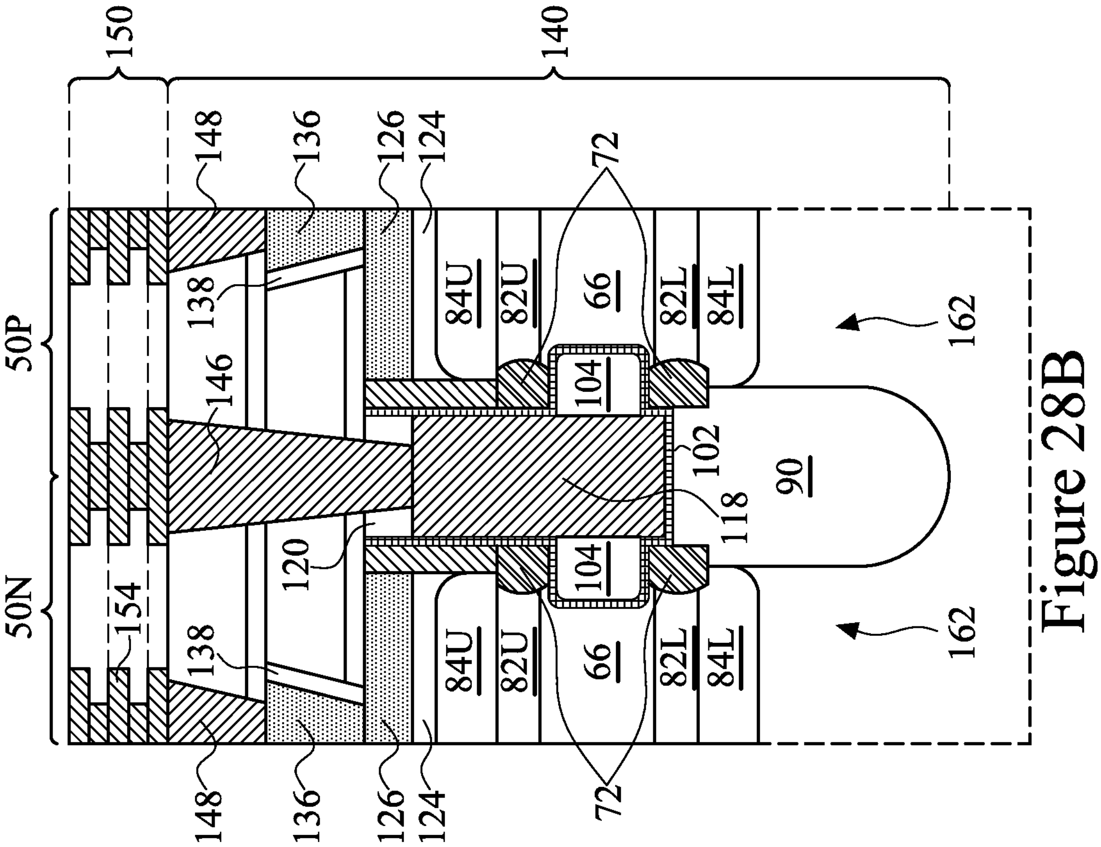
Figure 28A:
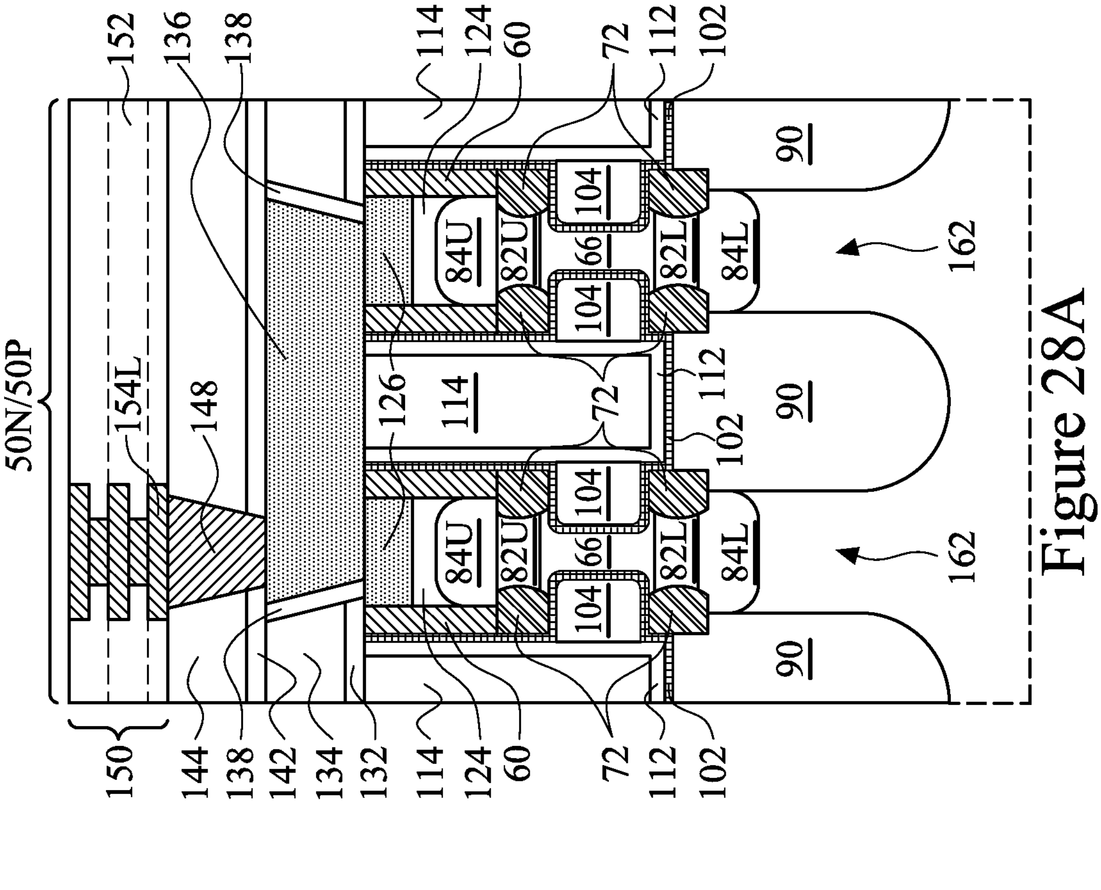

In FIGS. 28A-28B, lower source/drain regions 84L are formed in the lower source/drain recesses 162. In some embodiments, the gate spacers 72 are used to separate the lower source/drain regions 84L from the semiconductor nanostructures 66 by an appropriate lateral distance so that the lower source/drain regions 84L do not short out with subsequently formed gates of the resulting nanostructure-FETs. The lower source/drain regions 84L may be epitaxially grown in a similar manner to the upper source/drain regions 84U, e.g., using appropriate masking steps to form the lower source/drain regions 84L in the p-type region 50P of acceptable material appropriate for p-type nanostructure-FETs (previously described) and to form the lower source/drain regions 84L in the n-type region 50N of acceptable material appropriate for n-type nanostructure-FETs (previously described). The lower source/drain regions 84L may be implanted with appropriate type (e.g., n-type or p-type) dopants to form source/drain regions, followed by an anneal. The n-type and/or p-type dopants for source/drain regions may be any of the previously described dopants. The source/drain regions may have a dopant concentration of between $10^{19}$ atoms/cm$^3$ and $10^{21}$ atoms/cm$^3$. In some embodiments, the lower source/drain regions 84L may be in situ doped during growth.

In some embodiments, the source/drain regions 84 (including the lower source/drain regions 84L and the upper source/drain regions 84U) exert stress in the respective channel regions of the semiconductor nanostructures 66, thereby improving performance. The source/drain regions 84 are formed such that each gate electrode 104 is disposed between respective neighboring pairs of the source/drain regions 84.

Optionally, lower LDD regions 82L are formed in the lower source/drain recesses 162. The lower LDD regions 82L are formed on the semiconductor nanostructures 66 and the lower source/drain regions 84L are formed on the lower LDD regions 82L, such that the lower LDD regions 82L are between the lower source/drain regions 84L and the semiconductor nanostructures 66. The lower LDD regions 82L may be epitaxially grown in a similar manner to the upper source/drain regions 84U, e.g., using appropriate masking steps to form the lower LDD regions 82L in the p-type region 50P of acceptable material appropriate for p-type nanostructure-FETs (previously described) and to form the lower LDD regions 82L in the n-type region 50N of acceptable material appropriate for n-type nanostructure-FETs (previously described). The lower LDD regions 82L may be implanted with appropriate type (e.g., n-type or p-type) dopants to form LDD regions, followed by an anneal. The n-type and/or p-type dopants for LDD regions may be any of the previously described dopants. The LDD regions may have a dopant concentration in a range from $10^{15}$ atoms/cm$^3$ to $10^{19}$ atoms/cm$^3$. In some embodiments, the lower LDD regions 82L may be in situ doped during growth.

In this embodiment, the surfaces of the upper LDD regions 82U and the lower LDD regions 82L are aligned with or recessed below the respective surfaces of the gate spacers 72. In another embodiment (subsequently described for FIGS. 36A-36B), the surfaces of the upper LDD regions 82U and/or the lower LDD regions 82L are raised above the respective surfaces of the gate spacers 72.

Figure 29B:
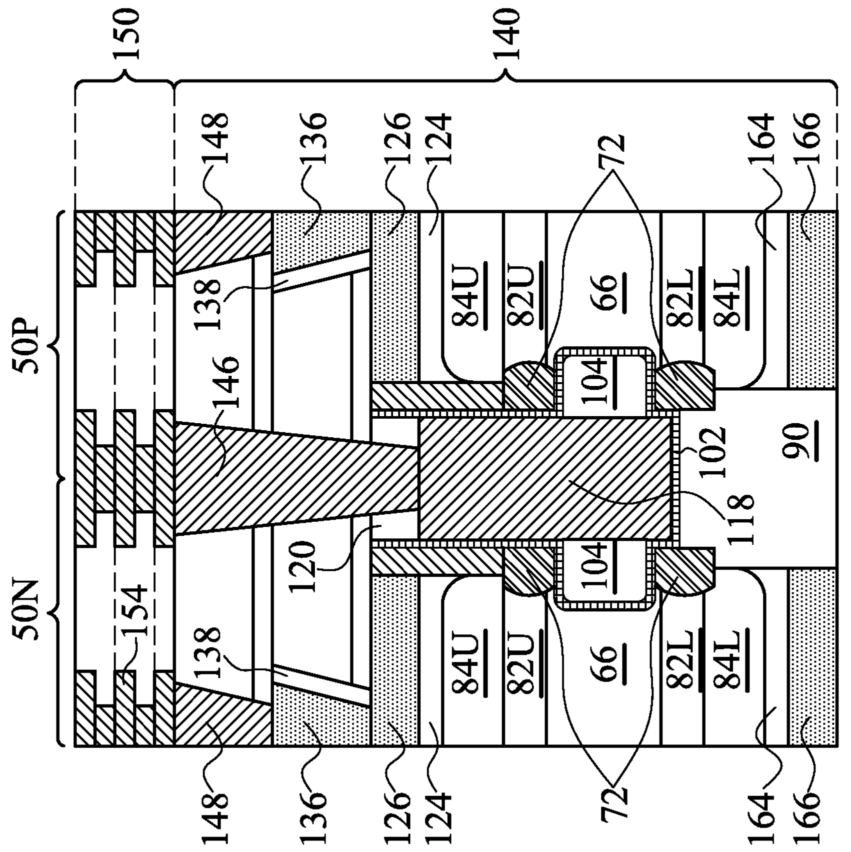
Figure 29A:
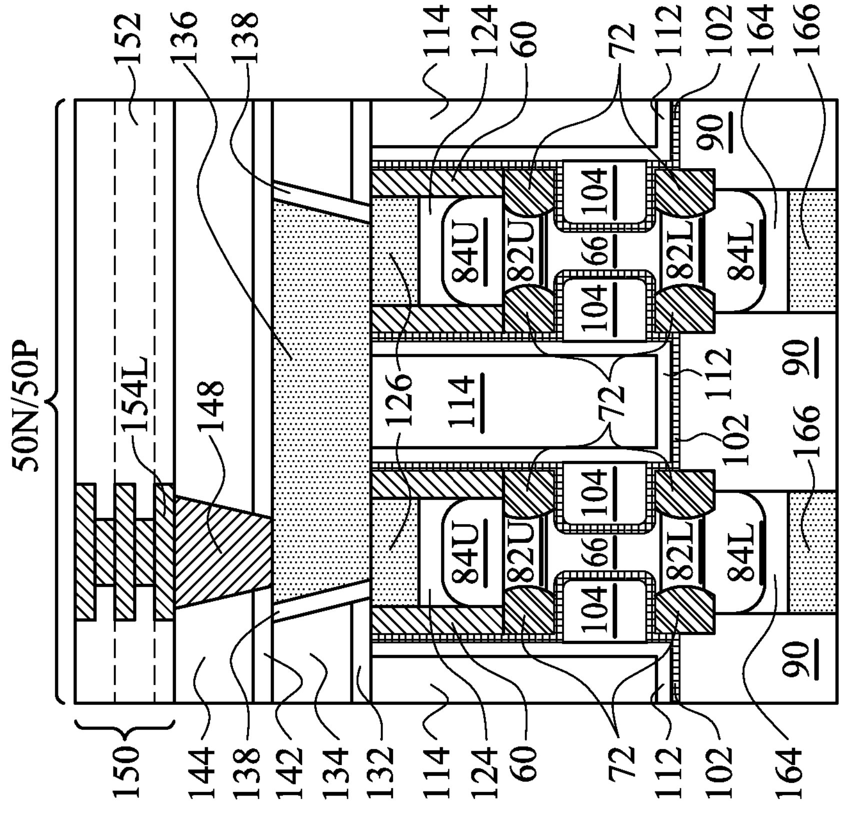

In FIGS. 29A-29B, conductive pads 166 are formed in the lower source/drain recesses 162. The conductive pads 166 may be physically and electrically coupled to the lower source/drain regions 84L. The conductive pads 166 may be formed in a similar manner as previously described for the conductive pads 126. Optionally, metal-semiconductor alloy regions 164 are formed on the lower source/drain regions 84L. The conductive pads 166 may be formed on the metal-semiconductor alloy regions 164. The metal-semiconductor alloy regions 164 may be formed in a similar manner as previously described for the metal-semiconductor alloy regions 124.

Figure 30B:
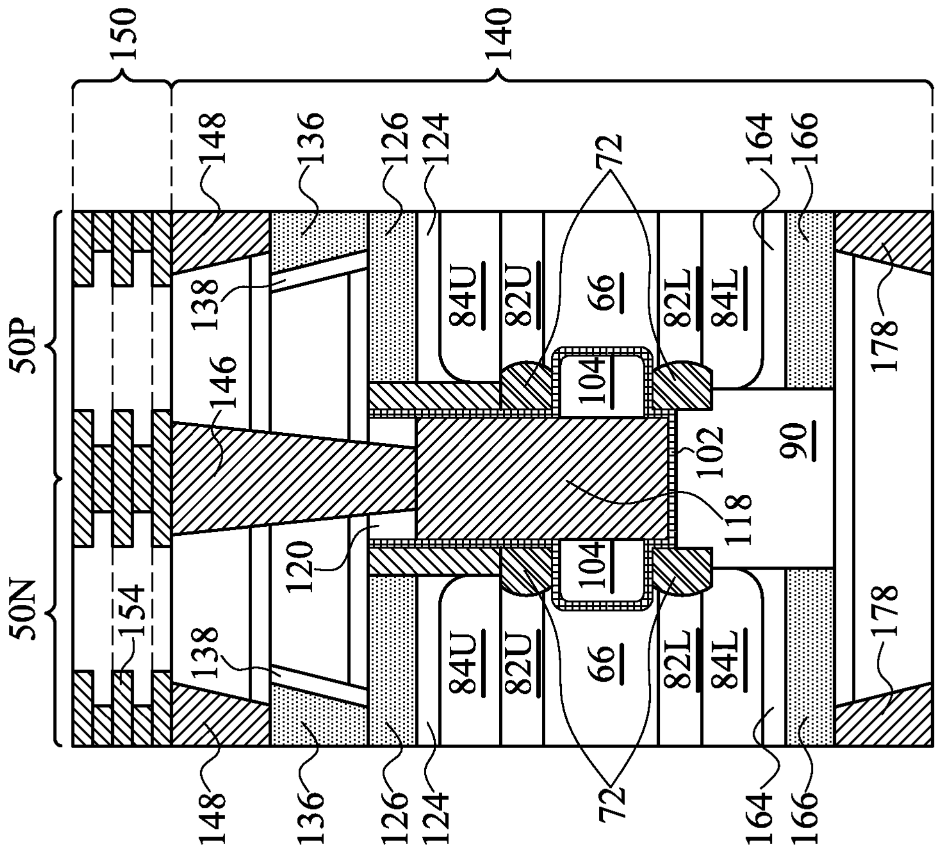
Figure 30A:
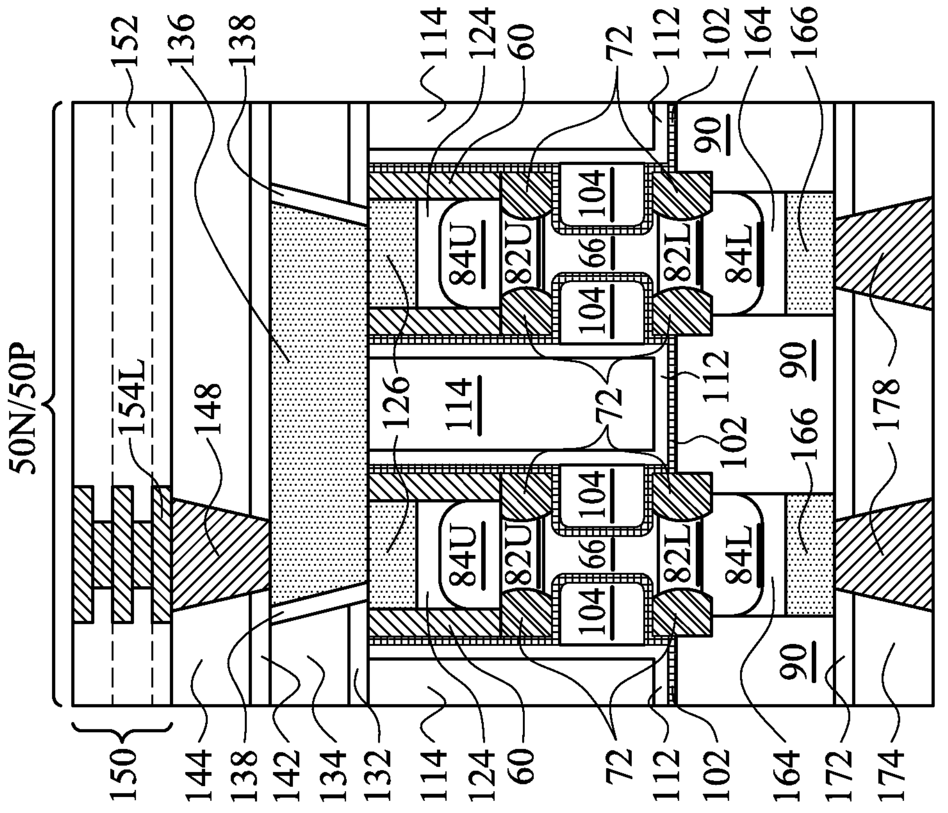

In FIGS. 30A-30B, a fourth ILD 174 is deposited over the conductive pads 166 and the isolation regions 90. In some embodiments, the fourth ILD 174 is a flowable film formed by a flowable CVD method. In some embodiments, the fourth ILD 174 is formed of a dielectric material such as PSG, BSG, BPSG, USG, or the like, which may be formed by any suitable deposition process, such as CVD, PECVD, or the like.

In some embodiments, an ESL 172 is formed between the fourth ILD 174 and the conductive pads 166 and the isolation regions 90. The ESL 172 may be formed of a dielectric material having a high etching selectivity to the dielectric material of the fourth ILD 174, such as silicon nitride, silicon oxide, silicon oxynitride, or the like, which may be formed by any suitable deposition process, such as CVD, ALD, or the like.

Lower source/drain vias 178 are formed through the fourth ILD 174 and the ESL 172, to the conductive pads 166. The lower source/drain vias 178 may be physically and electrically coupled to the conductive pads 166. As an example to form the lower source/drain vias 178, openings for the lower source/drain vias 178 are formed through the fourth ILD 174 and the ESL 172. The openings may be formed using any acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be cobalt, tungsten, copper, a copper alloy, silver, gold, aluminum, nickel, or the like. A planarization process, such as a CMP, may be performed to remove excess material from the bottom surface of the fourth ILD 174. The remaining liner and conductive material form the lower source/drain vias 178 in the openings.

Figure 31B:
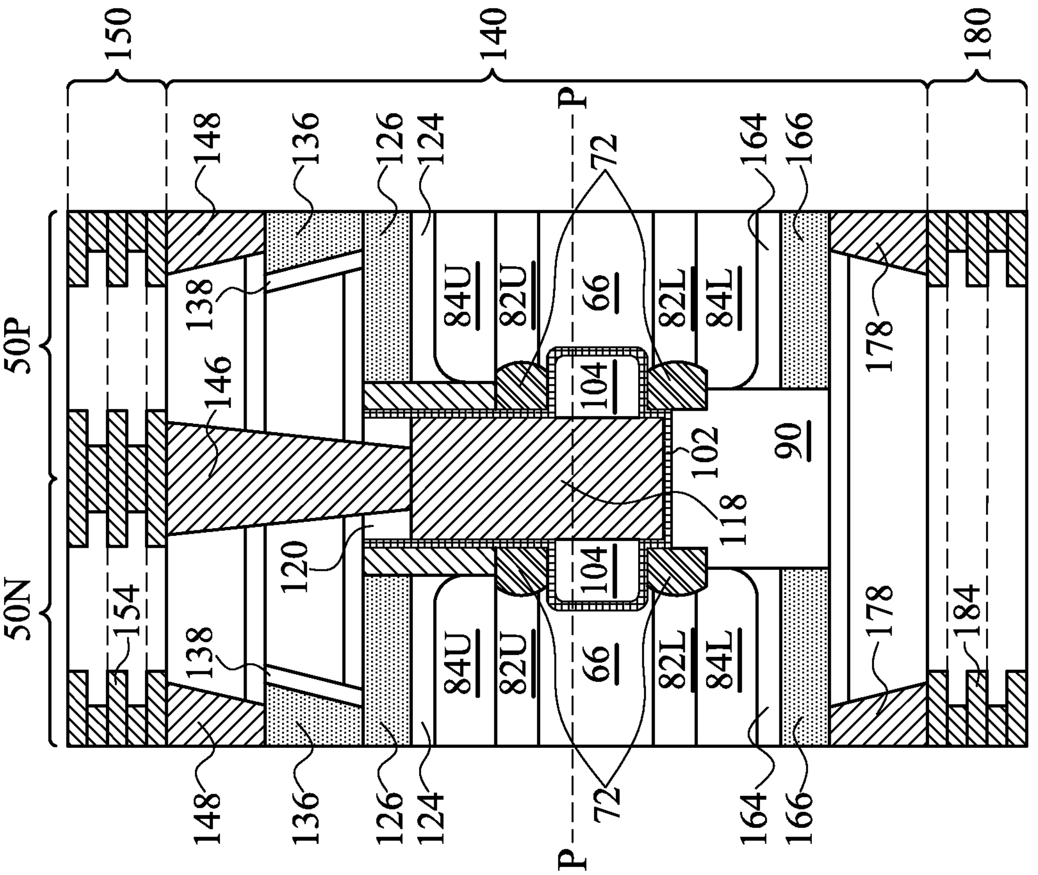
Figure 31A:
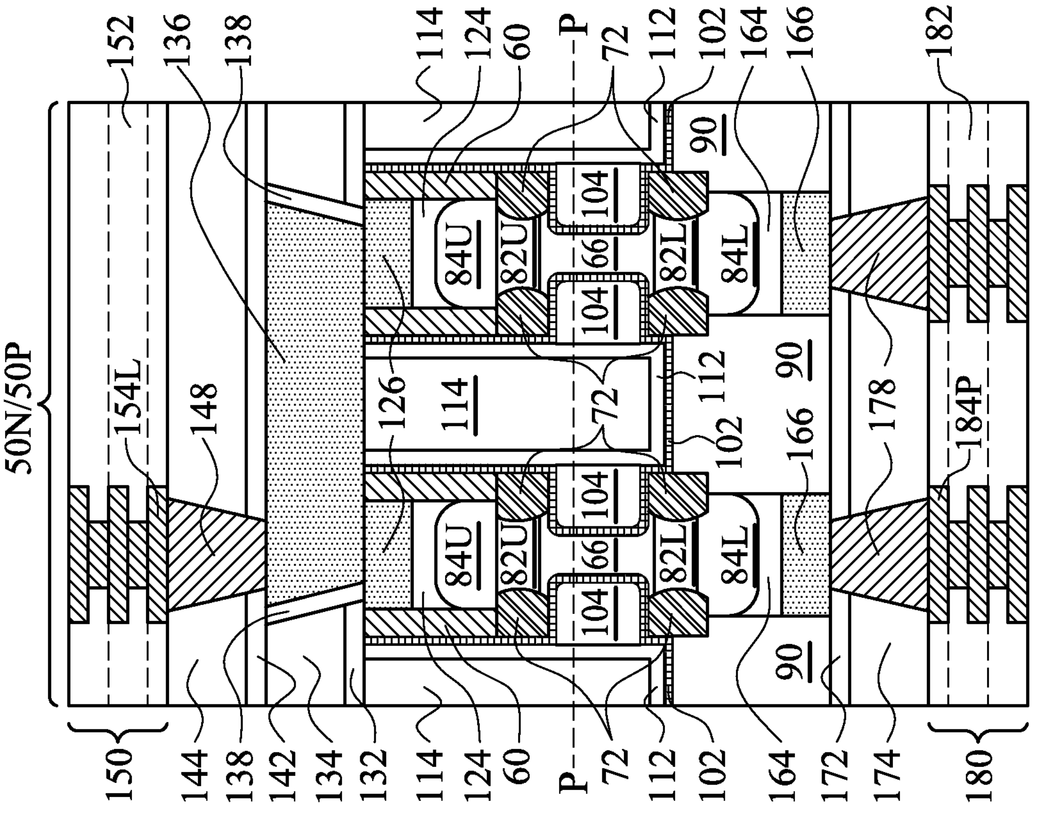

In FIGS. 31A-31B, a back-side interconnect structure 180 is formed on the fourth ILD 174. The back-side interconnect structure 180 is referred to as a back-side interconnect structure because it is formed at the back-side of the device layer 140. The back-side interconnect structure 180 includes dielectric layers 182 and layers of conductive features 184 in the dielectric layers 182.

The dielectric layers 182 may be formed of a dielectric material. Acceptable dielectric materials include silicon oxide, phosphosilicate glass (PSG), borosilicate glass (BSG), boron-doped phosphosilicate glass (BPSG), or the like, which may be formed by CVD, ALD, or the like. The dielectric layers 182 may be formed of a low-k dielectric material having a k-value lower than about 3.0. The dielectric layers 182 may be formed of an extra-low-k (ELK) dielectric material having a k-value of less than about 2.5.

The conductive features 184 may include conductive lines and vias. The conductive vias may extend through respective ones of the dielectric layers 182 to provide vertical connections between layers of conductive lines. The conductive features 184 may be formed by a damascene process, such as a single damascene process, a dual damascene process, or the like. In a damascene process, a dielectric layer 182 is patterned utilizing photolithography and etching techniques to form trenches and via openings corresponding to the desired pattern of the conductive features 184. The trenches and via openings may then be filled with a conductive material. Suitable conductive materials include copper, aluminum, tungsten, cobalt, gold, combinations thereof, or the like, which may be formed by electroplating or the like.

The back-side interconnect structure 180 includes any desired number of layers of the conductive features 184. The conductive features 184 form a power distribution network for the devices of the device layer 140. Some or all of the conductive features 184 are power rails 184P, which are conductive lines that electrically connect the lower source/drain regions 84L to a reference voltage, supply voltage, or the like, through the lower source/drain vias 178. By placing the power rails 184P at a back-side of the device layer 140 rather than at a front-side of the device layer 140, advantages may be achieved. For example, a gate density of the devices of the device layer 140 may be increased. Further, the back-side of the device layer 140 may accommodate wider power rails, reducing resistance and increasing efficiency of power delivery to the devices of the device layer 140. For example, a width of the conductive features 184 may be at least twice a width of a first level conductive line (e.g., conductive line 154L) of the front-side interconnect structure 150.

The semiconductor nanostructures 66 are vertical nanostructures, such that the gate electrodes 104 wrap around the semiconductor nanostructures 66 in a plane P that is perpendicular to a direction extending between the back-side interconnect structure 180 and the front-side interconnect structure 150. The plane P was parallel to the major surface of the substrate 50 (see FIGS. 25A-25B) before the substrate 50 was removed. The gate contacts 118 are between the semiconductor nanostructures 66 in the plane P. Because the semiconductor nanostructures 66 are vertical nanostructures, the distance from the gate electrodes 104 to the source/drain contacts 136 may be increased as compared to horizontal nanostructures. The parasitic capacitance of the nanostructure-FETs may thus be reduced. Additionally, vertical nanostructures may be formed with a smaller pitch than horizontal nanostructures, thereby increasing density of the nanostructure-FETs. For example, the gate length the nanostructure-FETs may be increased without modifying the density of the nanostructure-FETs. In some embodiments, the gate length is in the range of 8 nm to 25 nm. In some embodiments, the gate spacers 72 have a height (measured in the direction extending between the back-side interconnect structure 180 and the front-side interconnect structure 150) in the range of 4 nm to 15 nm. In some embodiments, the gate spacers 72 have a width (measured perpendicular to the direction extending between the back-side interconnect structure 180 and the front-side interconnect structure 150) in the range of 4 nm to 15 nm. Additionally, because the gate electrodes 104 are formed in sidewall recesses of the semiconductor nanostructures 66, the semiconductor nanostructures 66 may have a small width. In some embodiments, the semiconductor nanostructures 66 have a width (measured perpendicular to the direction extending between the back-side interconnect structure 180 and the front-side interconnect structure 150) in the range of 3 nm to 15 nm.

Figure 32:
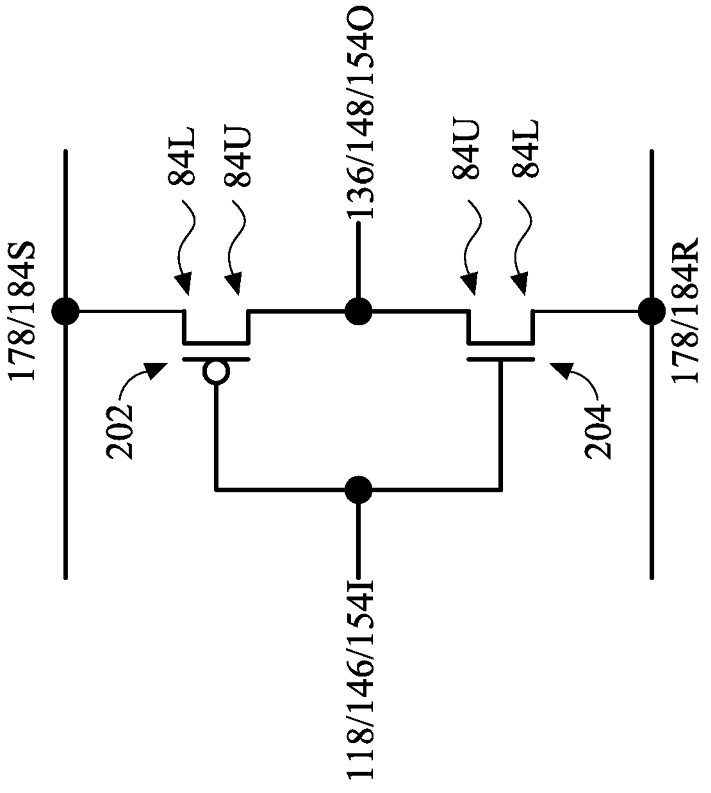
FIG. 32 is a diagram of an example circuit.

FIG. 32 is a diagram of an example circuit that may be formed by interconnecting the devices of the device layer 140. FIG. 32 will be described in conjunction with FIGS. 31A-31B. The example circuit is a CMOS circuit, specifically, a CMOS inverter. The CMOS inverter includes a pull-up transistor 202 and a pull-down transistor 204. A same gate contact 118 is coupled to the gate electrodes 104 of the pull-up transistor 202 and the pull-down transistor 204. The conductive features 154 of the front-side interconnect structure 150 include an input interconnect 154I and an output interconnect 154O. The input interconnect 154I is connected to the gate contact 118 of the pull-up transistor 202 and the pull-down transistor 204 (such as with a gate via 146). The output interconnect 154O is connected to the upper source/drain region 84U of the pull-up transistor 202 and to the upper source/drain region 84U of the pull-down transistor 204 (such as with a shared source/drain contact 136). The input interconnect 154I is the input terminal for the CMOS inverter, and the output interconnect 154O is the output terminal for the CMOS inverter. The conductive features 184 of the back-side interconnect structure 180 include a supply power rail 184S and a reference power rail 184R. The supply power rail 184S is a supply voltage rail connected to the lower source/drain region 84L of the pull-up transistor 202 (such as with a first lower source/drain via 178). The reference power rail 184R is a reference voltage rail connected to the lower source/drain region 84L of the pull-down transistor 204 (such as with a second lower source/drain via 178).

Embodiments may achieve advantages. Forming the gate electrodes 104 so that the outer sidewalls of the gate electrodes 104 are aligned with the outer sidewalls of the gate dielectrics 102 allows a gate contact 118 to be formed between and coupled to multiple gate electrodes 104. Multiple gate electrodes 104 may thus be coupled by a same gate contact 118, which may be advantageous when fabricating some types of circuits, such as CMOS inverters. For example, the gate electrode 104 of a pull-up transistor may be coupled to the gate electrode 104 of a pull-down transistor without utilizing higher-level interconnects of the front-side interconnect structure 150 or the back-side interconnect structure 180. The density of the resulting integrated circuits may thus be improved.

FIGS. 33A-35B are views of intermediate stages in the manufacturing of nanostructure-FETs, in accordance with some other embodiments. This embodiment is similar to that described for FIGS. 2A-31B, except the gate dielectric layer 94 will be recessed after the gate contacts 118 are recessed.

Figure 33A:
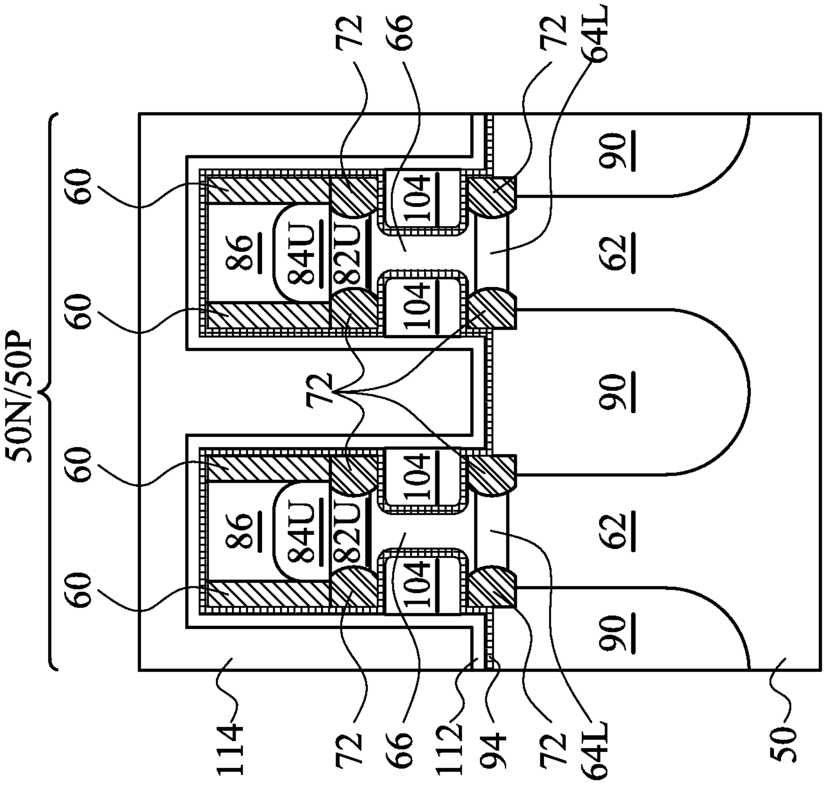
FIGS. 33A-35B are views of intermediate stages in the manufacturing of nanostructure-FETs, in accordance with some embodiments.
Figure 33B:
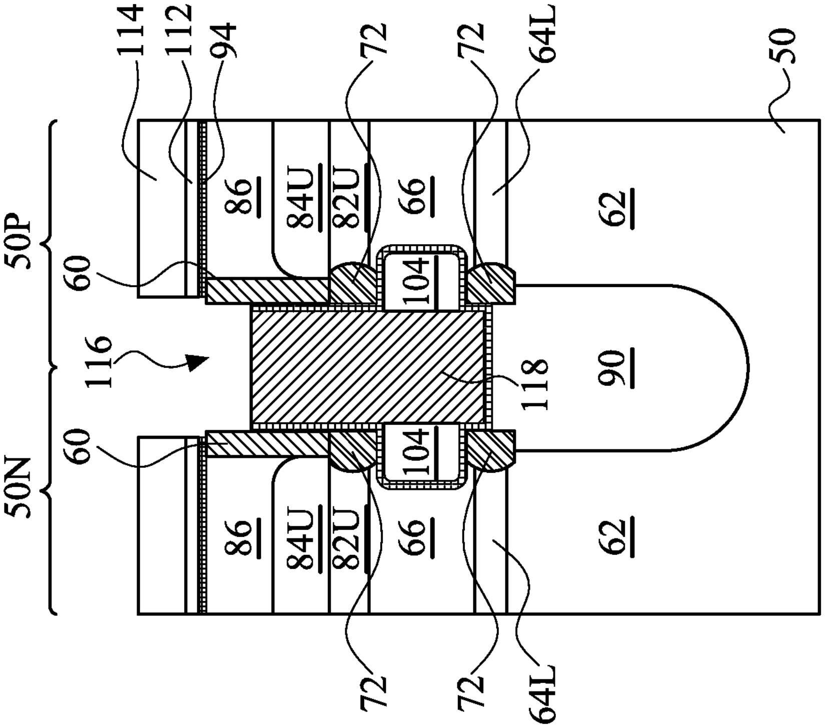

In FIGS. 33A-33B, appropriate steps as previously described are performed to form the structure of FIGS. 19A-19B. After the gate contacts 118 are recessed, the gate dielectric layer 94 is recessed. The gate dielectric layer 94 may be recessed using any acceptable etching process, such as one that is selective to the gate dielectric layer 94 (e.g., selectively etches the material(s) of the gate dielectric layer 94 at a faster rate than the material of the first ILD 114). In this embodiment, the gate contacts 118 may be recessed further than in FIGS. 19A-19B, such that the top surfaces of the gate contacts 118, the gate dielectric layer 94, and the gate spacers 72 are substantially coplanar (within process variations).

Figure 34B:
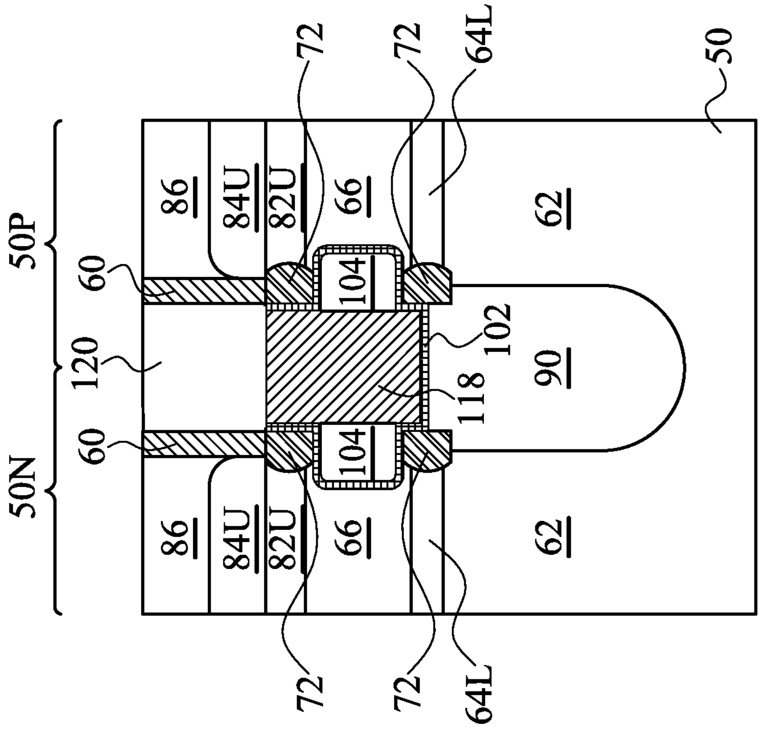
Figure 34A:
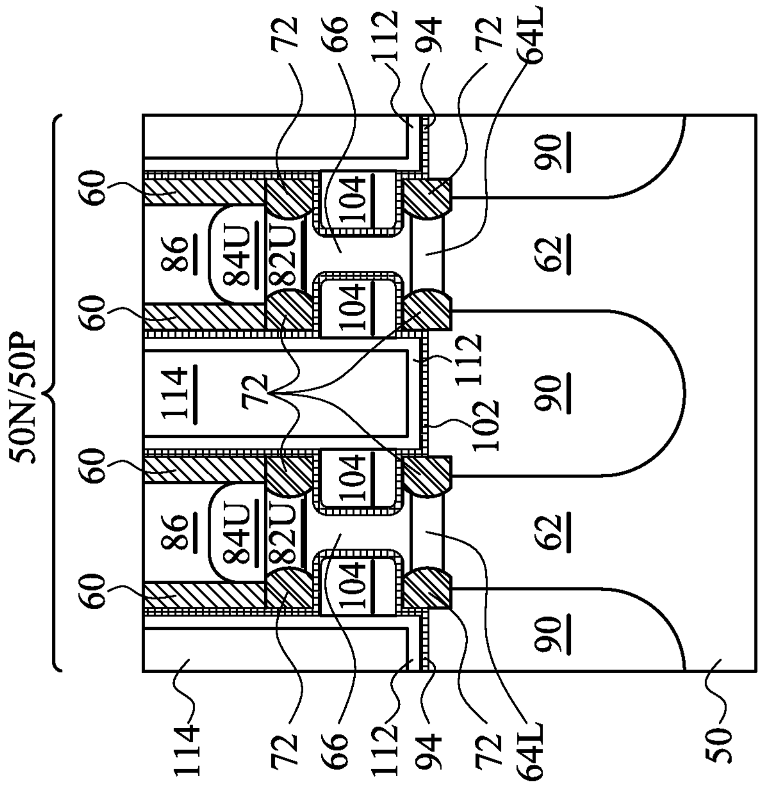

In FIGS. 34A-34B, gate contact masks 120 are formed over the gate contacts 118. The gate contact masks 120 may be formed in a similar manner as previously described for FIGS. 20A-20B. In this embodiment where the gate dielectric layer 94 was recessed after the gate contacts 118 were recessed, the gate contact masks 120 extend along the outer sidewalls of the first spacers 60. Accordingly, the upper surfaces of the gate contact masks 120 are disposed above the upper surfaces of the gate dielectrics 102.

Figure 35A:
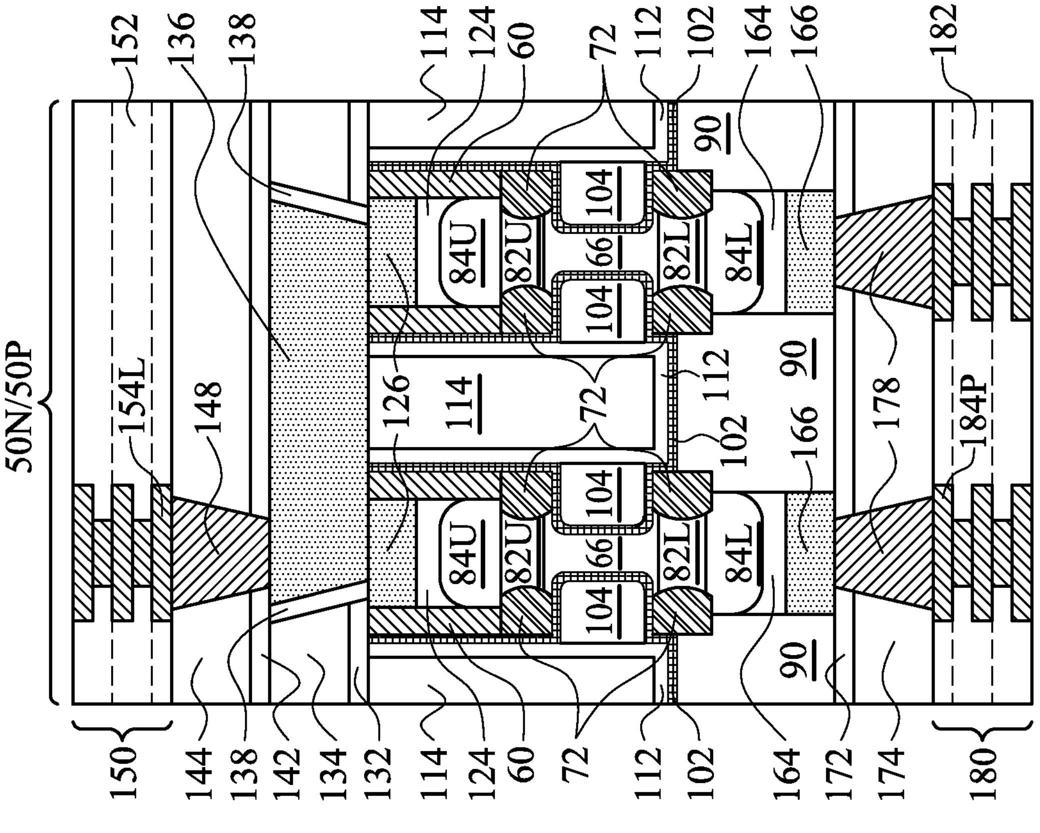
Figure 35B:
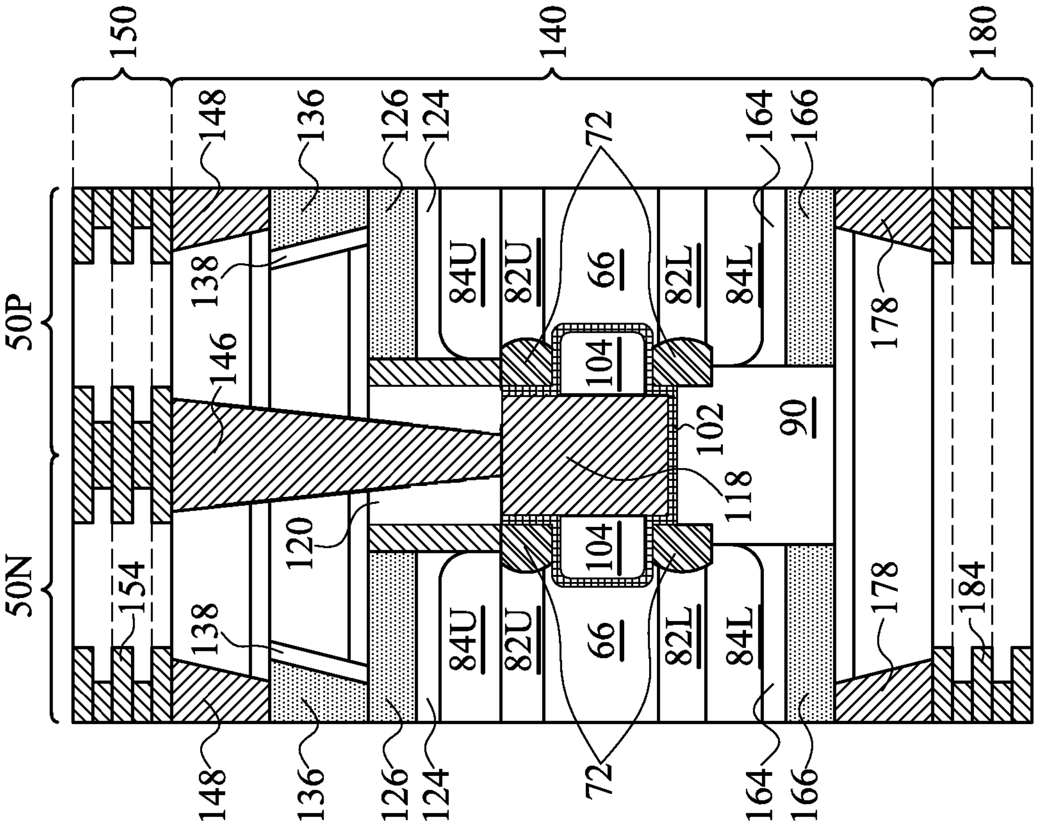

In FIGS. 35A-35B, appropriate steps as previously described are performed to complete formation of the nanostructure-FETs. In this embodiment, the ESL 132 is separated from the gate dielectrics 102 by the gate contact masks 120.

Figure 36B:
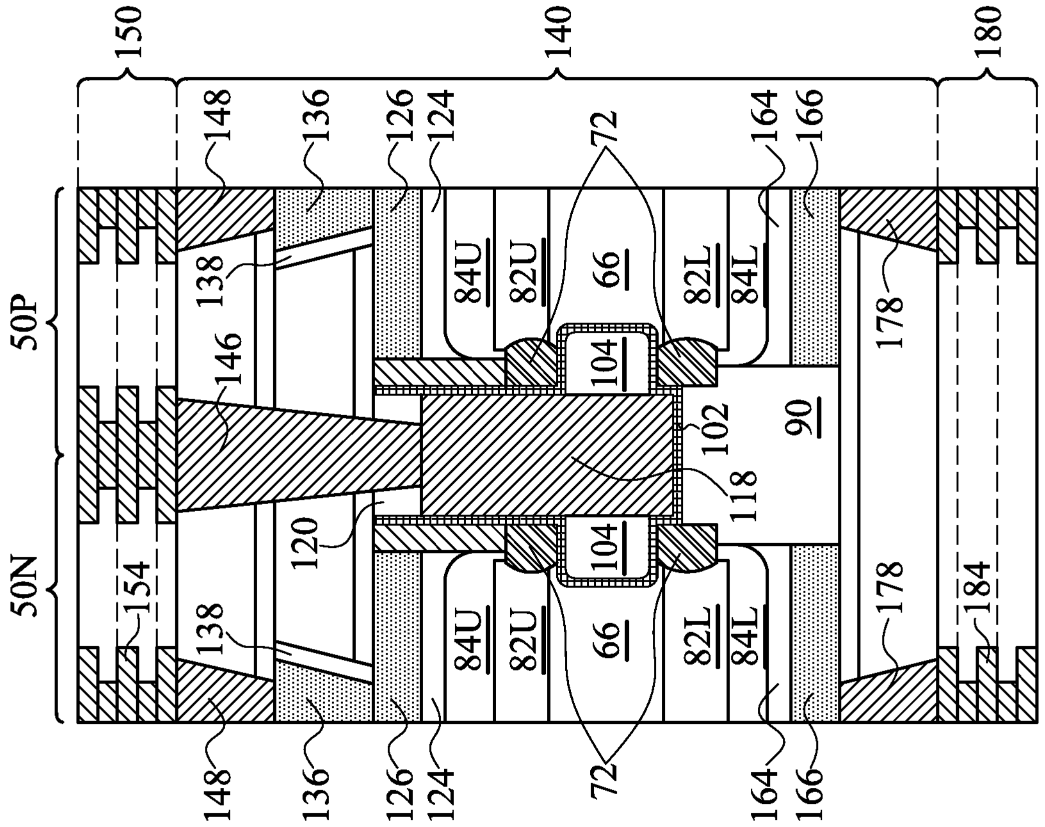
FIGS. 36A-36B are views of nanostructure-FETs, in accordance with some other embodiments.
Figure 36A:
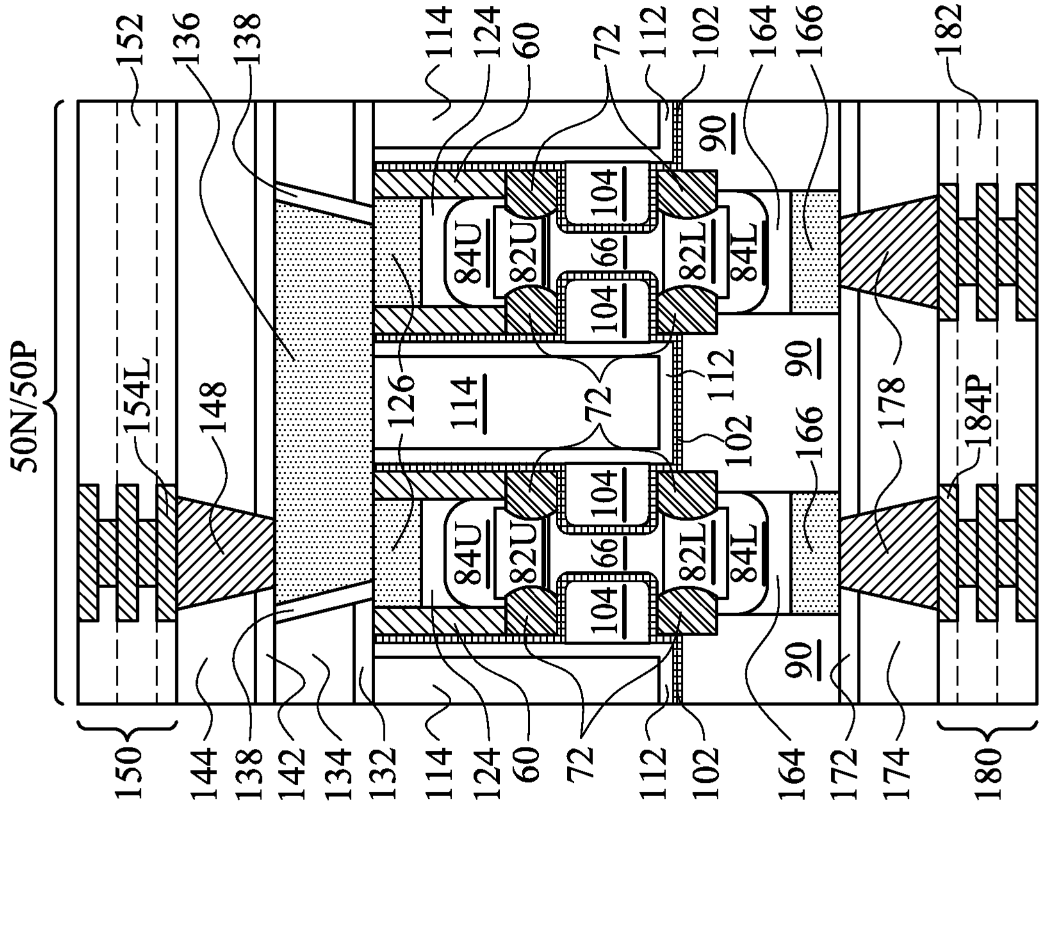

FIGS. 36A-36B are views of nanostructure-FETs, in accordance with some other embodiments. This embodiment is similar to that described for FIGS. 31A-31B, except surfaces of the upper LDD regions 82U and/or the lower LDD regions 82L are raised above the respective surfaces of the gate spacers 72. The surfaces of the upper LDD regions 82U and the lower LDD regions 82L may be raised above the respective surfaces of the gate spacers 72 by controlling the epitaxial growth of the upper LDD regions 82U and the lower LDD regions 82L. In various embodiments, the surfaces of the upper LDD regions 82U and the lower LDD regions 82L may be raised above the respective surfaces of the gate spacers 72, the surfaces of the upper LDD regions 82U but not the lower LDD regions 82L may be raised above the respective surfaces of the gate spacers 72, the surfaces of the lower LDD regions 82L but not the upper LDD regions 82U may be raised above the respective surfaces of the gate spacers 72, or the like.

Figure 37B:
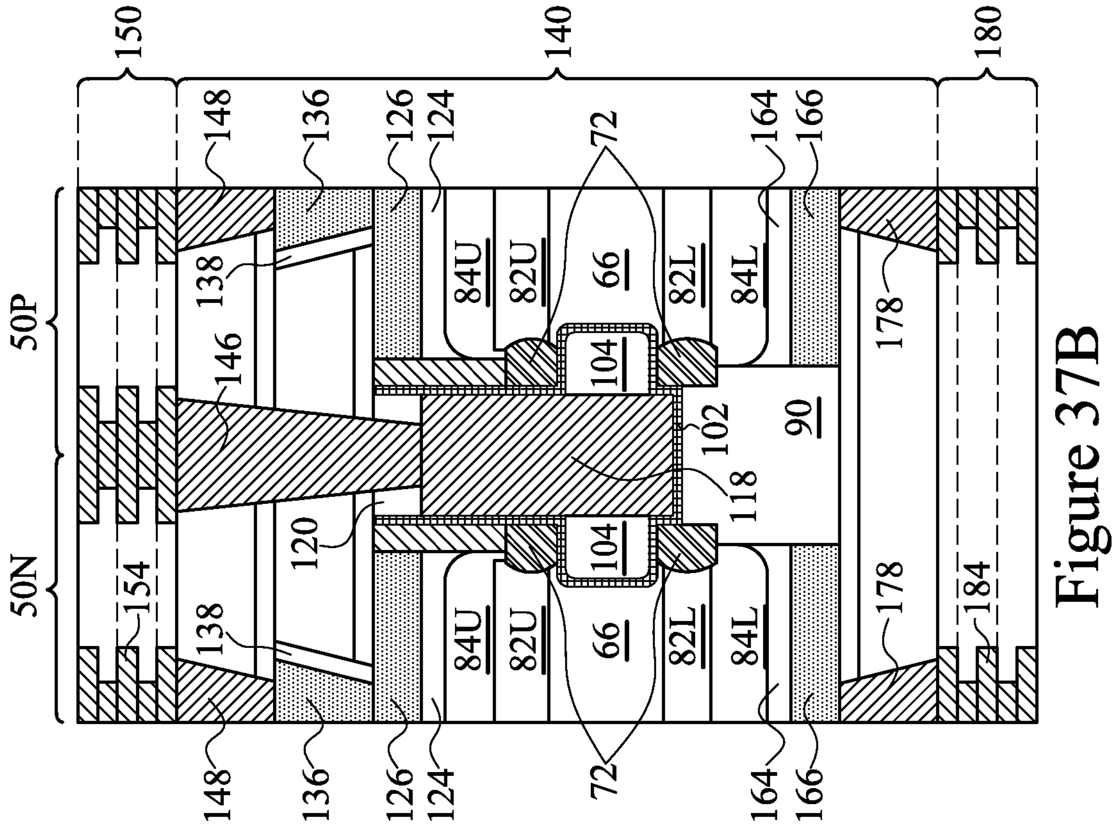
FIGS. 37A-37B are views of nanostructure-FETs, in accordance with some other embodiments.
Figure 37A:
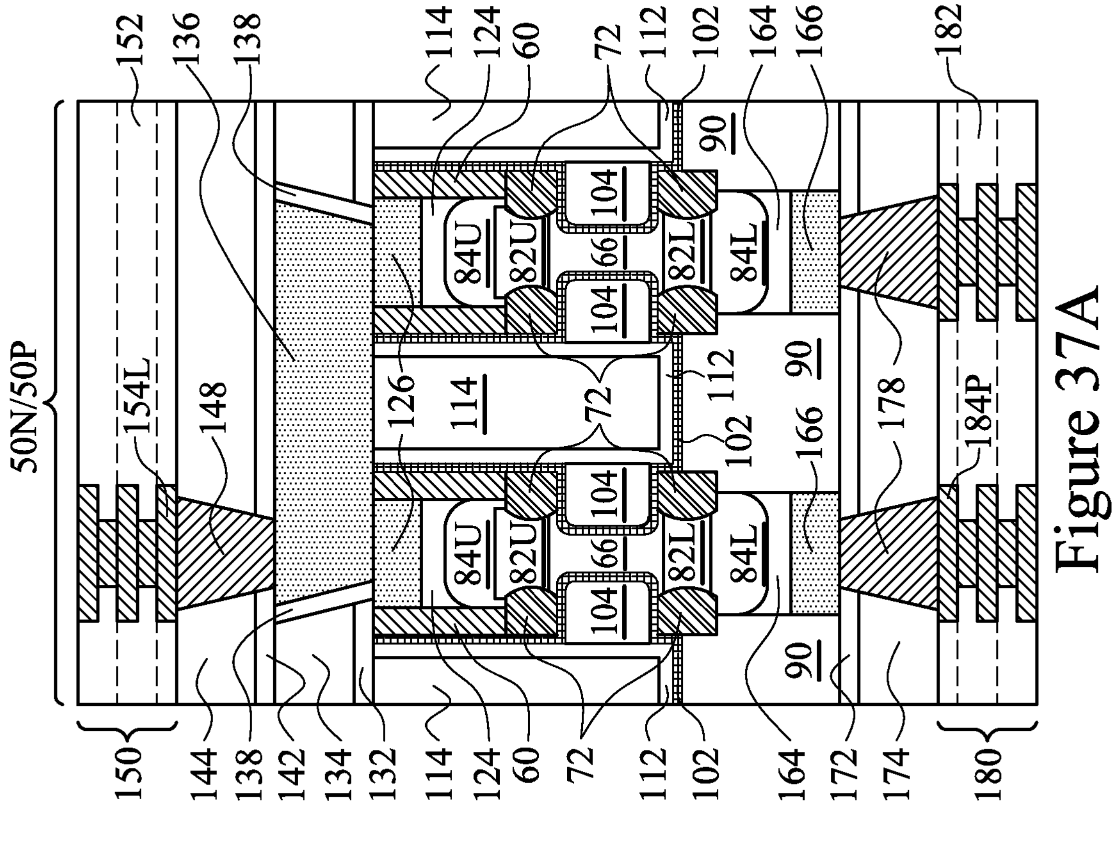

FIGS. 37A-37B are views of nanostructure-FETs, in accordance with some other embodiments. This embodiment is similar to that described for FIGS. 36A-36B, except the surfaces of the upper LDD regions 82U but not the lower LDD regions 82L are raised above the respective surfaces of the gate spacers 72.

In an embodiment, a device includes: a lower source/drain region; an upper source/drain region; a nanostructure between the upper source/drain region and the lower source/drain region; a gate structure extending into a sidewall of the nanostructure, the gate structure including a gate dielectric and a gate electrode, an outer sidewall of the gate electrode being aligned with an outer sidewall of the gate dielectric; and a gate contact adjacent the gate structure, the gate contact extending along the outer sidewall of the gate electrode and the outer sidewall of the gate dielectric. In some embodiments, the device further includes: a gate spacer between the gate structure and the upper source/drain region, the gate dielectric extending along an outer sidewall of the gate spacer. In some embodiments, the device further includes: an inter-layer dielectric around the upper source/drain region and the nanostructure, the gate contact extending through the inter-layer dielectric. In some embodiments, the device further includes: a conductive pad on the upper source/drain region; and a contact mask on the gate contact, a top surface of the contact mask being coplanar with a top surface of the conductive pad. In some embodiments of the device, the top surface of the contact mask is coplanar with a top surface of the gate dielectric. In some embodiments of the device, the top surface of the contact mask is disposed above a top surface of the gate dielectric. In some embodiments, the device further includes: an inter-layer dielectric on the conductive pad and the contact mask; a source/drain contact extending through the inter-layer dielectric to the conductive pad; and a via extending through the inter-layer dielectric and the contact mask to the gate contact.

In an embodiment, a device includes: a front-side interconnect structure; a back-side interconnect structure; and a device layer between the back-side interconnect structure and the front-side interconnect structure, the device layer including: a pull-up transistor including a first nanostructure and a first gate electrode, the first gate electrode extending into a first sidewall of the first nanostructure in a first direction, the first direction perpendicular to a second direction extending between the back-side interconnect structure and the front-side interconnect structure; a pull-down transistor including a second nanostructure and a second gate electrode, the second gate electrode extending into a second sidewall of the second nanostructure in the first direction; and a gate contact between the pull-up transistor and the pull-down transistor in a plane that is parallel to the first direction, the gate contact physically contacting the first gate electrode and the second gate electrode. In some embodiments of the device: the pull-up transistor further includes a first lower source/drain region and a first upper source/drain region, the first nanostructure disposed between the first lower source/drain region and the first upper source/drain region; and the pull-down transistor further includes a second lower source/drain region and a second upper source/drain region, the second nanostructure disposed between the second lower source/drain region and the second upper source/drain region. In some embodiments of the device, the back-side interconnect structure includes: a supply power rail connected to the first lower source/drain region; and a reference power rail connected to the second lower source/drain region. In some embodiments of the device, the front-side interconnect structure includes: an input interconnect connected to the gate contact; and an output interconnect connected to the first upper source/drain region and the second upper source/drain region. In some embodiments of the device, the first gate electrode is wrapped around the first nanostructure in the plane that is parallel to the first direction, and the second gate electrode is wrapped around the second nanostructure in the plane that is parallel to the first direction. In some embodiments of the device, the first nanostructure and the second nanostructure are each nanobars.

In an embodiment, a method includes: forming a nanostructure between a first gate spacer and a second gate spacer; forming a sidewall recess by recessing a sidewall of the nanostructure from a sidewall of the first gate spacer and from a sidewall of the second gate spacer; forming a gate structure in the sidewall recess and on the sidewall of the nanostructure; and depositing an inter-layer dielectric around the gate structure; and forming a gate contact through the inter-layer dielectric to contact a sidewall of the gate structure. In some embodiments, the method further includes: patterning a contact opening in the inter-layer dielectric, the contact opening exposing the sidewall of the gate structure, the gate contact being formed in the contact opening. In some embodiments, the method further includes: recessing a top surface of the gate contact from a top surface of the inter-layer dielectric; and forming a contact mask on the top surface of the gate contact, a top surface of the contact mask being coplanar with the top surface of the inter-layer dielectric. In some embodiments, the method further includes: forming an upper source/drain region above the nanostructure; and forming a lower source/drain region below the nanostructure. In some embodiments of the method, forming the gate structure includes: depositing a gate dielectric layer in the sidewall recess; depositing a gate electrode layer on the gate dielectric layer and in the sidewall recess; and removing a portion of the gate electrode layer outside of the sidewall recess with an etch-back process. In some embodiments of the method, the etch-back process selectively etches a material of the gate electrode layer at a faster rate than a material of the gate dielectric layer. In some embodiments of the method, the etch-back process includes a dry etch performed using chlorine as an etchant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a nanostructure between a first gate spacer and a second gate spacer, the first gate spacer disposed above the nanostructure, the second gate spacer disposed below the nanostructure;

forming a sidewall recess by recessing a sidewall of the nanostructure from a sidewall of the first gate spacer and from a sidewall of the second gate spacer;

forming a gate structure in the sidewall recess and on the sidewall of the nanostructure;

depositing an inter-layer dielectric around the gate structure; and forming a gate contact through the inter-layer dielectric to contact a sidewall of the gate structure.

2. The method of claim 1, further comprising:

patterning a contact opening in the inter-layer dielectric, the contact opening exposing the sidewall of the gate structure, the gate contact being formed in the contact opening.

3. The method of claim 1, further comprising:

recessing a top surface of the gate contact from a top surface of the inter-layer dielectric; and forming a contact mask on the top surface of the gate contact, a top surface of the contact mask being coplanar with the top surface of the inter-layer dielectric.

4. The method of claim 1, further comprising:

forming an upper source/drain region above the nanostructure; and forming a lower source/drain region below the nanostructure.

5. The method of claim 1, wherein forming the gate structure comprises:

depositing a gate dielectric layer in the sidewall recess;

depositing a gate electrode layer on the gate dielectric layer and in the sidewall recess; and removing a portion of the gate electrode layer outside of the sidewall recess with an etch-back process.

6. The method of claim 5, wherein the etch-back process selectively etches a material of the gate electrode layer at a faster rate than a material of the gate dielectric layer.

7. The method of claim 5, wherein the etch-back process comprises a dry etch performed using chlorine as an etchant.

8. The method of claim 1, further comprising:

forming an upper lightly doped source/drain region above the nanostructure, a top surface of the upper lightly doped source/drain region being raised above a top surface of the first gate spacer;

forming an upper source/drain region above the upper lightly doped source/drain region;

forming a lower lightly doped source/drain region below the nanostructure, a bottom surface of the lower lightly doped source/drain region being below a bottom surface of the second gate spacer; and forming a lower source/drain region below the lower lightly doped source/drain region.

9. A method comprising:

forming a sidewall recess in a nanostructure by recessing a sidewall of the nanostructure;

forming a gate structure in the sidewall recess and on the sidewall of the nanostructure;

depositing an inter-layer dielectric around the gate structure;

forming a gate contact through the inter-layer dielectric to contact a sidewall of the gate structure; and forming a contact mask on a top surface of the gate contact, a top surface of the contact mask being coplanar with a top surface of the inter-layer dielectric.

10. The method of claim 9, wherein forming the sidewall recess comprises:

performing multiple oxidation and etch cycles, each oxidation cycle oxidizing a portion of the nanostructure and each etch cycle removing the oxidized portion of the nanostructure.

11. The method of claim 9, wherein forming the gate structure comprises:

depositing a gate dielectric layer in the sidewall recess;

depositing a gate electrode layer on the gate dielectric layer and in the sidewall recess; and removing a portion of the gate electrode layer outside of the sidewall recess.

12. The method of claim 11, further comprising:

forming a second recess by recessing the top surface of the gate contact from the top surface of the inter-layer dielectric and a top surface of the gate dielectric layer, wherein the contact mask is formed in the second recess.

13. The method of claim 11, further comprising:

forming a second recess by recessing the top surface of the gate contact and a top surface of the gate dielectric layer from the top surface of the inter-layer dielectric, wherein the contact mask is formed in the second recess.

14. The method of claim 9, further comprising:

after forming the contact mask, forming a front-side interconnect structure over the nanostructure and the gate contact; and forming a back-side interconnect structure below the nanostructure, the back-side interconnect structure comprising power rails.

15. A method comprising:

forming a first source/drain region above a nanostructure;

forming a sidewall recess in the nanostructure;

forming a gate structure in the sidewall recess, the gate structure comprising a gate dielectric and a gate electrode, an outer sidewall of the gate electrode being aligned with an outer sidewall of the gate dielectric;

forming a gate contact adjacent the gate structure, the gate contact extending along the outer sidewall of the gate electrode and the outer sidewall of the gate dielectric; and after forming the gate contact, forming a second source/drain region below the nanostructure.

16. The method of claim 15, wherein forming the gate structure comprises:

depositing a gate dielectric layer in the sidewall recess;

depositing a gate electrode layer on the gate dielectric layer and in the sidewall recess; and removing a portion of the gate electrode layer outside of the sidewall recess with an etch-back process to form the gate electrode with the outer sidewall of the gate electrode aligned with the outer sidewall of the gate dielectric.

17. The method of claim 16, wherein the etch-back process comprises an anisotropic dry etch that selectively etches a material of the gate electrode layer at a faster rate than a material of the gate dielectric layer.

18. The method of claim 15, further comprising:

forming an inter-layer dielectric around the gate structure, wherein the gate contact is formed in the inter-layer dielectric;

recessing a top surface of the gate contact from a top surface of the inter-layer dielectric; and forming a contact mask on the top surface of the gate contact.

19. The method of claim 18, wherein a top surface of the contact mask is coplanar with a top surface of the gate dielectric after forming the contact mask.

20. The method of claim 18, further comprising:

recessing the gate dielectric when recessing the top surface of the gate contact, wherein a top surface of the contact mask is disposed above a top surface of the gate dielectric.

* * * * *